United States Patent [19]

Iwamura et al.

[11] Patent Number: 5,325,373
[45] Date of Patent: Jun. 28, 1994

[54] APPARATUS FOR ENCODING AND DECODING REED-SOLOMON CODE

[75] Inventors: Keiichi Iwamura; Hideki Imai, both of Yokohama; Yasunori Dohi, Fujisawa, all of Japan

[73] Assignee: Canon Kabushiki Kaisha, Tokyo, Japan

[21] Appl. No.: 982,062

[22] Filed: Nov. 25, 1992

Related U.S. Application Data

[63] Continuation of Ser. No. 607,617, Oct. 30, 1990, abandoned, which is a continuation of Ser. No. 135,051, Dec. 18, 1987, abandoned.

[30] Foreign Application Priority Data

| Dec. 22, 1986 | [JP] | Japan | 61-305893 |
| Dec. 22, 1986 | [JP] | Japan | 61-305894 |
| Dec. 22, 1986 | [JP] | Japan | 61-305895 |
| Dec. 22, 1986 | [JP] | Japan | 61-305896 |
| Dec. 22, 1986 | [JP] | Japan | 61-305897 |
| Dec. 22, 1986 | [JP] | Japan | 61-305898 |
| Dec. 26, 1986 | [JP] | Japan | 61-310831 |
| Dec. 26, 1986 | [JP] | Japan | 61-310832 |
| Dec. 26, 1986 | [JP] | Japan | 61-310833 |
| Dec. 26, 1986 | [JP] | Japan | 61-310834 |
| Dec. 26, 1986 | [JP] | Japan | 61-310835 |
| Dec. 26, 1986 | [JP] | Japan | 61-310836 |

[51] Int. Cl.⁵ ............................................. G06F 11/10
[52] U.S. Cl. ................................................. 371/37.1
[58] Field of Search ................... 371/37.1, 38.1, 39.1, 371/40.1

[56] References Cited

U.S. PATENT DOCUMENTS

| 3,534,331 | 10/1970 | Kautz | 371/37.6 |
| 4,649,541 | 3/1987 | Lahmeyer | 371/37.1 |
| 4,747,103 | 5/1988 | Iwamura et al. | 371/37.4 |
| 4,751,704 | 6/1988 | Kojima | 371/37.2 |

FOREIGN PATENT DOCUMENTS 6221137 10/1983 Japan.

OTHER PUBLICATIONS

Clark, Jr. & Cain, Error-Correction Coding for Digital Communications, Plenum Press, New York, 1981, pp. 188-195.

Primary Examiner—Charles E. Atkinson
Attorney, Agent, or Firm—Fitzpatrick, Cella, Harper & Scinto

[57] ABSTRACT

A Reed-Solomon coding decoder for use in error correction has a plurality of processing elements (PEs) each including a selector having a plurality of inputs and at least one output, a multiplier which receives as at least one of the inputs thereof the output from the selector, an adder for adding the outputs of the multiplier, and m-stages of registers for storing the outputs of the adder and the selector. The PEs are connected in a predetermined pattern to realize a compact construction of a Reed-Solomon code decoder.

20 Claims, 79 Drawing Sheets

SCHEMATIC ALGORITHM

FIG. 16B PROCESS
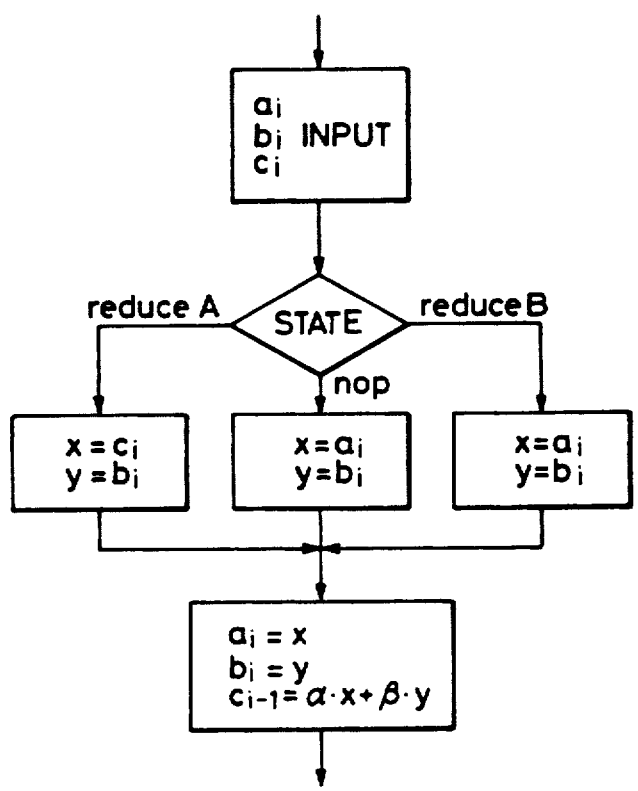
FIG. 16C INCREASE
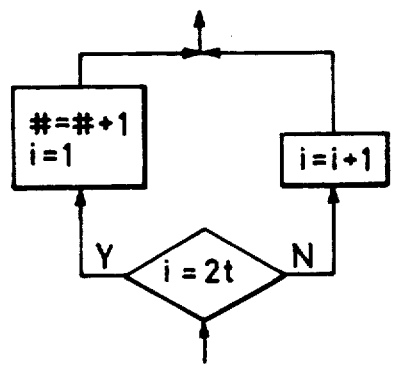

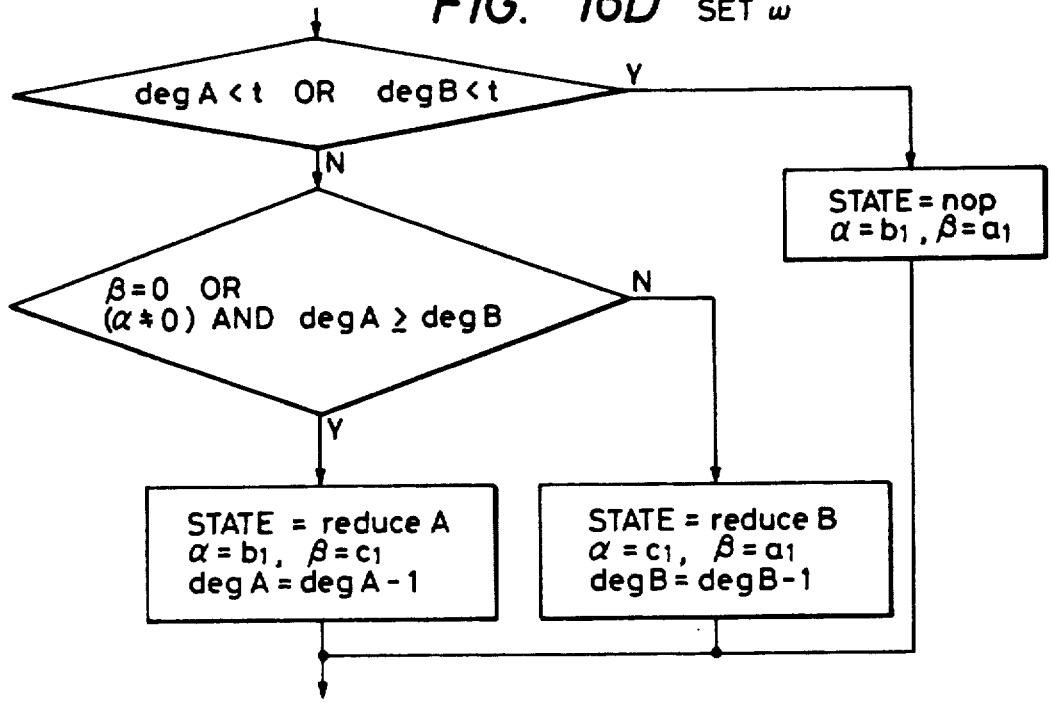
FIG. 16D SET ω
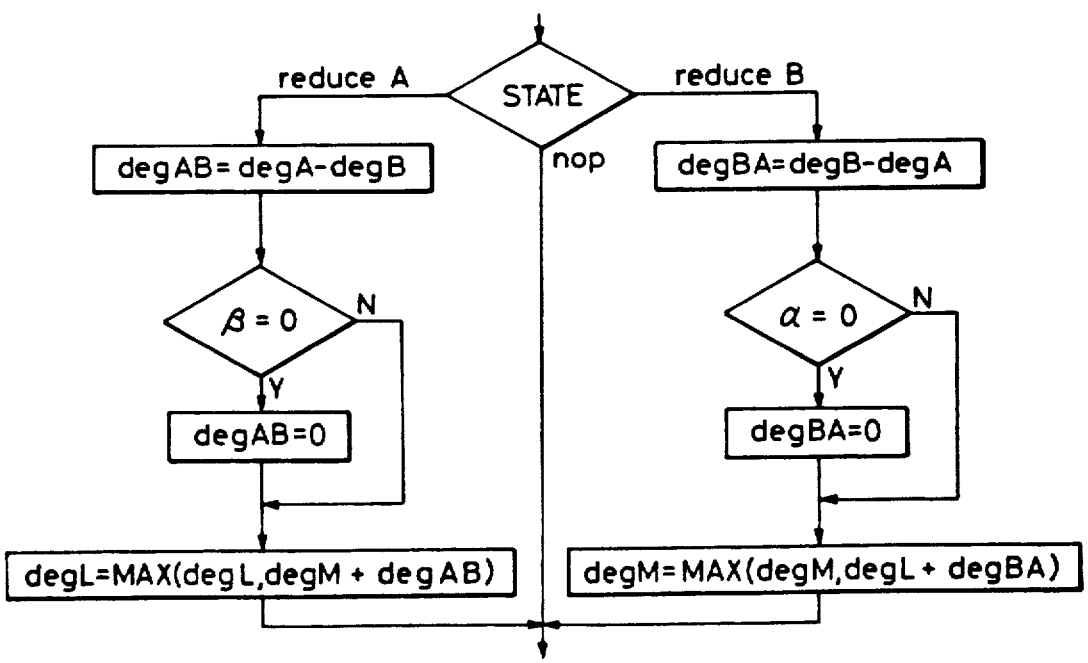
FIG. 16E SET σ

FIG. 19

| CK | ↑ | ↑ | ↑ | ↑ | ↑ | ↑ | ↑ | ↑ | ↑ |
|---|---|---|---|---|---|---|---|---|---|
|  | #0 | #1 | #2 | #3 | #4 | #5 | #6 | #7 |  |
| S1—3 | nop 0 | γ.B 2 | γ.A 1 | γ.A 1 | γ.A 1 | γ.B 2 | γ.A 1 | nop 0 |  |
| β | 1 | 1 | $\alpha^{12}$ | $\alpha^3$ | $\alpha^8$ | $\alpha$ | $\alpha^7$ | $\alpha^7$ |  |
| A5 | X 0 | X 0 | 0 | 1 | $\alpha$ | X $\alpha^{12}$ | $\alpha^{12}$ | X $\alpha^5$ |  |
| 4 | 0 | 0 | 0 | $\alpha^{12}$ | $\alpha^9$ | $\alpha^{15}$ | $\alpha^{15}$ | 0 |  |
| 3 | 0 | 0 | 0 | 0 | 0 | 0 | 0 | 0 |  |
| 2 | 0 | 0 | 0 | 0 | 0 | 0 | 0 | 0 |  |
| 1 | 0 | 0 | 0 | 0 | 0 | 0 | 0 | 0 |  |
| α | 0 | $\alpha$ | $\alpha$ | $\alpha$ | $\alpha$ | $\alpha^7$ | $\alpha^7$ | $\alpha^7$ |  |
| B5 | Y $\alpha$ | $\alpha$ | Y $\alpha^{12}$ | Y $\alpha^{12}$ | Y $\alpha^{12}$ | $\alpha^{12}$ | Y $\alpha^{10}$ | Y $\alpha^{10}$ |  |
| 4 | $\alpha^{12}$ | $\alpha^{12}$ | 1 | 1 | 1 | 1 | $\alpha^5$ | $\alpha^5$ |  |
| 3 | 1 | 1 | $\alpha^{12}$ | $\alpha^{12}$ | $\alpha^{12}$ | $\alpha^{12}$ | 0 | 0 |  |
| 2 | $\alpha^{12}$ | $\alpha^{12}$ | 0 | 0 | 0 | 0 | 0 | 0 |  |
| 1 | 0 | 0 | 0 | 0 | 0 | 0 | 0 | 0 |  |
| C5 |  | Y $\alpha^{12}$ | X 1 | X $\alpha$ | X $\alpha^{12}$ | Y $\alpha^{10}$ | X $\alpha^5$ |  |  |
| 4 |  | 1 | $\alpha^{12}$ | $\alpha^9$ | $\alpha^{15}$ | $\alpha^5$ | 0 |  |  |
| 3 |  | $\alpha^{12}$ | 0 | 0 | 0 | 0 | 0 |  |  |
| 2 |  | 0 | 0 | 0 | 0 | 0 | 0 |  |  |
| 1 |  | 0 | 0 | 0 | 0 | 0 | 0 |  |  |
| O5 |  | 0 | 0 | 1 | $\alpha$ | $\alpha^{12}$ | $\alpha^{12}$ | $\alpha^5$ | $\alpha^5$ |
| 4 |  | 0 | 0 | $\alpha^{12}$ | $\alpha^9$ | $\alpha^{15}$ | $\alpha^{15}$ | 0 | 0 |
| 3 |  | 0 | 0 | 0 | 0 | 0 | 0 | 0 | 0 |
| 2 |  | 0 | 0 | 0 | 0 | 0 | 0 | 0 | 0 |
| 1 |  | 0 | 0 | 0 | 0 | 0 | 0 | 0 | 0 |
| P5 |  | $\alpha$ | $\alpha^{12}$ | $\alpha^{12}$ | $\alpha^{12}$ | $\alpha^{12}$ | $\alpha^{10}$ | $\alpha^{10}$ | $\alpha^{10}$ |
| 4 |  | $\alpha^{12}$ | 1 | 1 | 1 | 1 | $\alpha^5$ | $\alpha^5$ | $\alpha^5$ |
| 3 |  | 1 | $\alpha^{12}$ | $\alpha^{12}$ | $\alpha^{12}$ | $\alpha^{12}$ | 0 | 0 | 0 |
| 2 |  | $\alpha^{12}$ | 0 | 0 | 0 | 0 | 0 | 0 | 0 |
| 1 |  | 0 | 0 | 0 | 0 | 0 | 0 | 0 | 0 |
| Q5 |  | $\alpha$ | $\alpha^{12}$ | $\alpha^3$ | $\alpha^8$ | $\alpha^7$ | $\alpha^7$ |  |  |
| 4 |  | $\alpha^{12}$ | 1 | $\alpha$ | $\alpha^{12}$ | $\alpha^{10}$ | $\alpha^5$ |  |  |
| 3 |  | 1 | $\alpha^{12}$ | $\alpha^9$ | $\alpha^{15}$ | $\alpha^5$ | 0 |  |  |
| 2 |  | $\alpha^{12}$ | 0 | 0 | 0 | 0 | 0 |  |  |
| 1 |  | 0 | 0 | 0 | 0 | 0 | 0 |  |  |

FIG. 20

| CK ↑ | ↑ | ↑ | ↑ | ↑ | ↑ | ↑ | ↑ | |
|---|---|---|---|---|---|---|---|---|
| | #0 | #1 | #2 | #3 | #4 | #5 | #6 | #7 |
| S1—3 | nop 0 | γ.B 2 | γ.A 1 | γ.A 1 | γ.A 1 | γ.B 2 | γ.A 1 | nop 0 |
| β | 1 | 1 | $\alpha^{12}$ | $\alpha^3$ | $\alpha^8$ | $\alpha^8$ | $\alpha^7$ | $\alpha^7$ |
| A5 | X 0 | X 0 | 0 | 0 | 0 | X $\alpha^2$ | $\alpha^2$ | X $\alpha^{14}$ |
| 4 | 0 | 0 | 0 | 0 | $\alpha$ | $\alpha^{13}$ | $\alpha^{13}$ | $\alpha^8$ |
| 3 | 0 | 0 | 0 | 1 | $\alpha^{12}$ | $\alpha^3$ | $\alpha^3$ | 0 |
| 2 | 0 | 0 | 0 | 0 | 0 | 0 | 0 | 0 |
| 1 | 0 | 0 | 0 | 0 | 0 | 0 | 0 | 0 |
| α | 0 | $\alpha$ | $\alpha$ | $\alpha$ | $\alpha$ | $\alpha^7$ | $\alpha^7$ | $\alpha^7$ |
| B5 | Y 0 | 0 | Y 0 | Y 0 | Y 0 | 0 | Y $\alpha^{14}$ | Y $\alpha^{14}$ |
| 4 | 0 | 0 | 0 | 0 | 0 | 0 | $\alpha^{14}$ | $\alpha^4$ |
| 3 | 0 | 0 | 0 | 0 | 0 | 0 | $\alpha^8$ | $\alpha^8$ |
| 2 | 0 | 0 | 1 | 1 | 1 | 1 | 0 | 0 |
| 1 | 1 | 1 | 0 | 0 | 0 | 0 | 0 | 0 |
| C5 | | Y 0 | X 0 | X 0 | X $\alpha^2$ | Y $\alpha^{14}$ | X $\alpha^{14}$ | |
| 4 | | 0 | 0 | $\alpha$ | $\alpha^{13}$ | $\alpha^4$ | $\alpha^8$ | |
| 3 | | 0 | 1 | $\alpha^{12}$ | $\alpha^3$ | $\alpha^8$ | 0 | |
| 2 | | 1 | 0 | 0 | 0 | 0 | 0 | |
| 1 | | 0 | 0 | 0 | 0 | 0 | 0 | |
| O5 | | 0 | 0 | 0 | 0 | $\alpha^2$ | $\alpha^2$ | $\alpha^{14}$ | $\alpha^{14}$ |
| 4 | | 0 | 0 | 0 | $\alpha$ | $\alpha^{13}$ | $\alpha^{13}$ | $\alpha^8$ | $\alpha^8$ |
| 3 | | 0 | 0 | 1 | $\alpha^{12}$ | $\alpha^3$ | $\alpha^3$ | 0 | 0 |
| 2 | | 0 | 0 | 0 | 0 | 0 | 0 | 0 | 0 |
| 1 | | 0 | 0 | 0 | 0 | 0 | 0 | 0 | 0 |
| P5 | | 0 | 0 | 0 | 0 | 0 | $\alpha^{14}$ | $\alpha^{14}$ | $\alpha^{14}$ |
| 4 | | 0 | 0 | 0 | 0 | 0 | $\alpha^4$ | $\alpha^4$ | $\alpha^4$ |
| 3 | | 0 | 0 | 0 | 0 | 0 | $\alpha^8$ | $\alpha^8$ | $\alpha^8$ |
| 2 | | 0 | 1 | 1 | 1 | 1 | 0 | 0 | 0 |
| 1 | | 1 | 0 | 0 | 0 | 0 | 0 | 0 | 0 |
| Q5 | | 0 | 0 | 0 | 0 | $\alpha^3$ | 1 | | |
| 4 | | 0 | 0 | 0 | $\alpha^2$ | $\alpha^{14}$ | $\alpha^{14}$ | | |
| 3 | | 0 | 0 | $\alpha$ | $\alpha^{13}$ | $\alpha^4$ | $\alpha^8$ | | |
| 2 | | 0 | 1 | $\alpha^{12}$ | $\alpha^3$ | $\alpha^8$ | 0 | | |
| 1 | | 1 | 0 | 0 | 0 | 0 | 0 | | |

FIG. 23B

5
- S1,2: 2 = reduce B  degA = 3,0
- X=A: $\alpha^8$, $\alpha^{12}$, $\alpha^{15}$, 0
- B: $\alpha$, $\alpha^{12}$, 1, $\alpha$
- CK2: ↑ ($\alpha = \alpha^7$, $\beta = \alpha^8$)
- O1: $\alpha^8$, $\alpha^{12}$, $\alpha$
- X=O2: 0, $\alpha^7$, $\alpha$
- O3: $\alpha^7$, $\alpha^{10}$, $\alpha$

6
- S1,2: 1 = reduce A  degA = 2, degB = 3
- A: $\alpha^8$, $\alpha^{12}$, $\alpha^{15}$
- Y=B: $\alpha^7$, $\alpha^{10}$, $\alpha^5$
- CK2: ↑ ($\alpha = \alpha^7$, $\beta = \alpha^7$)
- O1: $\alpha^7$, $\alpha^5$, 0
- O2: 0, $\alpha^7$, $\alpha^{12}$
- O3: $\alpha^7$, $\alpha^{10}$, $\alpha^5$

7
- S1,2: 0 = nop  degA = 2, degB = 3
- X=A: $\alpha^7$, $\alpha^5$, 0
- Y=B: $\alpha^7$, $\alpha^{10}$, $\alpha^5$
- CK: ↑
- O1: $\alpha^7$, $\alpha^5$, 0
- O2:
- O3: $\alpha^7$, $\alpha^{10}$, $\alpha^5$

FIG. 24A

| | CK | |
|---|---|---|
| | S1,2 | ⟨ 0 = nop   degL=0, degM=0 ⟩ |
| | A | ⟨ 0 ⟩⟨ 0 ⟩ |
| #0 | B | ⟨ 1 ⟩⟨ 0 ⟩ |
| | CK2 | ($\alpha=0, \beta=1$) |
| | O1 | ⟨ 0 ⟩⟨ 0 ⟩ |
| | Y=O2 | ⟨ 1 ⟩⟨ 0 ⟩ |
| | O3 | ⟨ 1 ⟩⟨ 0 ⟩ |
| | S1,2 | ⟨ 2 = reduce B   degL=0, degM=0 ⟩ |
| | X=A | ⟨ 0 ⟩⟨ 0 ⟩⟨ 0 ⟩ |
| #1 | B | ⟨ 0 ⟩⟨ 1 ⟩⟨ 0 ⟩ |
| | CK2 | ($\alpha=\alpha, \beta=1$) |
| | O1 | ⟨ 0 ⟩⟨ 0 ⟩⟨ 0 ⟩ |
| | X=O2 | ⟨ 1 ⟩⟨ 0 ⟩ |
| | O3 | ⟨ 1 ⟩⟨ 0 ⟩ |
| | S1,2 | ⟨ 1 = reduce A   degL=2, degM=0 ⟩ |
| | A | ⟨ 0 ⟩⟨ 0 ⟩⟨ 0 ⟩ |
| | Y=B | ⟨ 0 ⟩⟨ 1 ⟩⟨ 0 ⟩ |
| #2 | CK2 | ($\alpha=\alpha, \beta=\alpha^{12}$) |
| | O1 | ⟨ 0 ⟩⟨ 0 ⟩⟨ 0 ⟩ |
| | X=O2 | ⟨ $\alpha$ ⟩⟨ $\alpha^{12}$ ⟩⟨ 0 ⟩ |
| | O3 | ⟨ 0 ⟩⟨ 1 ⟩⟨ 0 ⟩ |
| | S1,2 | ⟨ 1 = reduce A   degL=2, degM=0 ⟩ |
| | A | ⟨ 0 ⟩⟨ 0 ⟩⟨ 0 ⟩ |
| | Y=B | ⟨ 0 ⟩⟨ 1 ⟩⟨ 0 ⟩ |
| #3 | CK2 | ($\alpha=\alpha, \beta=\alpha^{3}$) |
| | O1 | ⟨ $\alpha$ ⟩⟨ $\alpha^{12}$ ⟩⟨ 0 ⟩ |
| | X=O2 | ⟨ $\alpha^2$ ⟩⟨ $\alpha^{13}$ ⟩⟨ $\alpha^3$ ⟩ |
| | O3 | ⟨ 0 ⟩⟨ 1 ⟩⟨ 0 ⟩ |

FIG. 24B

A timing diagram showing signals S1,2, A, Y=B, CK2, O1, Y=O2, O3 across multiple cycles #4, #5, #6, #7.

4: S1,2 = $1 =$ reduce A deg L$=2$, deg M$=0$
- A: 0, $\alpha$, $\alpha^{12}$, 0
- Y=B: 0, 1, 0
- CK2: ($\alpha = \alpha, \beta = \alpha^8$)
- O1: $\alpha^2$, $\alpha^{13}$, $\alpha^3$, 0
- Y=O2: $\alpha^3$, $\alpha^{14}$, $\alpha^4$, $\alpha^8$, 0
- O3: 0, 1, 0

5: S1,2 = $2 =$ reduce B deg L$=2$, deg M$=3$
- X=A: 0, $\alpha^2$, $\alpha^{13}$, $\alpha^3$, 0
- B: 0, 1, 0
- CK2: ($\alpha = \alpha^7, \beta = \alpha^8$)
- O1: 0, $\alpha^2$, $\alpha^{13}$, $\alpha^3$, 0
- X=O2: $\alpha^{11}$, 1, $\alpha^{14}$, $\alpha^8$, 0
- O3: $\alpha^3$, $\alpha^{14}$, $\alpha^4$, $\alpha^8$, 0

6: S1,2 = $1 =$ reduce A deg L$=3$, deg M$=3$
- A: $\alpha^2$, $\alpha^{13}$, $\alpha^3$, 0
- Y=B: $\alpha^3$, $\alpha^{14}$, $\alpha^4$, $\alpha^8$, 0
- CK2: ($\alpha = \alpha^7, \beta = \alpha^7$)
- O1: $\alpha^{11}$, 1, $\alpha^{14}$, $\alpha^8$, 0
- O2:
- O3: $\alpha^3$, $\alpha^{14}$, $\alpha^4$, $\alpha^8$

7: S1,2 = $0 =$ nop deg L$=3$, deg M$=3$
- X=A: $\alpha^{11}$, 1, $\alpha^{14}$, $\alpha^8$, 0
- Y=B: $\alpha^3$, $\alpha^{14}$, $\alpha^4$, $\alpha^8$
- CK2:
- O1: $\alpha^{11}$, 1, $\alpha^{14}$, $\alpha^8$, 0
- O2:
- O3: $\alpha^3$, $\alpha^{14}$, $\alpha^4$, $\alpha^8$

FIG. 25

```
┌─────────────────────────────────────────────────────────────────────┐
│ APPLY THE SOLUTION FOR σ(x), ω(x) BY THE EXPANDED GCD PROBLEM       │
│ (FIG.15) FOR S(x) = 0 x⁵ + a x⁴ + a¹³x³ + 1 x² + a¹³x + 0           │
└─────────────────────────────────────────────────────────────────────┘
```

$$S(x) = 0x^5 + ax^4 + a^{13}x^3 + 1x^2 + a^{13}x + 0$$

INITIAL VALUES: $U = M = 1$ ; $V = L = 0$ ; $A = A_0 = x^6$ ; $B = B_0 = S(x)$
(deg U = deg V = deg L = deg M = 0 ; deg A = 6 ; deg B = 5)

---

REPEAT STEP # 0 (deg A, deg B ≥ 3 ; deg A > deg B ; $b_0 = 0$) → SHIFT B $$\begin{cases} 1A_0 + 0B_0 = x^6 \\ 0A_0 + 1B_0 = ax^5 + a^{13}x^4 + 1x^3 + a^{13}x^2 \end{cases}$$

---

REPEAT STEP # 1 (deg A, deg B ≥ 3 ; deg A > deg B ;) → reduce A $$\begin{cases} aA_0 + x^2 B_0 = a^{13}x^5 + 1x^4 + a^{13}x^3 \\ 0A_0 + 1B_0 = ax^5 + a^{13}x^4 + 1x^3 + a^{13}x^2 \end{cases}$$

---

REPEAT STEP # 2 (deg A, deg B ≥ 3 ; deg A > deg B ;) → reduce A $$\begin{cases} a^2 A_0 + (ax^2 + a^{13}x) B_0 = a^5 x^4 + ax^3 + a^3 x^2 \\ 0A_0 + 1B_0 = ax^5 + a^{13}x^4 + 1x^3 + a^{13}x^2 \end{cases}$$

---

REPEAT STEP # 3 (deg A, deg B ≥ 3 ; deg A = deg B ;) → reduce A $$\begin{cases} a^3 A_0 + (a^2 x^2 + a^{13}x + a^3) B_0 = a^5 x^4 + a^{13}x^3 + a^{14}x \\ 0A_0 + 1B_0 = ax^5 + a^{13}x^4 + 1x^3 + a^{13}x^2 \end{cases}$$

---

REPEAT STEP # 4 (deg A, deg B ≥ 3 ; deg A > deg B ;) → reduce B $$\begin{cases} a^3 A_0 + (a^2 x^2 + a^{13}x + a^3) B_0 = a^5 x^4 + a^{13}x^3 + a^{14}x \\ a^4 x A_0 + (a^3 x^3 + a^{14}x^2 + a^4 x + a^5) B_0 = a^7 x^5 + a^{10}x^3 + a^5 x \end{cases}$$

---

REPEAT STEP # 5 (deg A, deg B > 3 ; deg A = deg B ;) → reduce A $$\begin{cases} (a^{12}x + a^{10}) A_0 + (a^{11}x^3 + 1x^2 + a^{14}x + a^5) B_0 = a^7 x^2 + a^6 x \\ a^4 x A_0 + (a^3 x^3 + a^{14}x^2 + a^4 x + a^5) B_0 = a^7 x^5 + a^{10}x^3 + a^5 x \end{cases}$$

---

REPEAT STEP # 6 (deg A = 2 < 3) → n o p  REPEAT STEP COMPLETED

---

RESULTING IN: $\omega(x) = A = a^7 x^2 + a^6 x + 0$ ; AND
$\sigma(x) = L = a^{11}x^3 + 1x^2 + a^{14}x + a^5$ FIG. 28
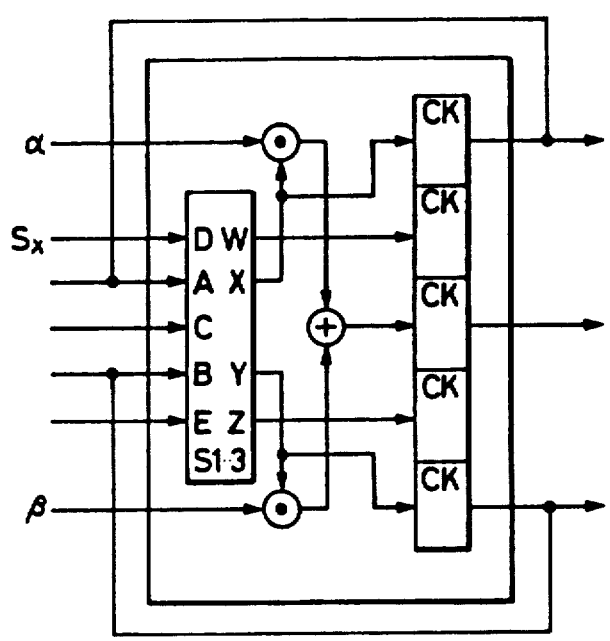
FIG. 29
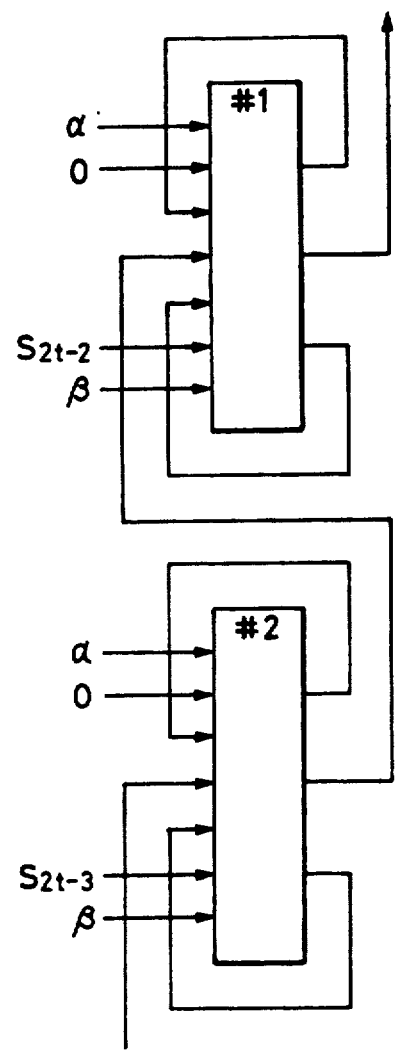
FIG. 30
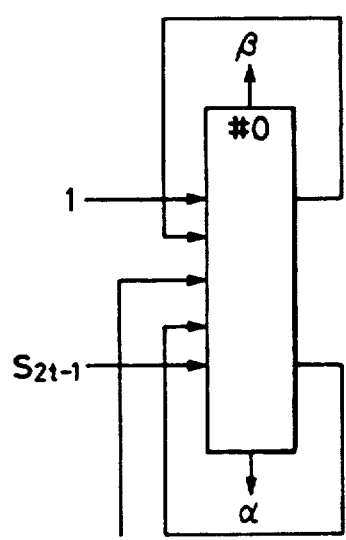
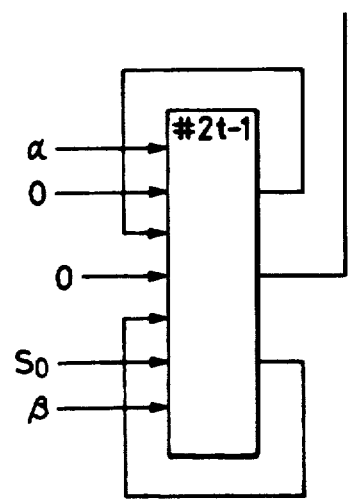

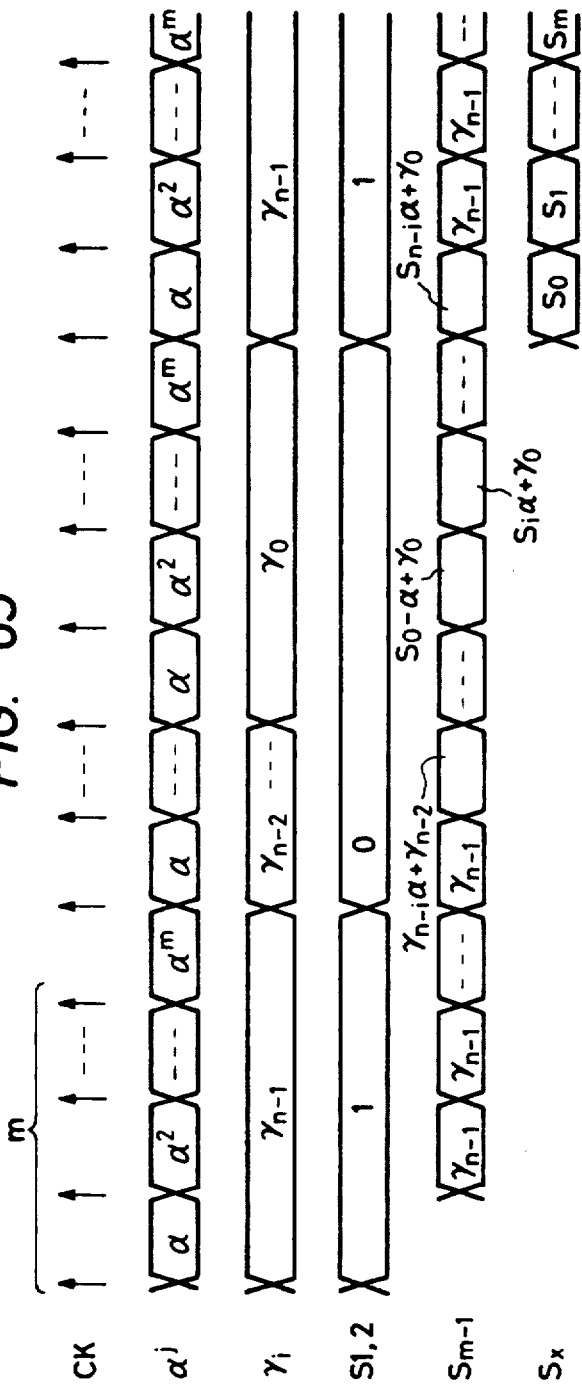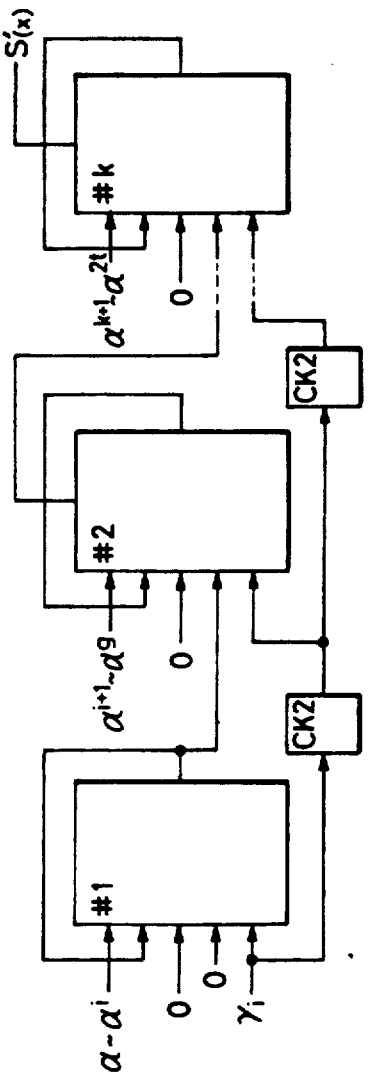
FIG. 65
FIG. 66

FIG. 68
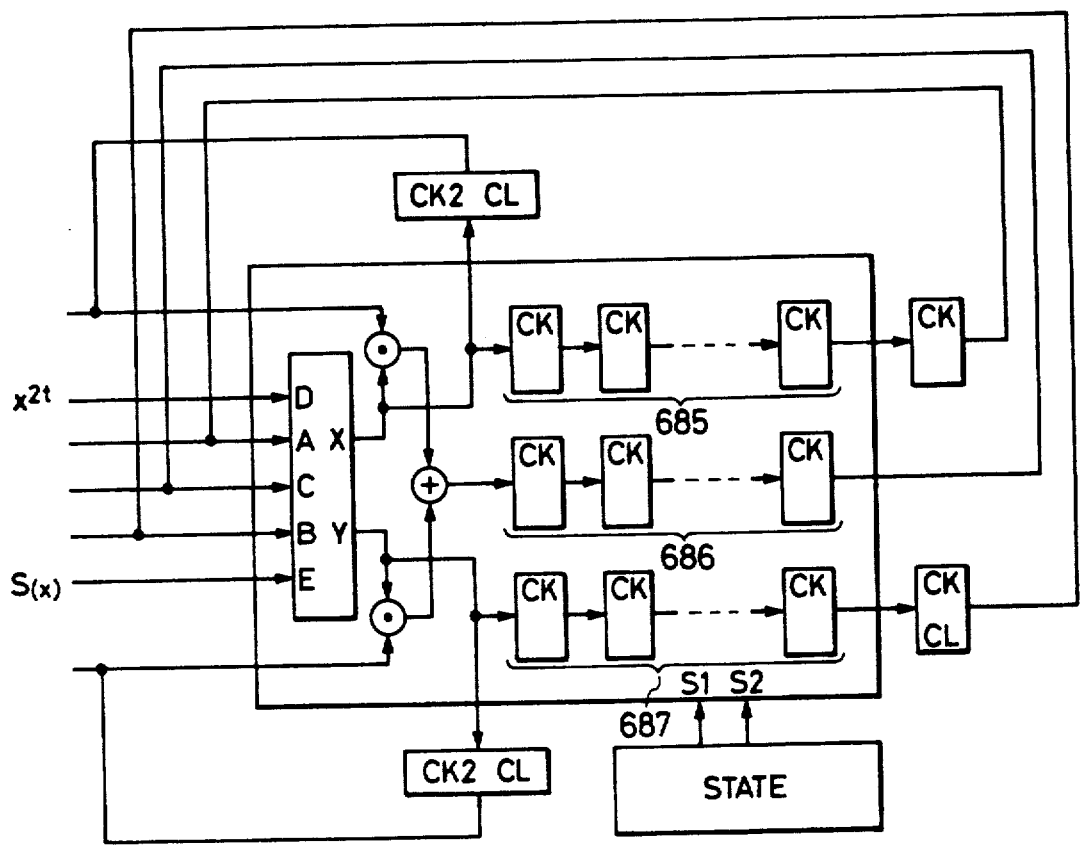
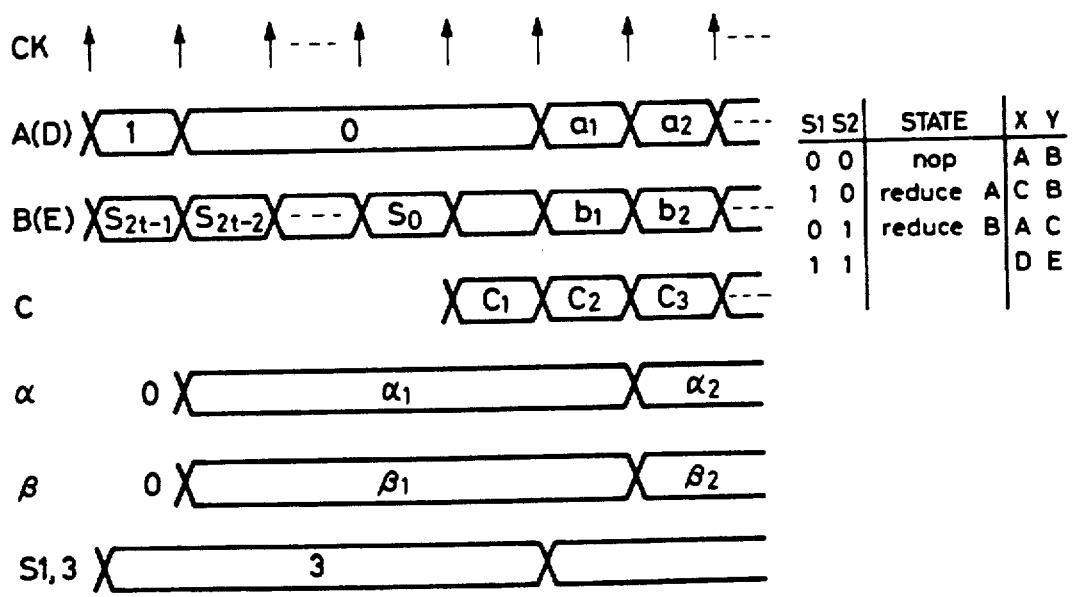

| S1 S2 S3 S4 | STATE | X Y W |
|---|---|---|
| 0 0 0 0 | nop | A B |
| 1 0 0 0 | reduce A | C B |
| 0 1 0 0 | reduce B | A C |
| 1 1 0 0 | | D E A |
| 0 0 1 0 | | F E A |
| 1 0 1 0 | | F D A |
| 0 1 1 0 | | F F A |
| 1 1 0 1 | | D E B |
| 0 0 1 1 | | F E B |
| 1 0 1 1 | | F D B |
| 0 1 1 1 | | F F B |

FIG. 74

| S1 | S2 | S3 | X | Y | Z |
|----|----|----|---|---|---|
| 0 | 0 | 0 | A | B | B |
| 1 | 0 | 0 | C | B | B |
| 0 | 1 | 0 | A | E | E |
| 1 | 1 | 0 | C | E | E |
| 0 | 0 | 1 | A | C | B |
| 1 | 0 | 1 | C | C | B |
| 0 | 1 | 1 | | | |
| 1 | 1 | 1 | | | |

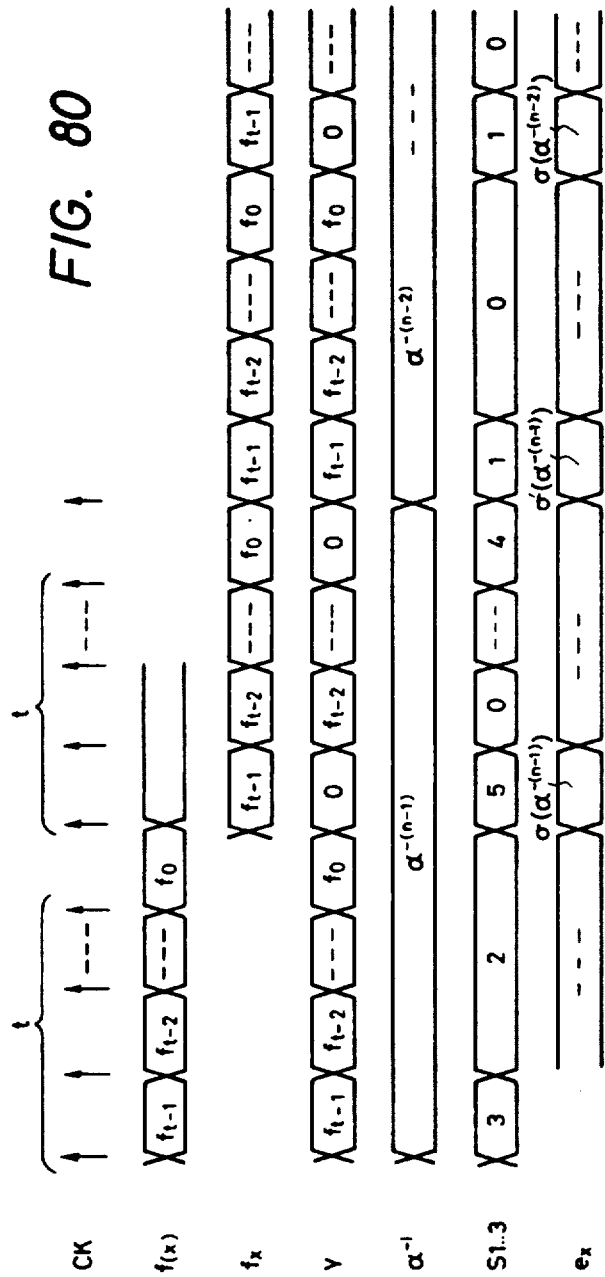
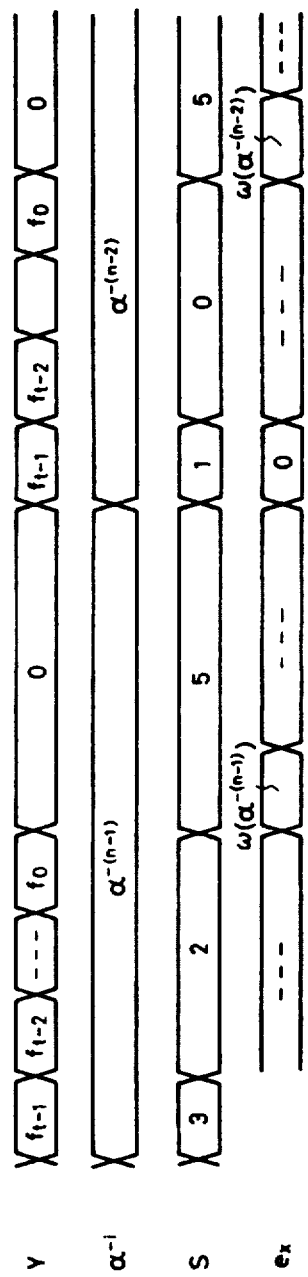

| S1 | S2 | X | Y | Z |
|----|----|---|---|---|
| 0 | 0 | A | B | C |
| 1 | 0 | C | B | A |
| 0 | 1 | A | C | C |
| 1 | 1 | 0 | B | A |

| S1 | S2 | X | Y |
|----|----|---|---|
| 0  | 0  | A | B |
| 1  | 0  | C | B |
| 0  | 1  | A | C |
| 1  | 1  | B | A |

| S1,2 | ⟨ 2=reduce B  deg A=3,0 ⟩ |
| X=A | ⟨α⁸⟩⟨α¹²⟩⟨α¹⁵⟩⟨0⟩ |
| B | ⟨α⟩⟨α¹²⟩⟨1⟩⟨α⟩ |
| CK2 | ↑ (α=α⁷, B=α⁸) |
| O1 | ⟨α⁸⟩⟨α¹²⟩⟨α⟩ |
| X=O2 | ⟨0⟩⟨α⁷⟩⟨α⟩ |
| O3 | ⟨α⁷⟩⟨α¹⁰⟩⟨α⟩ |

6

| S1,2 | ⟨ 1=reduce A deg A=2, deg B=3 ⟩ |
| A | ⟨α⁸⟩⟨α¹²⟩⟨α¹⁵⟩ |
| Y=B | ⟨α⁷⟩⟨α¹⁰⟩⟨α⁵⟩ |
| CK2 | ↑ (α=α⁷, B=α⁷) |
| O1 | ⟨α⁷⟩⟨α⁵⟩⟨0⟩ |
| O2 | ⟨0⟩⟨α⁷⟩⟨α¹²⟩ |
| O3 | ⟨α⁷⟩⟨α¹⁰⟩⟨α⁵⟩ |

7

| S1,2 | ⟨ 0=nop deg A=2, deg B=3 ⟩ |
| X=A | ⟨α⁷⟩⟨α⁵⟩⟨0⟩ |
| Y=B | ⟨α⁷⟩⟨α¹⁰⟩⟨α⁵⟩ |
| CK2 | ↑ |
| O1 | ⟨α⁷⟩⟨α⁵⟩⟨0⟩ |
| O2 | |
| O3 | ⟨α⁷⟩⟨α¹⁰⟩⟨α⁵⟩ |

FIG. 107A

| | CK | |
|---|---|---|
| | S1,2 | 0=nop degL=0, degM=0 |
| | A | 0, 0 |
| #0 | B | 1, 0 |
| | CK2 | ($\alpha$=0, $\beta$=1) |
| | O1 | 0, 0 |
| | Y=O2 | 1, 0 |
| | O3 | 1, 0 |
| | S1,2 | 2=reduceB degL=0, degM=0 |
| | X=A | 0, 0, 0 |
| #1 | B | 0, 1, 0 |
| | CK2 | ($\alpha$=$\alpha$, $\beta$=1) |
| | O1 | 0, 0, 0 |
| | X=O2 | 1, 0 |
| | O3 | 1, 0 |
| | S1,2 | 1=reduceA degL=2, degM=0 |
| | A | 0, 0, 0 |
| | Y=B | 0, 1, 0 |
| | CK2 | ($\alpha$=$\alpha$, $\beta$=$\alpha^{12}$) |
| #2 | O1 | 0, 0, 0 |
| | X=O2 | $\alpha$, $\alpha^{12}$, 0 |
| | O3 | 0, 1, 0 |
| | S1,2 | 1=reduceA degL=2, degM=0 |
| | A | 0, 0, 0 |
| | Y=B | 0, 1, 0 |
| | CK2 | ($\alpha$=$\alpha$, $\beta$=$\alpha^3$) |
| #3 | O1 | $\alpha$, $\alpha^{12}$, 0 |
| | X=O2 | $\alpha^2$, $\alpha^{13}$, $\alpha^3$ |
| | O3 | 0, 1, 0 |

FIG. 107B

APPARATUS FOR ENCODING AND DECODING REED-SOLOMON CODE

This application is a continuation of application Ser. No. 07/607,617 filed Oct. 30, 1990, now abandoned which is a continuation of application Ser. No. 07/135,051 filed Dec. 18, 1987, abandoned.

BACKGROUND OF THE INVENTION

1. Field of the Invention

The present invention relates to the field of error correction, as well as to the art of conducting parallel arithmetic operation for processing signals having symmetrical communication lines.

The present invention also is concerned with the art for executing various operations in coded recording of Reed-Solomon code, such as generation of syndrome, generation of GCD (greatest common divisor), error correction and erasure error correction.

More particularly, the invention is concerned with a method for executing the following computations:

$$y = r_{n-1} \cdot x^{n-1} + r_{n-2} \cdot x^{n-2} + \ldots + r_1 x + r_0 \quad (1)$$

$$y = GCD(A, B) \quad (2)$$

where, GCD (A, B) represents the greatest common polynomial of polynomials A and B.

$$y = A \cdot B \quad (3)$$

where $$A = a_a \cdot x^n a_{n-1} \times x^{n-1} + \quad . \quad . \quad + a_1 \cdot x + a_0$$
$$B = b_b \cdot x^n + b_{n-1} \cdot x^{n-1} + \ldots + b_r x + b_0$$

$$y = A \bmod B \quad (4)$$

2. Related Background Art

In recent years, it is becoming popular to make use of error detection/error correction codes (referred to simply as "error correction code" hereinafter) for the purpose of improving the reliability of various digital systems including memory systems.

Various error correction codes have been proposed for various systems, among which most popular is a class of linear codes generally referred to as "cyclic code". The cyclic code generally includes various codes such as BCH code suitable for random error correction, Fire code suitable for burst error correction, and Reed-Solomon code (referred to as "RS code" hereinafter) which is a kind of byte error correction and which is a kind of BCH code. Among these types of cyclic code, RS code is a significant one, because it can minimize the redundancy as compared with other linear codes having the same code length and error correction capacity. The RS code, therefore, has an increasing use in various fields of technology including satellite communication, magnetic disk and compact disk (referred to as "CD" hereinunder).

Various decoding methods for decoding RS code have been proposed. It is not too difficult to construct a decoder when the required correction capacity is as small as 2 to 3. For attaining a high reliability of the system, however, it is essential that the correction capacity is increased. The design for attaining a greater error correction capacity, however, is inevitably accompanied by problems such as an increase in the sale of correction apparatus, complication in the control of the apparatus, and longer computing time for decoding. To avoid such problems, in the field of CD, it has become a common measure to use a coding method known as CIRC which is a kind of dual coding method. This decoding method, however, is still unsatisfactory when used in systems which are required to have high operation speed and high reliability. In the field of opto-magnetic disk devices, it has been proposed to use a multiple error correction coding known as LDC (Long Distance Code), in order to obtain a high reliability. This code, however, does not make a contribution to the increase in the operation speed. Thus, it has been difficult to simultaneously handle the demands for high reliability and high speed which are essential in systems such as satellite communication systems.

On the other hand, current progress in semiconductor technology has made it possible to construct an RS code decoding apparatus in a VLSI scale. In the design of such apparatus, it is significant to adopt a coding method which makes efficient use of architectural features of VLSI, i.e., regular internal structure which affords a large scale of integration. The decoding process for RS code is composed of the following steps.

Step 1: Generation of syndrome.
Step 2: Generation of error position polynomial and error value polynomial.
Step 3: Generation of error position and error value.
Step 4: Execution of error correction.

Among these steps of RS code decoding process, Step 2 is the most complicated one. This step is conducted by using various algorithms such as Peterson's method, Berlekamp-Massey method, and Euclid mutual division (Euclidean algorithm). The formation of an error position polynomial and error value polynomial in accordance with the Euclidean algorithm can be regarded as a matter of expanded GCD (greatest common divisor) of the polynomials.

In general, questions concerning the expanded GCD can be solved by a systolic algorithm which is an algorithm developed by Kung et al and suitable for use in design of VLSI. The architecture of this algorithm is constituted by networks of simple processing elements (PE) and has the following features.

I) Arithmetic operations of networks of the same processor are conducted during transfer of data.

II) Networks between processors are formed by connecting adjacent processors in accordance with a predetermined rule.

III) A time delay of at least one unit is required for the transfer of data from a node (processor) to another node of the network.

This architecture is a system generally referred to as a pipeline system, and is capable of regularly circulating data so as to execute parallel arithmetic operation. In Addition, the error correcting capacity can be increased by increasing the number of PEs which operate in parallel.

A basic systolic algorithm for solving the expanded GCD of polynomials has been already proposed by Kung et al. This algorithm, however, has been derived on an assumption that it is executed by software by means of programmable systolic chip.

SUMMARY OF THE INVENTION

A first object of the present invention is to provide a practical algorithm which is adaptable to an RS code decoder, syndrome generator, GCD generator and error evaluation section, by making use of the concept of a systolic algorithm, and to make it possible to construct such a practical algorithm with processing elements (PE) of the same construction.

A second object of the present invention to provide an architecture which is capable of achieving the condition 4) mentioned before with a miniaturized system at a cost of reduced speed, by making an efficient use of the architectural features of an RS code decoder composed of PEs mentioned above.

BRIEF DESCRIPTION OF THE DRAWINGS

FIG. 16A-16E is an illustration of an algorithm for generating GCD by making use of PEs;

FIG. 19 is a timing chart illustrating the operation of the GCD generating PE shown in FIG. 18;

FIG. 20 is a timing chart illustrating the operation of the GCD generating PE shown in FIG. 18;

FIG. 23A-23B is a timing chart showing the operation of the GCD generating PE shown in FIG. 22;

FIG. 24A-24B is a timing chart showing the operation of the GCD generating PE shown in FIG. 22;

FIG. 25 is an illustration of an example of GCD generation;

FIG. 28 is an illustration of another example of the GCD generating PE making use of the construction shown in FIG. 5;

FIGS. 29 and 30 are connection diagrams of the GCD generating PE shown in FIG. 28;

FIG. 65 is a timing chart illustrating the operation of the syndrome generating circuit shown in FIG. 64:

FIG. 66 is a connection diagram of the PE shown in FIG. 64;

FIG. 68 is an illustration of a GCD generating circuit making use of the PE shown in FIG. 63;

FIG. 74 is an illustration of an error evaluation circuit employing an optimized form of the PE shown in FIG. 63;

FIG. 80 is a timing chart showing the operation of the error evaluation circuit shown in FIG. 79;

FIG. 81 is a timing chart illustrating the operation of the error evaluation circuit shown in FIG. 79;

FIG. 106A-106B is an illustration of operation timing of the conventional GCD generating PE;

FIG. 107A-107B is a timing chart illustrating the operation of the conventional GCD generating PE;

DESCRIPTION OF THE PREFERRED EMBODIMENTS

Figure 1:
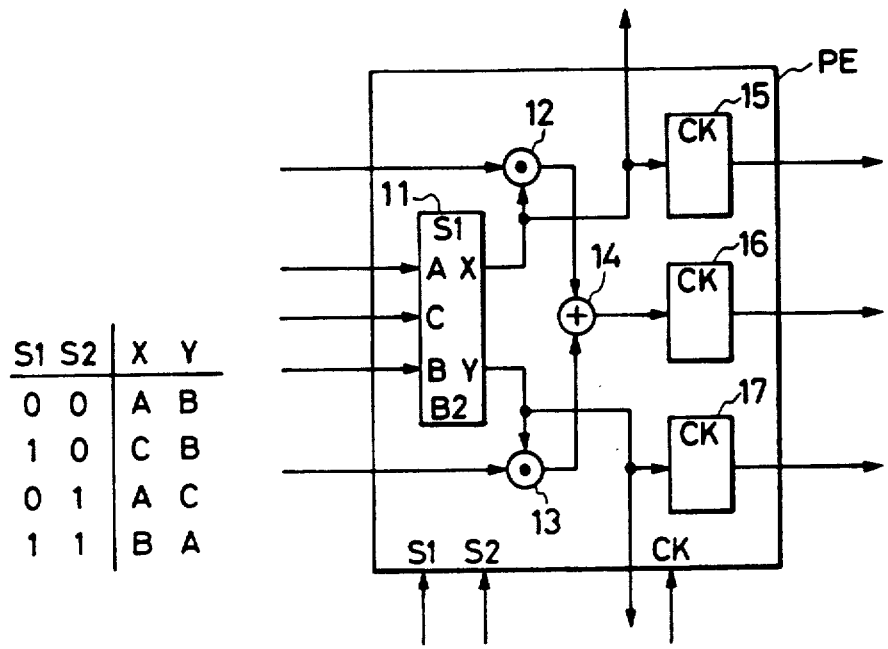
FIG. 1 is an illustration of a processing element (PE) in accordance with a first embodiment of the invention.

A description will first be made as to the principle of the error correction before turning to the description of the preferred embodiment.

Principle of RS Code

The principle of the RS code is as follows. As sated before, RS code in general can minimize the redundancy as compared with other linear codes having the same code length and the correction capacity and, hence, has a great significance.

The RS code is a special form of non-binary BCH code (Bose-Chaudhuri-Hocquenghen code) and is constituted by the elements of a Galois field, or finite field GF (q) where q represents the order of the field. By making use of this value q, parameters characterizing RS codes are defined as follows.

Code length: n (number of symbols in a code)

$$n \leq q - 1 \tag{1}$$

Number of Information Symbols:
k (number of symbols in a code)
Number of examination (or check) symbols:
n−k (number of examination symbols in a code)

$$n - k = dmin - 1 \tag{2}$$

Correction capacity:
t (number of correctable symbols in a code)

$$t = \left[ \frac{dmin - 1}{2} \right] \tag{3}$$

([x] Gauss symbol ... greatest integer which does not exceed x.

The term dmin represents the minimum distance which also is referred to as Hamming distance.

Coding

A description will be made hereinunder as to the polynomial expressions of codes.

It is assumed here that k pieces of information symbols to be coded are expressed by the following formula (4).

$$I = (i_0, i_1, \ldots, i_{k-1}) \tag{4}$$

This can be polynomially expressed as follows.

$$I(x) = i_0 + i_1 x + i_1 x^2 + \ldots + i_{k-2} x^{k-2} + i_{k-1} x^{k-1} \tag{5}$$

Similarly, the (n−k) pieces of examination symbols, expressed by the formula (6), is transformed as the formula (7) below.

$$C = (C_0, C_1, \ldots, C_{n-k-1}) \tag{6}$$

$$C(x) = C_0 + C_1 x + C_2 x^2 + \ldots C_{n-k-1} \cdot x^{n-k-1} \tag{7}$$

The code word F is expressed as the following formulae (8) and (9).

$$F = (f_0, f_1, f_2, \ldots f_{n-1}) \tag{8}$$
$$= c_0, c_1 \ldots c_{n-k-1}, i_0, i_1, i_2, \ldots i_{k-1}) \tag{9}$$

Thus, the code word F is expressed by a polynomial (10).

$$F(x) = f_0 + f_1 x + f_2 x^2 + \ldots f_{n-2} x^{n-2} + f_{n-1} x^{n-1} \tag{10}$$

As explained before, RS code is a kind of cyclic code. One of the factors which characterizes the cyclic code is a generator-polynomial G(x) which is used in coding/decoding. The polynomial G(x) has to have the number of degree equal to the examination symbol number (n−k) and has to be able to evenly divide ($X^n - 1$)

In the illustrated case, the following formula is used.

$$G(x) = (x - a)(x - a^2) \ldots (x - a^{n-k}) \ldots \tag{11}$$

where, $\alpha$ represents a primitive element of the finite field GF (q) by which the code is defined.

The following procedures are taken for obtaining the (n.k) RS code by making use of the polynomial of the (n−k)th order.

i) To multiply the information symbol polynomial I(x) (formula 5) with $x^{n-k}$.

ii) The residue polynomial obtained by dividing $I(x) \cdot x^{n-k}$ by G(x) is represented by R(x).

iii) The R(x) is substituted by the examination symbol polynomial C(x) and $I(x) \cdot x^{n-k}$ is added thereto, and the result of the addition is expressed by a code word polynomial F(x).

$$F(x) = I(x) \cdot x^{n-k} - C(x) = Q(x) \cdot G(x) \tag{12}$$

As will be understood from formula (12), the code word polynomial F(x) can be divided by the generated polynomial G(x). The generated polynomial (11) has roots $\alpha, \alpha^2, \ldots, \alpha^{n-k}$. By substituting these roots, the following formula (13) is obtained by substituting these roots.

$$F(\alpha^i) = 0 (i = 1, 2, \ldots, n-k) \tag{13}$$

The formula (13) can be expressed by the following matrix (14), where $F^T$ represents the transposition matrix of F.

$$H \cdot F^T = \begin{bmatrix} 1 & \alpha & \alpha^2 & \ldots & \alpha^{n-1} \\ 1 & \alpha^2 & \alpha^4 & \ldots & (\alpha^2)^{n-1} \\ \cdot & \cdot & \cdot & & \cdot \\ \cdot & \cdot & \cdot & & \cdot \\ \cdot & \cdot & \cdot & & \cdot \\ 1 & \alpha^{n-k} & (\alpha^{n-k})^2 & \ldots & (\alpha^{n-k})^{n-1} \end{bmatrix} \tag{14}$$

$$\begin{bmatrix} c_0 \\ c_1 \\ \cdot \\ \cdot \\ \cdot \\ c_{n-k-1} \\ i_0 \\ i_1 \\ \cdot \\ \cdot \\ \cdot \\ i_{k-1} \end{bmatrix} = 0$$

The left side matrix H is referred to as examination matrix and has a significant meaning in the decoding.

Decoding Method

As explained before, the RS code is a kind of BCH code so that it can be decoded by means of an ordinary BCH code decoding algorithm. The processing of symbols, e.g., addition, multiplication and so forth, has to be conducted on the finite field GF(q) by which the RS code is defined.

It is assumed here that an RS code having a code length of $n = 2^m - 1$ is defined on $GF(2^m)$, m being an integer. The symbol is expressed in terms of m-bit binary numbers and the computation thereof is conducted on GF($2^m$). For the purpose of simplification of explanation, the minimum distance of the code is determined as dmin=2t+1.

$$G(x)=(x-\alpha)(x-\alpha^2)\ldots(x-\alpha^{n-k}) \quad (5)$$

where, $\alpha$ is a primitive element on the finite field GF($2^m$).

As in the case of ordinary BCH codes, the process for decoding the RS code is composed of the following four steps.

Step 1): Computation of syndrome.
Step 2): Computation of error position polynomial and error evaluation polynomial
Step 3): Estimation of error position and error value.
Step 4): Execution of error correction.

Step 1) Syndrome Computation

The transmitted code words F, E and R are represented as follows.

F: $F=(f_0, f_1, \ldots f_{n-1})$
E: $E=(e_0, e_1, \ldots e_{n-1})$ $$R: R = (r_0, r_1, \ldots r_{n-1}) = F + E$$
$$= (f_0 + e_0, f_1 + e_1, \ldots, f_{n-1} + e_{n-1})$$

Then, the polynomial expression R(x) of the received word is expressed as follows.

$$\begin{aligned} R(x) &= F(x) + E(x) \\ &= (f_0 + e_0) + (f_1 + e_1)x + \ldots + \\ &\quad (f_{n-1} + e_{n-1})x^{n-1} \end{aligned} \quad (15)$$

The condition of ($F(\alpha^i)=0$) is met by substituting the root $\alpha^i (i=1,\ldots, n-k)$ of the generator G(x) to the code polynomial F(x). Therefore, by substituting $\alpha^i$ ($i=1,\ldots, n-k$) to the received word polynomial R(x), a value which is determined solely by the error E is obtained as follows.

$$R(\alpha^i)=F(\alpha^i)+E(\alpha^i)=0+E(\alpha^i)=E(\alpha^i) \quad (16)$$

This value is referred to as syndrome, and is defined by the following formulae (17) and (18).

The syndrome contains all the information concerning the error. The syndrome is zero unless there is an error. It is therefore possible to detect the presence or absence of error by checking the syndrome. The syndrome formulae (17) and (18) are expressed by the following matrix. The syndrome as expressed by the formula (17) and (18) is expressed by a matrix as follows.

$$S=(S_0, S_1, \ldots, S_{n-k-1}) \quad (17)$$

$$S_i=E(\alpha^{i+1})(i=0, 1, \ldots, n-1) \quad (18)$$

$$S=H \cdot R^T \ (R^T: \text{transposition matrix of } R) \quad (19)$$

$$\begin{bmatrix} s_0 \\ s_1 \\ \cdot \\ \cdot \\ \cdot \\ s_{n-k-1} \end{bmatrix} = \quad (20)$$

$$\begin{bmatrix} 1 & \alpha & \alpha^2 & \ldots & \alpha^{n-1} \\ 1 & \alpha^2 & \alpha^4 & \ldots & (\alpha^2)^{n-1} \\ \cdot & \cdot & \cdot & & \cdot \\ \cdot & \cdot & \cdot & & \cdot \\ \cdot & \cdot & \cdot & & \cdot \\ 1 & \alpha^{n-k} & (\alpha^{n-k})^2 & \ldots & (\alpha^{n-k})^{n-1} \end{bmatrix} \begin{bmatrix} r_0 \\ r_1 \\ \cdot \\ \cdot \\ \cdot \\ r_{n-1} \end{bmatrix}$$

$$\| \\ H$$

Step 2) Computation of Error Position Polynomial and Error Evaluation Polynomial In Step 2), error position polynomial and error evaluation polynomial are computed in accordance with the syndrome which is obtained as a result of the computation conducted in Step 1). The number of unknowns of the error E other than zero ($E=(e_0, e_1, \ldots e_{n-1})$, i.e., the number of errors, is represented by $l (l \leq t)$. The position where the error is taking place is expressed by ju (u=1, 1, \ldots, l) and the error at the position ju is represented by $e_{ju}$. At the same time, the following formula (21) is derived from the formulae (2) and (3), $$n-k=dmin-1=2t \quad (21)$$

Consequently, the syndrome and the syndrome polynomial are expressed as follows.

$$s_i = E(\alpha^{i+1}) = \sum_{u=1}^{l} e_{ju}(\alpha^{i+1})^{ju} \quad (22)$$
$$(i = 0, 1, \ldots 2t-1)$$

$$S(x) = \sum_{i=0}^{2t-1} S_i x^i = \sum_{u=1}^{l} e_{ju} \alpha^{ju} \sum_{i=0}^{2t-1} (\alpha^{ju})^i \cdot x^i \quad (23)$$

The following formulae (25) and (26) are obtained on condition of the following formula (24).

Assume $$S_\infty(x) = \sum_{i=0}^{\infty} s_i x^i \quad (24)$$

$$\begin{aligned} S_\infty(x) &= \sum_{u=1}^{l} e_{ju} \alpha^{ju} \sum_{i=0}^{\infty} (\alpha^{ju})^i \cdot x^i \\ &= \sum_{u=1}^{l} e_{ju} \alpha^{ju} \frac{1}{1-\alpha^{ju}x} \end{aligned} \quad (25)$$

$$S(x)=[S_\infty(x)] \bmod x^{2t} \quad (26)$$

The error position polynomial $\sigma(x)$ is defined as follows. This polynomial has roots $\alpha^{-ju}$ of GF($2^m$) corresponding to the error positions ju (u=1, 2, \ldots, l)

$$\sigma(x) = (1-\alpha^{j_1}x)(1-\alpha^{j_2}x)\ldots(1-\alpha^{j_l}x) = \prod_{u=1}^{l}(1-\alpha^{ju}x) \quad (27)$$

In relation to the above-described polynomials $\sigma(x)$ and $S_\infty(x)$, the error evaluation polynomial $\omega(x)$ is defined as follows.

$$\omega(x) = \sigma(x) \cdot S_\infty(x) = \sum_{u=1}^{l} e_{j_u} \alpha^{j_u} \left\{ \prod_{(k=1, k \neq u)}^{l} (1 - \alpha^{j_k} x) \right\} \quad (28)$$

The following formula (29) is derived from the formulae (25), (26) and (28).

$$\sigma(x) \cdot S(x) = [\omega(x)] \bmod x^{2t} \quad (29)$$

Using a suitable polynomial A(x), $\sigma(x)$, S(x) and $\omega(x)$ are correlated as follows.

$$A(x) \cdot x^{2t} + \sigma(x) \cdot S(x) = \omega(x) \quad (30)$$

As stated before, the number l is determined to meet the condition of $l \leq t$. Therefore, $\omega(x)$ and $\sigma(x)$ satisfy the conditions of the following formula (31).

$$\deg \omega(x) < \deg \sigma(x) \leq t \quad (31)$$

In formula (31), deg $\omega(x)$ represents the degree of $\omega(x)$, where $\omega(x)$ and $\sigma(x)$ are, relatively, prime (GCD polynomial is a constant). Therefore, $\omega(x)$ and $\sigma(x)$ can be determined definitely except for difference in constant coefficient. As will be understood from the above, $\omega(x)$ and $\sigma(x)$ can be obtained in the course of a Euclid mutual division process. A description will be made hereunder as to the method of computing the GCD polynomial by making use of the Euclid mutual division process. The greatest common division polynomial of two polynomials A and B is expressed by GCD[A, B]. At the same time, the following polynomials A and B are defined with respect to the polynomials A and B.

On condition of degA $\geq$ degB $$\overline{A} = A - [A \cdot B^{-1}] \cdot B \quad (32)$$

$$\overline{B} = B \quad (33)$$

On condition of deg A $\leq$ deg B $$\overline{A} = A \quad (34)$$

$$\overline{B} = B - [B \cdot A^{-1}] \cdot A \quad (35)$$

where $[X \cdot Y^{-1}]$ represents the quotient obtained by dividing a polynomial X by polynomial X. Consequently, GCD[A,B] and GCD[$\overline{A},\overline{B}$] satisfy the following condition.

$$\text{GCD}[A,B] = \text{GCD}[\overline{A},\overline{B}] \quad (36)$$

A series of computations is then conducted in which A and B is substituted by A and B and conversion of the formulae (32), (33) or the formulae (34), (35) is executed. This operation is repeated until either one of A and B becomes a zero polynomial. In this state, the non-zero polynomial, i.e., the other polynomial, is obtained as the greatest common divisor polynomial. The determination of the greatest common divisor polynomial of the polynomials A and B is equivalent to the determination of the following polynomials C and D.

$$\text{GCD}[A, B] = C \cdot A + D \cdot B \quad (37)$$

By repeating the above-described steps, it is possible to obtain the greatest common divisor polynomial of polynomials A and B of the degrees of which meet the condition of i=degA$\geq$degB. Polynomials C, D, W which satisfy the following condition are determined in the course this computation for determining the greatest common divisor polynomial of the polynomials A and B.

$$\begin{bmatrix} \deg W < j \ (j \leq i), \deg D \leq i - j \ (i, j: \text{ positive integer}) \\ C \cdot A + D \cdot B = W \end{bmatrix} \quad (38)$$

The question of such a polynomial is referred to as "expanded GCD question". Therefore, the error position polynomial $\sigma(x)$ and the error evaluation polynomial $\omega(x)$ can be determined by solving the expanded GCD question which is derived by substituting $x^{2t}$ and S(x) for the polynomials A and B in the formula (38).

Basic Algorithm

As explained above, the algorithm for deriving the error position polynomial $\sigma(x)$ and the error evaluation polynomial $\omega(x)$ can be attributed to an expanded GCD question. More specifically, representing $x^{2t}$ and the syndrome polynomial S(x) of formula (23) of $A_0$ and $B_0$, respectively (deg$A_0$=2t, deg$B_0$=2t−1), the greatest common divisor GCD[$A_0$, $B_0$] is determined and, in the course of determination of GCD[$A_0$, $B_0$], polynomials D and W which satisfy the condition of the formula (39) are obtained.

$$\begin{bmatrix} \deg W < t, \deg D \leq t \\ C \cdot A_0 + D \cdot B_0 = W \end{bmatrix} \quad (39)$$

The thus determined D and W represent, respectively, the error position polynomial $\sigma(x)$ and the error value polynomial $\omega(x)$. It is known that the polynomials $\sigma(x)$ and $\omega(x)$ are definitely determined except for the difference in the constant coefficient. Thus, polynomials $\sigma(x)$ and $\omega(x)$ are obtained through the following computation.

The following polynomials A, B, U, V, L and M are defined for the above-mentioned polynomials $A_0$ and $B_0$.

$$\begin{bmatrix} A = U \cdot A_0 + L \cdot B_0 & (40) \\ B = V \cdot A_0 + M \cdot B_0 & (41) \end{bmatrix}$$

Setting the respective initial values as U=M=1; L=V=0; (A=$A_0$=$x^{2t}$, B=$B_0$=S(x)), repetitional steps S 152 to S 155 are executed. When the condition of degA (or degB)<t is met, A(or B) is determined as the polynomial $\omega(x)$ and L(or M) is determined as the polynomials $\sigma(x)$.

Figure 15:
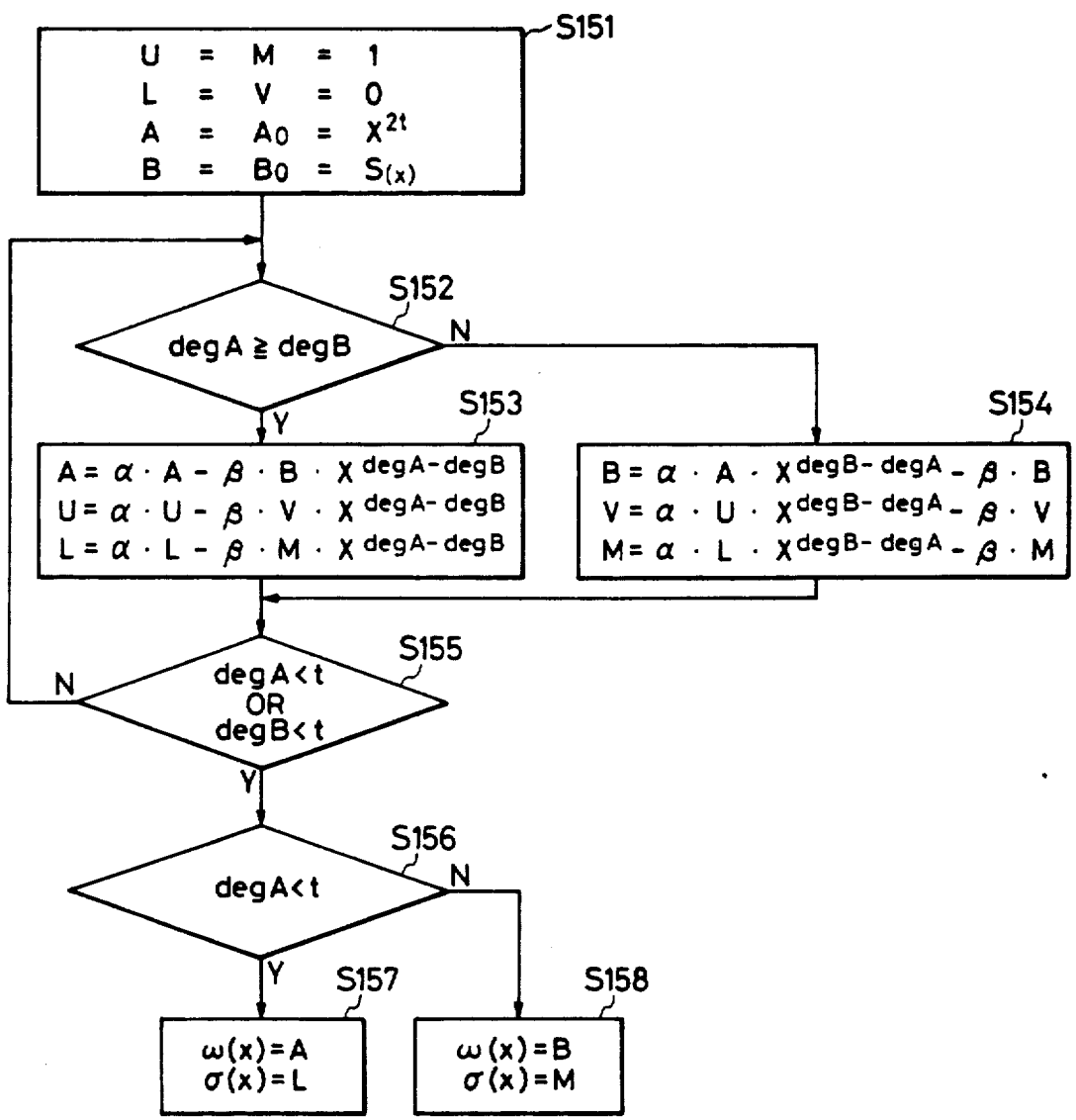
FIG. 15 is an illustration of an algorithm for determining GCD.

In the method illustrated in FIG. 15, the polynomials A and B are multiplied in a staggered manner with the maximum degree coefficient $\alpha$ of the polynomial B and the maximum degree coefficient $\beta$ of the polynomial A, thus eliminating the division on the GF in the repetitional steps (refer to formulae 32 and 34). This method does not substantially affect the accuracies of the values of polynomials $\sigma(x)$ and $\omega(x)$.

Referring to FIG. 15, in Step S 151, initial values are set as $U=M=1$, $L=V=0$, $A=A_0$ and $B=B_0$. In Step S 152, a judgment is conducted as to whether a condition $\deg A \geq \deg B$ is met. In Step S 153, the polynomials A and B are multiplied in a staggered manner with the greatest degree coefficients $\beta$ and $\alpha$, so as to neglect the division on the GF in repetitional steps of the formulae (32) and (34).

When the degA or the degB has become smaller than a predetermined number of order in Step S 155, the process proceeds to Steps S 147 and S 158, thus computing $\omega(x)=A$, $\sigma(x)=L$, $\omega(x)=B$ and $\sigma(x)=M$.

In order to execute the repetitional steps shown in FIG. 15, the following three executing modes are required corresponding to the polynomials A and B.

i) degA, degB≧t and degA≧degB ... "reduce A"
ii) degA, degB≧t and degA≧degB ... "reduce B"
iii) degA<t or degB<t ... "nop"

Step 3) Estimation of Error Position and Error Value

In Step 3), error position and error value are estimated from the error position polynomial $\sigma(x)$ and the error value polynomial $\omega(x)$ which are obtained in Step 2)

This step is commenced by successively substituting, for the error position polynomial $\sigma(x)$, the unknowns $\alpha^{-i}$ of the $GF(2^m)$ corresponding to the positions $i=0, 1 \ldots, n-1$ in the received word $R=(r_0, r_1, \ldots, r_{n-1})$. If a condition $\sigma(\alpha^{-i})'0$ derived from the formula (27) is met, it is understood that the value i corresponds to the error position ju so that the condition of $\alpha^{-i}=\alpha^{-ju}$ is established. ($u=1, 2, \ldots 1, 1 \leq t$) The value of the error value polynomial $\omega(x)$ corresponding to $\alpha^{-i}=\alpha^{-ju}$ is obtained as follows.

$$\omega(\alpha^{-ju}) = e_{ju} \cdot \alpha^{ju} \cdot \left( \prod_{(k=1, k \neq u)}^{l} (1 - \alpha^{jk} \cdot \alpha^{-ju}) \right) \quad (42)$$

The differential $\sigma'(x)$ of $\sigma(x)$ is obtained as follows.

$$\sigma'(\alpha^{-ju}) = -\alpha^{ju} \cdot \left( \prod_{(k=1, k \neq u)}^{l} (1 - \alpha^{jk} \cdot \alpha^{-ju}) \right) \quad (43)$$

From the formulae (42) and (43), the value of the error $e_{ju}$ at the position ju is determined by the following formula.

$$e_{ju} = \frac{-\omega(\alpha^{-ju})}{\sigma'(\alpha^{-ju})} \quad (44)$$

As stated before, in Step 3) of the decoding process, the unknowns $\alpha^{-j}(j=n-1, \ldots 2, 1, 0)$ of $GF(2^m)$ defining the RS code are successively substituted to three polynomials obtained in Step 2), i.e., the error position polynomial $\sigma(x)$, error evaluation polynomial $\omega(x)$ and the differential $\sigma'(x)$ of the error position polynomial $\sigma(x)$. The received symbols are successively input from the higher degree of the received word polynomial. (In this case, the received symbols are input in accordance with the degree of the polynomial, namely, starting from the term of the highest degree. Thus, successive values of rj $(j=n-1, \ldots, 2, 1, 0)$ are input successively. It is to be understood, therefore, the sequence or order of substitution of $\alpha^{-j}(j=n-1, \ldots 2, 1, 0)$ is reversed in Step 3).

The actual operation can simply be conducted by merely substituting variances to the polynomial and to compute the values. This can be accomplished by an algorithm similar to that of a later-mentioned formula (50). For instance, the computation of the t-degree polynomial f(x) can be developed as follows.

$$f(x) = f_t x^t + f_t - 1x^{t-1} + \ldots + f_1 x + f_0 \quad (45)$$
$$= \{ \ldots [(f_t x + f_t - 1)x + f_t - 2]x + \ldots + f_1\}x + f_0 \quad (46)$$

In the syndrome computation, each cell has a value x to be substituted.

Step 4) Execution of Error Correction

The receiving symbol $r_{ju}$ at the position ju where the error is taking place can be expressed as follows from the symbol $f_{ju}$ and the size $e_{ju}$ of the error.

$$f_{ju} = r_{ju} - e_{ju} \quad (47)$$

In Step 4), therefore, error correction is conducted at the position i $(i=0.1, \ldots n-1)$ where a condition of $\sigma(\alpha^{-i})=0$ is obtained as a result of execution of Step 3). More specifically, a subtraction of formula (49) is conducted on the $GF(2^m)$, namely, $e_i$ expressed by formula (48) is subtracted from the received symbol $r_i$.

$$e_i = \frac{\omega(\alpha^{-i})}{\sigma'(\alpha^{-i})} \quad (48)$$

$$f_i = r_i - e_i \text{ (on } GF(2^m)) \quad (49)$$

First Embodiment

The construction and operation of a first embodiment will be described hereinunder, on the basis of the principle of error correction described above.

FIG. 1 shows a processing element (PE) as a base of a systolic architecture.

Figure 4:
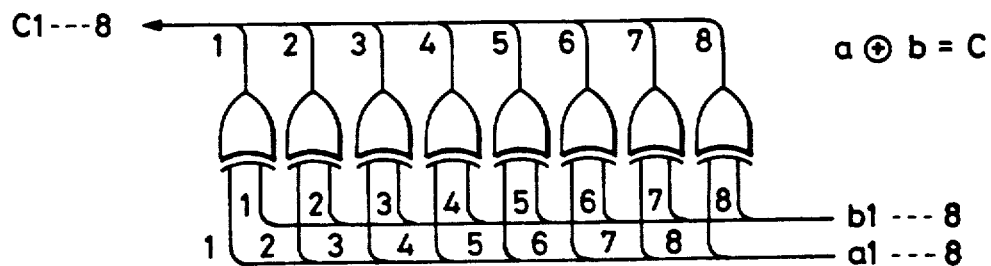
FIG. 4 is an illustration of a practical arrangement of an adder on a Galois field of the PE.
Figure 2:
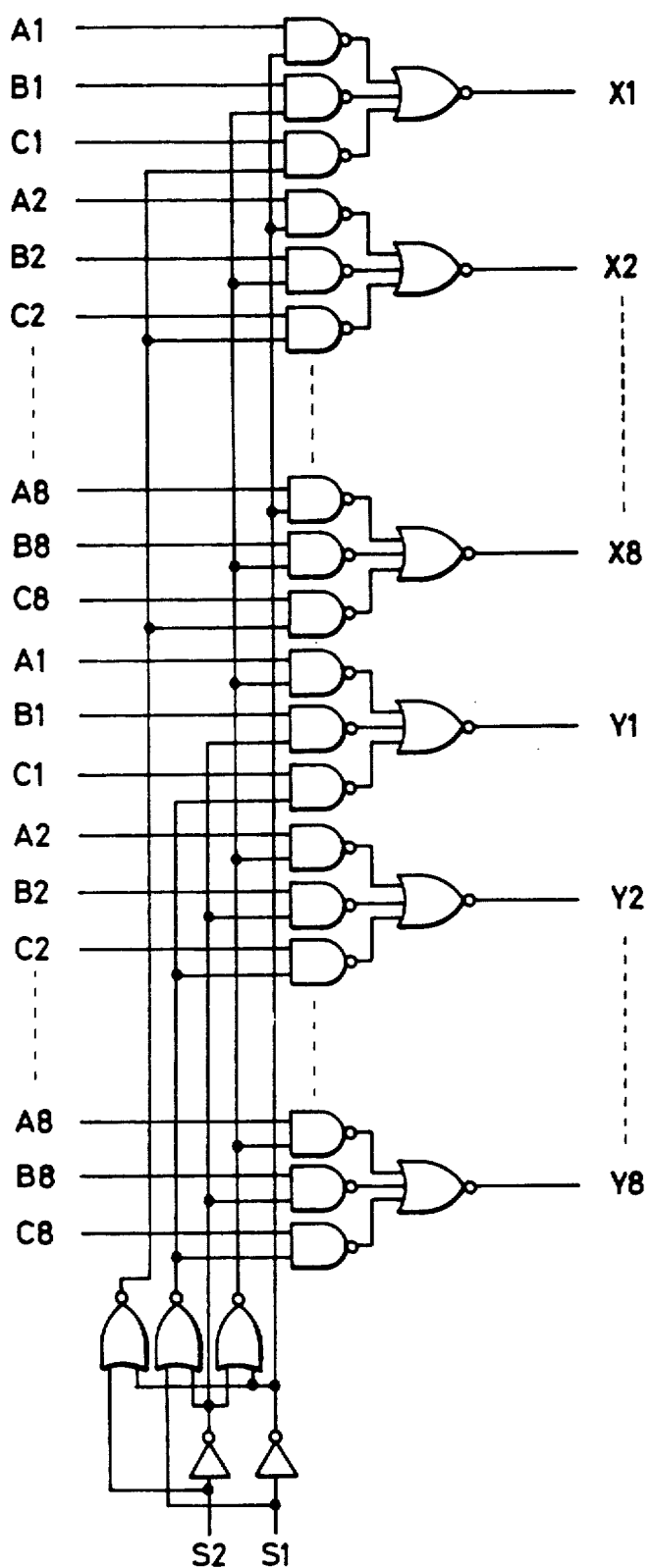
FIG. 2 is an illustration of the construction of the selector of the PE.
Figure 3:
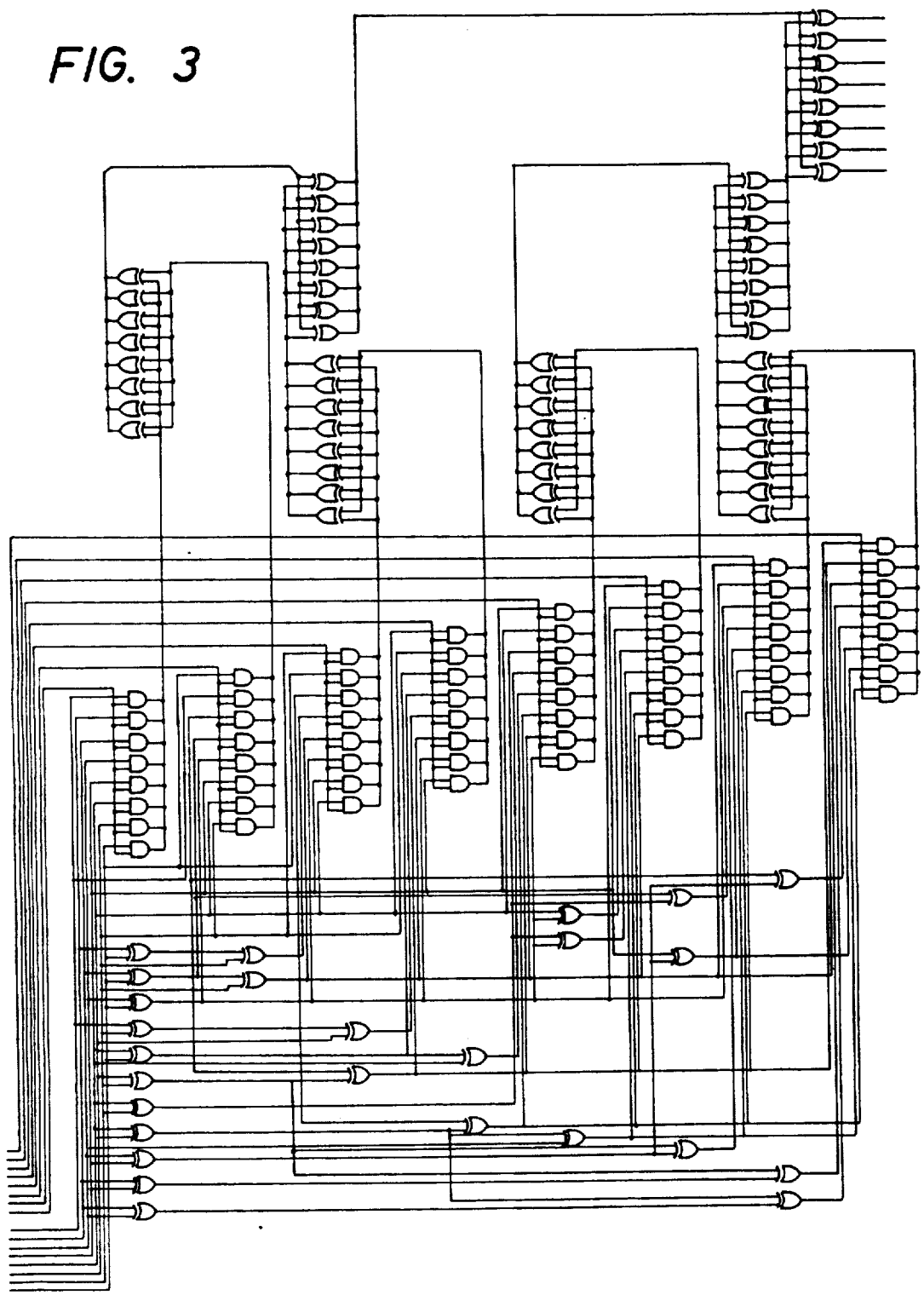
FIG. 3 is an illustration of a practical arrangement of a multiplier on a Galois field of the PE.

Referring to this figure, reference numeral 11 denotes a selector for selectively outputting inputs of A, B and C to X and Y in accordance with the selection signal S1 and S2. Marks ⊙ designated at 12 and 13 represent multipliers on the Galois body. The multiplier can be realized by a gate circuit. The mark ⊕ denoted by 14 represents an adder on the Galois body. This can be realized by an EXOR circuit. Numerals 15 to 17 denote registers adapted to be latched by clocks CK. The selector, multiplier and adder (primitive polynomial $p(x)=x^8+x^4+x^3+x^2+1$) can be realized by gates on the GF 28, as shown in FIGS. 2, 3 and 4. The scale of gate structure to about 800 gates per PE, and the processing speed is computed as 10−20 Mhz=80−160 Mbps on an assumption that the delay required for one gate is 5 to 10 ns. This is because the process is executed on symbol (8 bits) basis. (Although the delay per gate is assumed to be of TTL level, a higher processing speed is obtainable by optimizing the processing portions of the PE, i.e., the selector, multiplier and adder, in designing the VLSI. Such a design is not difficult, because these processing sections are arranged in concentrated manner.)

Figure 5:
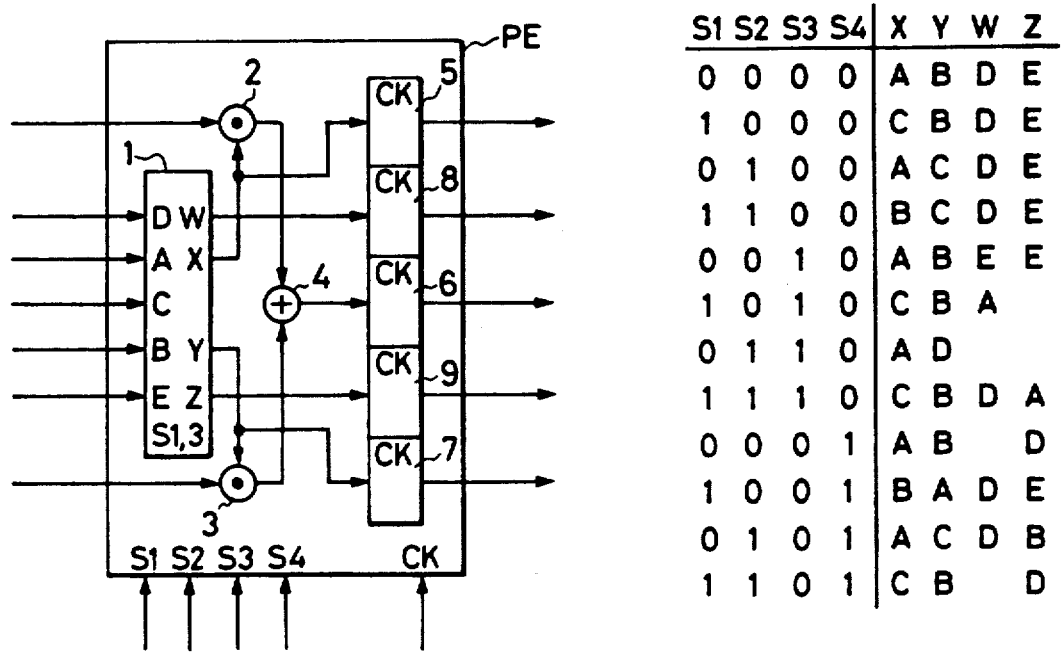
FIG. 5 is an illustration of an expanded PE in accordance with the present invention.

Furthermore, it is possible to obtain a connection with reduced number of interfaces by expanding the construction of PE in a manner shown in FIG. 5. In FIG. 5, the selector 11 has 5 inputs and 4 outputs. (Various combinations of outputs as shown in Table 2 are obtainable in accordance with the selection signal S1 . . . 4.). This PE has a circuit scale of about 1000 gates, but the processing speed is the same. By using these PEs, it is possible to operate all the PEs with the same blocks, thus enabling the whole system to be controlled solely by the selection signals S1, . . . 4 of the PE.

Syndrome Generating Section

In Step 1), coefficients ($S_{2t-1}$, $S_{26-2}$, . . . , $S_1$, $S_0$) of the syndrome polynomials necessary in Step 2) are computed from the receiving system row R ($R_{n-1}$, $r_{n-2}$, . . . , $r_1$, $r_0$).

Since the receiving symbols $r_{n-1}$, $r_{n-2}$, . . . , $r_1$, $r_0$ of the receiving system row R are transferred in a serial manner, the computation of coefficients of the syndrome polynomials can be expressed by the following cyclic algorithm.

$$S_{j-1} = ( \ldots ((r_{n-1}*\alpha^j + r_{n-2})*\alpha^j + r_{n-3})*\alpha^j + \ldots + r_1)*\alpha^j + r_o \quad (50)$$

Figure 8:
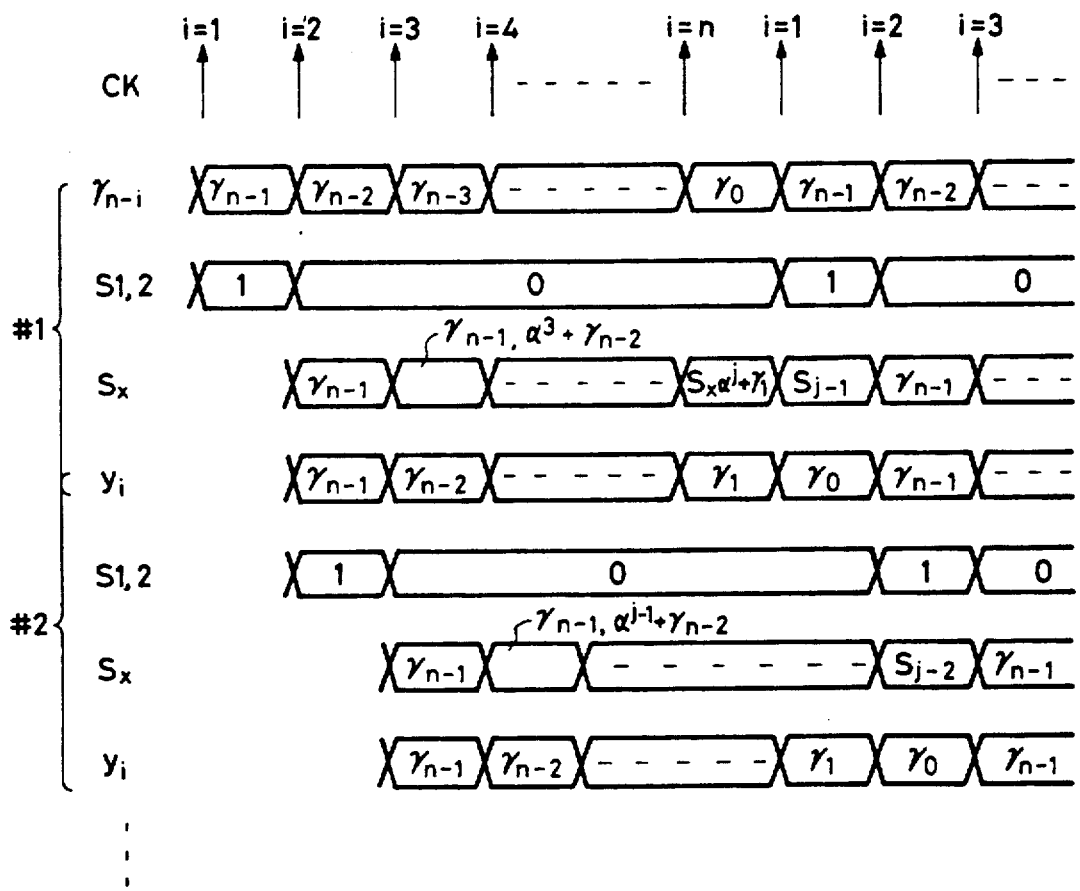
FIG. 8 is a timing chart illustrating the operation of the syndrome generating PE shown in FIG. 1.
Figure 9:
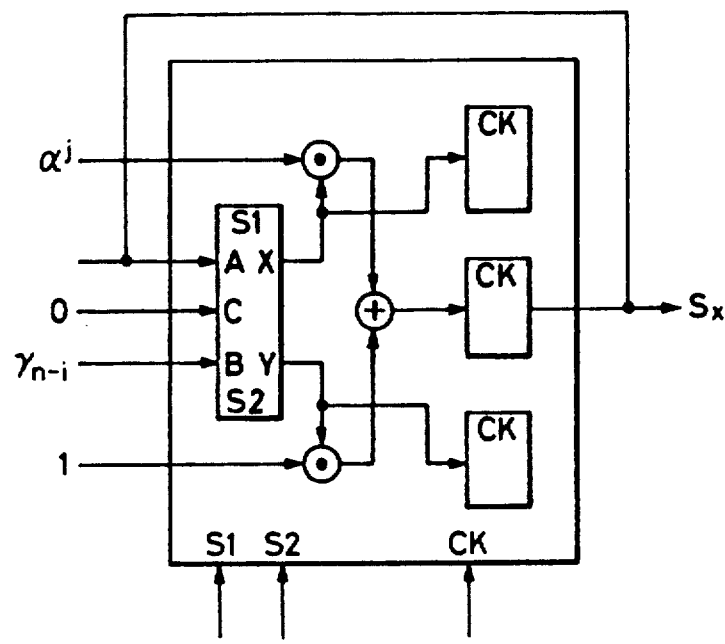
FIG. 9 is an illustration of another example of the syndrome generating PE making use of the construction shown in FIG. 1.

This formula therefore can be reduced as follows.
$Z_0 = 0$
$Z_i = Z_{i-1}*\alpha^j + r_{n-1}$ (i=1, . . . , n)
$S_{j-1} = Z_n$ A signal is transmitted as shown in FIG. 8 by making use of the PE shown in FIG. 1, as will be understood from the foregoing description.

As the first step, i=1 and $r_{n-1}$ are input to the selector input B. The Y output of the selector selects the B input so as to provide an output $r_{n-1}$. For the purpose of computing $Z_1 = Z_0*\alpha_j + r_{n-1}$, the X output of the selector selects C so as to provide an output 0, thus meeting the condition of $Z_0 = 0$ (S1, 2=1, 0). The X and Y outputs are respectively multiplied with $\alpha j$, 1 and the values obtained through the multiplication are added to each other thereby generating $Z_1 = r_{n-1}$ which in turn is input to the register 66 in synchronization with the next clock. In synchronization with this clock, the Y output $r_{n-1}$ is input to the register 67. Then, by determining the X output of the selector such that the A input is selected, the preceding output $Z_{i-1}$ is output from the output X (S1, 2=0, 0), so that the computation of $Z_i = Z_{i-1}*\alpha^j + r_{n-1}$ is executed and one $S_{i-1}$ of the coefficients of the syndrome polynomials is generated. Meanwhile, (n−i) are successively output from the register 67.

Figure 7:
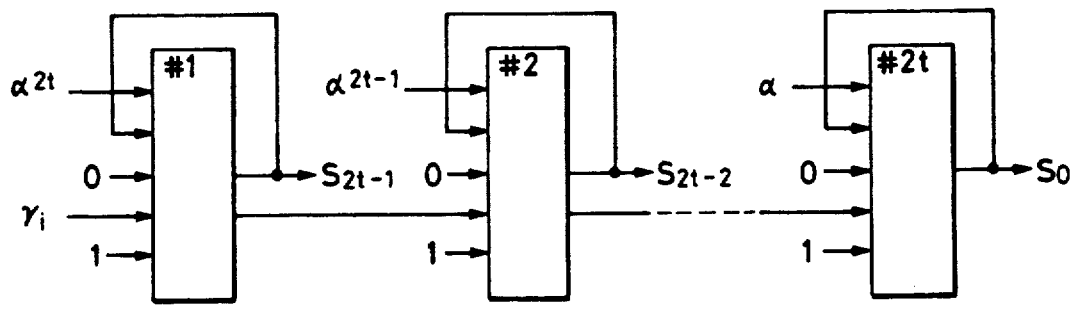
FIG. 7 is a connection diagram of the syndrome generating PE.

The PEs are connected in a manner shown in FIG. 7 and the value of $\alpha j$ are allocated thereto, so that the coefficients of the syndrome polynomial are successively generated. The timing of generation is shown in FIG. 8.

Figure 10:
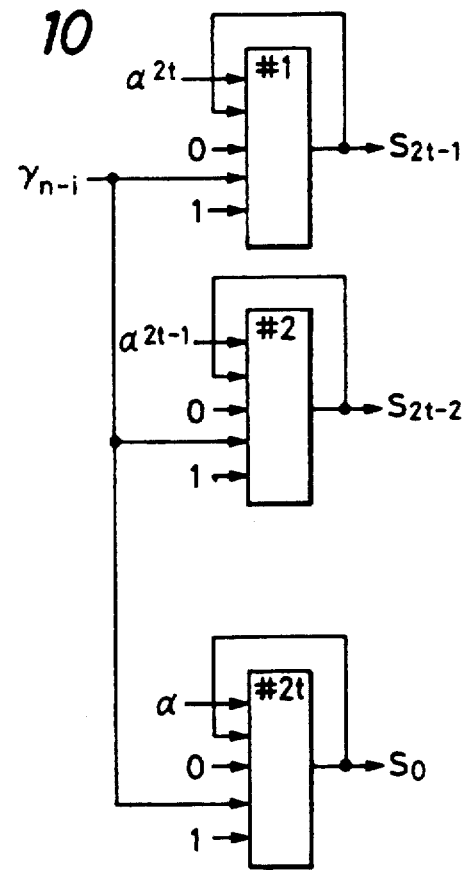
FIG. 10 is a connection diagram of the syndrome generating PE shown in FIG. 9.
Figure 11:
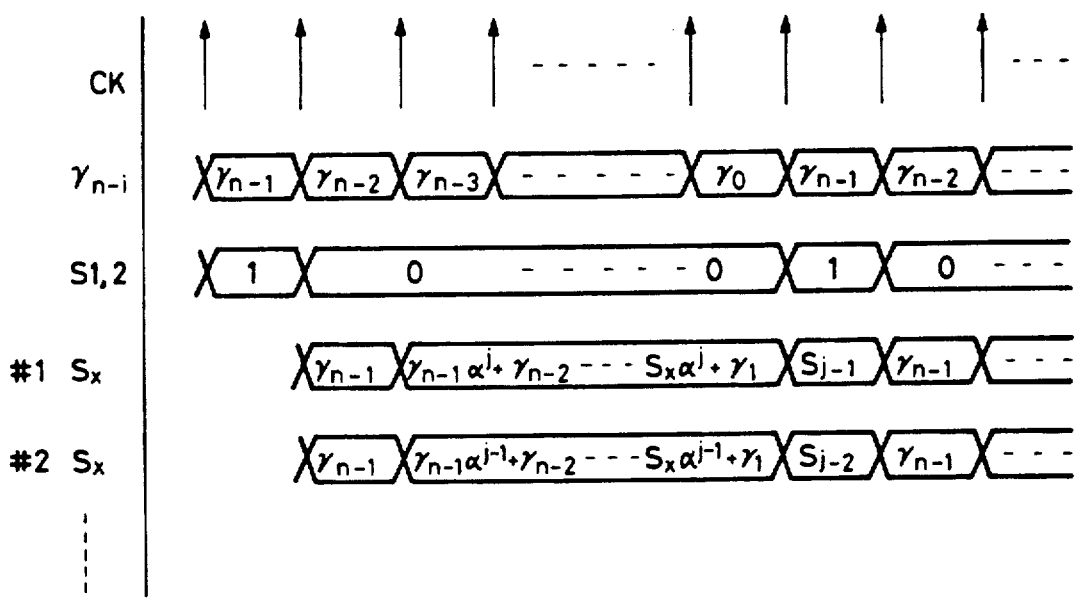
FIG. 11 is a timing chart illustrating the operation of the syndrome generating PE shown in FIG. 10.

It is possible to simultaneously generate all the coefficients of the syndrome polynomial, by connecting the PEs in a manner shown in FIG. 10. In this case, however, it is to be noted that the communication distance for the receive symbol n−i varies according to the PE. The timing is shown in FIG. 11.

Figure 12:
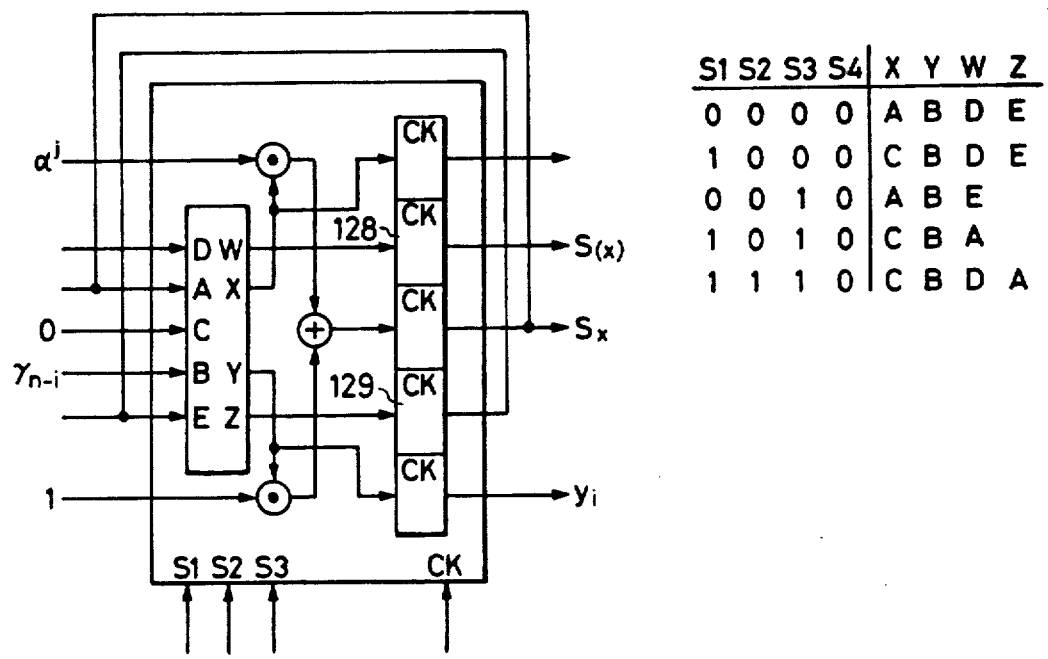
FIG. 12 is an illustration of the syndrome generating PE making use of the construction shown in FIG. 5.
Figure 13:
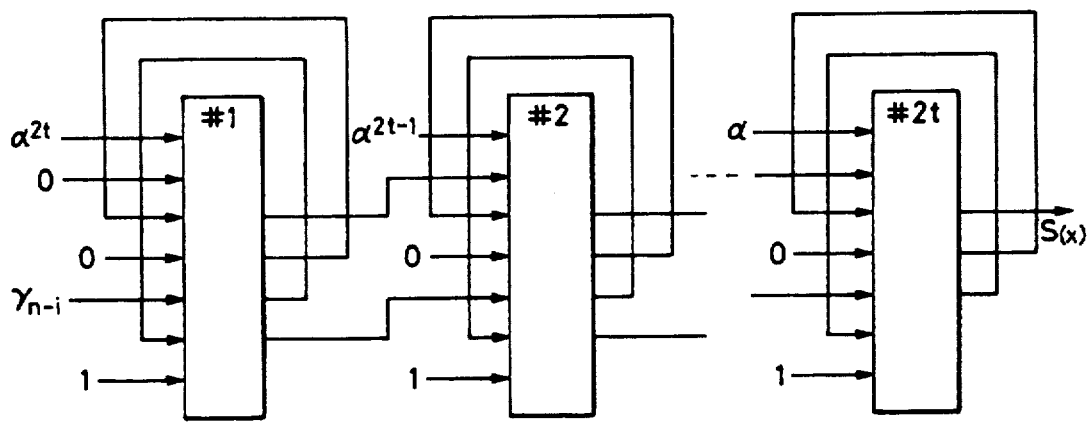
FIG. 13 is a connection diagram of the PE shown in FIG. 12.
Figure 14:
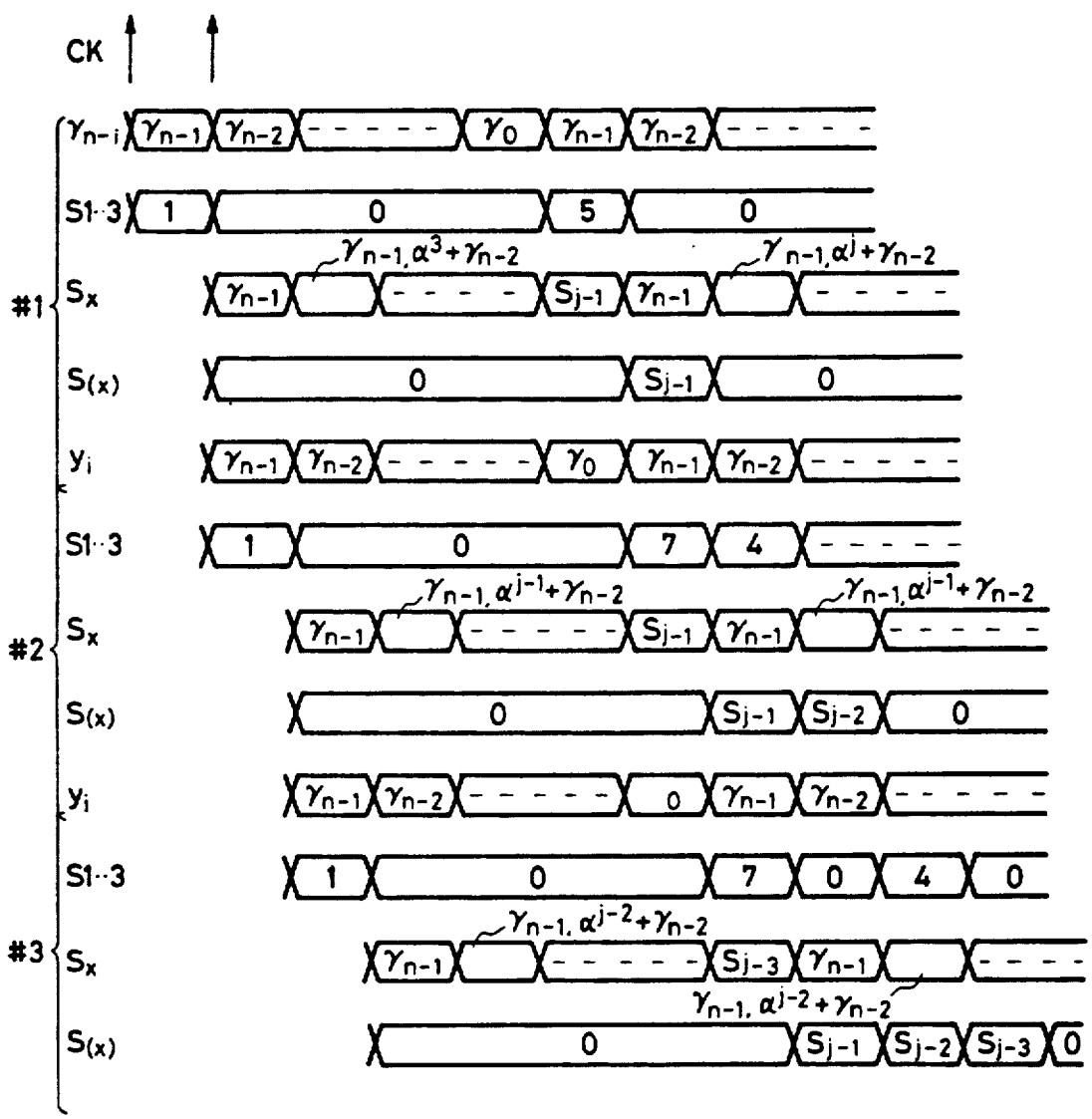
FIG. 14 is a timing chart showing the operation of the syndrome generating PE shown in FIG. 13.

The PEs of the type shown in FIG. 5 are arranged as shown in FIG. 12 and connected in a manner shown in FIG. 13, so that the coefficients of the syndrome polynomial are successively output from the last PE. A signal is input in a manner shown in FIG. 14 to the circuit shown in FIG. 13. In the first PE, the selector output W normally selects the D input. When the syndrome $S_{2t-1}$ is generated, the selection signals are set as S1 . . . 4=1010 so that the A input is output from W, whereby the syndrome $S_{2t-2}$ is input to the register 128 and is output from S(x). When the syndrome $S_{26-2}$ is generated in the next PE, the output $S_{2t-1}$ of the preceding PE is being received through the D input, so that the A input is output to Z (S1 . . . 4=1110) in order to offset the syndrome $S_{2t-2}$ by one clock, and the thus offset syndrome $S_{2t-2}$ is picked up by the register 129. The output is then delivered to W by the next clock (S1 . . . 4=0010) so that the syndrome $S_{2t-2}$ is input to the register 128, whereby the syndrome $S^{2t-2}$ is output from S(x), following the syndrome $S_{2t-1}$.

As to subsequent PEs, the time interval from the generation of the syndrome $S_{i-1}$ till the output to S(x) is offset in amounts corresponding to one clock. Thus, the timing for attaining the condition of S1 . . . 4=0010 is successively offset in amounts corresponding to one clock, whereby the coefficients $S_{2t-1}$, . . . , $S_0$ of the syndrome polynomial are consecutively output from S(x) of the last PE.

The number of PEs required by each of the arrangements shown in FIGS. 7, 10 and 13 is 2t, and the processing speed is 10 to 20 Mwps (word/sec).

GCD Generating Section

Generation of Error Position Polynomial and Error Value Polynomial

The algorithms for deriving the error position polynomial $\sigma(x)$ and the error value polynomial $\omega(x)$ can be attributed to an expanded GCD question.

More specifically, representing $x^{2t}$ by a polynomial $A_0$ and the syndrome polynomial S(x) by a polynomial $B_0$, computation is conducted for determining (deg$A_0$=2t, deg$B_0$=2t−1), GCD[$A_0$, $B_0$]. In the course of this computation. polynomials D and W which meet the following conditions are obtained.

$$\deg W < t, \deg D \leq t$$

$$C*A_0 D*B_0 = W$$

The thus obtained D and W represent, respectively, the error position polynomial $\sigma(x)$ and the error value polynomial $\omega(x)$. It is known that such polynomials $\sigma(x)$ and $\omega(x)$ can be definitely determined except for the difference in the constant coefficient The computation therefore is conducted as follows. Polynomials A, B, U, V, L and M are defined in relation to the polynomials $A_0$ and $B_0$ to meet the following conditions.

$$A = U*A_0 + L*B_0$$

$$B = V*A_0 + M*B_0$$

Setting the initial values as U=M=1, L=V=0, (A −$A_0$, B=$B_0$), the cyclic step shown in FIG. 15 is executed and, when a condition of degA (or degB)<t is met, the polynomial A(or B) are determined as $\omega(x)$ and L(M) is determined as $\sigma(x)$, respectively.

In the method shown in FIG. 15, the polynomials A and B are multiplied in a staggered manner with the coefficient $\alpha$ of the greatest degree of the polynomial B and the coefficient $\beta$ of the greatest degree of the polynomial B, whereby the division of the GP in the cyclic steps is omitted. This does not cause any undesirable effect on the polynomials $\sigma(x)$ and $\omega(x)$.

A problem is encountered, however, in that the length of the polynomial changes during processing. For instance, in the case of the first process, the number of degrees of polynomials A and B, i.e., the lengths of these polynomials, are changed according to the difference between degA and degB. In order to adapt the function of the PE to such a change in the length of the polynomial, each PE is required to have highly complicated construction. In such a case, the level of the computing load varies according to the PEs, with the result that the capacities of the PEs are used inefficiently. In the Kung's systoric algorithm for solving the expanded GCD question, there are two groups of inputs of polynomials to each PE: namely, the respective coefficient data and the difference in degrees of the polynomials A and B. In this embodiment, however, only the coefficient data of polynomials are input to the PEs, while the difference in the degree is generated by another circuit in the following three modes, so as to be used as PE selector signals.

1) Reduce A: =degA, degB≧t and degA≧degB
2) Reduce B: =degA, degB≧t and dega<degB
3) Nop: =degA<t or degB<t In order to make uniform the computing load on all the PEs, the amount of change in the degree in the polynomial A or B in each processing cycle is limited to one degree. In such a case, the term of the degA, degB of the polynomials A, B are not always non-zero. If the term of the degA (or degB) of the polynomial A(or B) is zero, the polynomial A (or B) is shifted to the higher degree side.

Figure 16A:
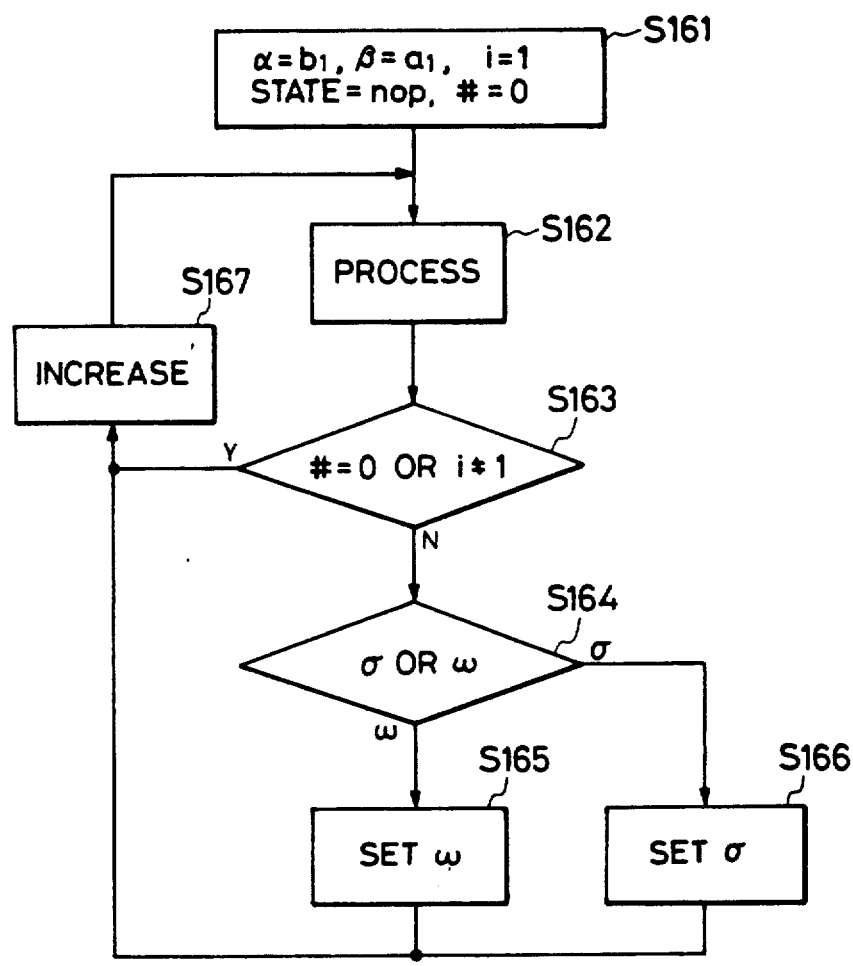

The algorithm shown in FIG. 15 can be realized by a construction as shown in FIG. 15. In FIG. 15, the algorithm for determining the polynomial A(or B) and that for determining the polynomial L(or M) are materially the same except for the processing of degrees. In FIG. 16, therefore, a single processing unit is shown as the means for executing both algorithms. In an actual circuit, however, independent processing units are used: one for determination of the polynomial A(or B) and one for L(M), or, alternatively, a single unit is used to operate twice, i.e., once for determination of the polynomial A(or B) and once for L(M). Although a description will be made as to a signal processing, it will be obvious to those skilled in the art that the processing speed be reduced by one half when the processing unit operates twice. It will also be understood that the number of the PEs are doubled when a pair of independent processing units are used.

Figure 31:
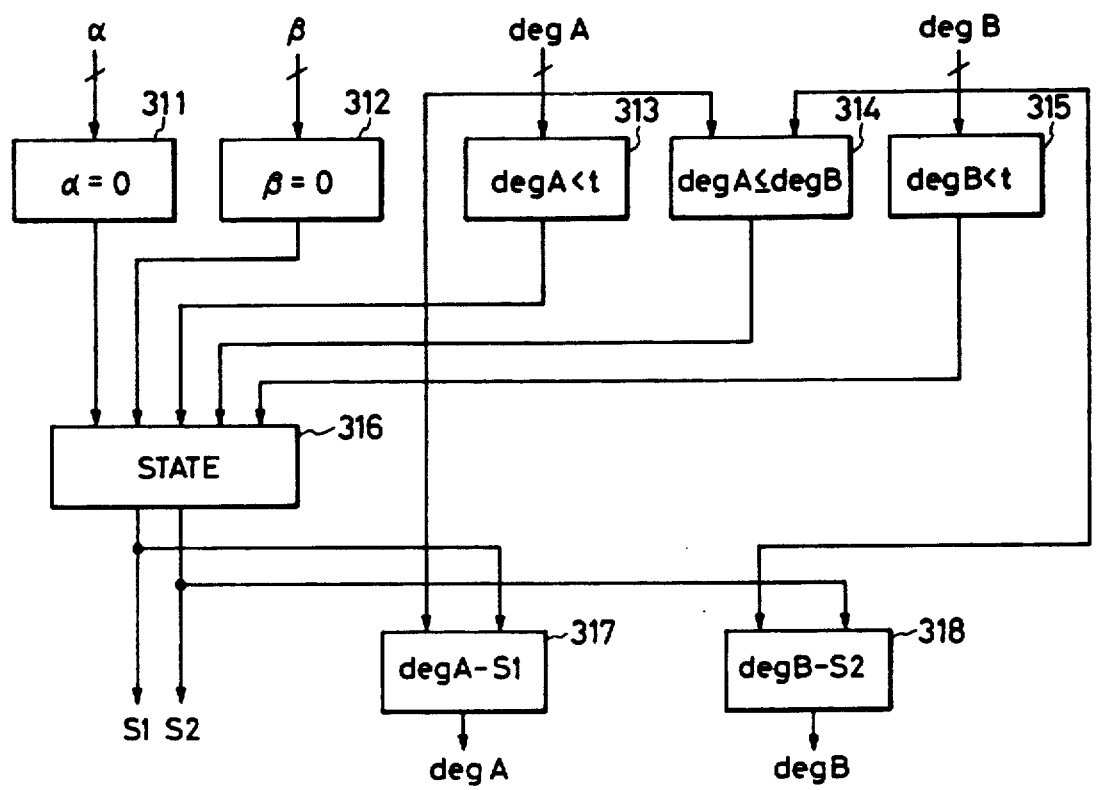
FIG. 31 is a block diagram of a state generating circuit.

The main portion of the computation for generating GCD is the process of Step S 162 which is expressed as "Process" in FIG. 16. This process can be realized by using PEs. Steps S 165 and S 166 expressed by Set and Step S 161 for setting the state are executed by an external circuit, because these processes are extraordinary processes. The external circuit can have a compact design are shown in FIG. 31, composed of 0 detection circuits 311, 312 (constituted by OR circuits) for $\alpha$ and $\beta$, a circuit 316 (composed of ROM, for example) for determining the state from the results of comparison of degree numbers conducted by comparator circuits 313, 314 and 315, and subtracting devices 317, 318 (constituted by adders) for subtracting degree numbers.

Figure 17:
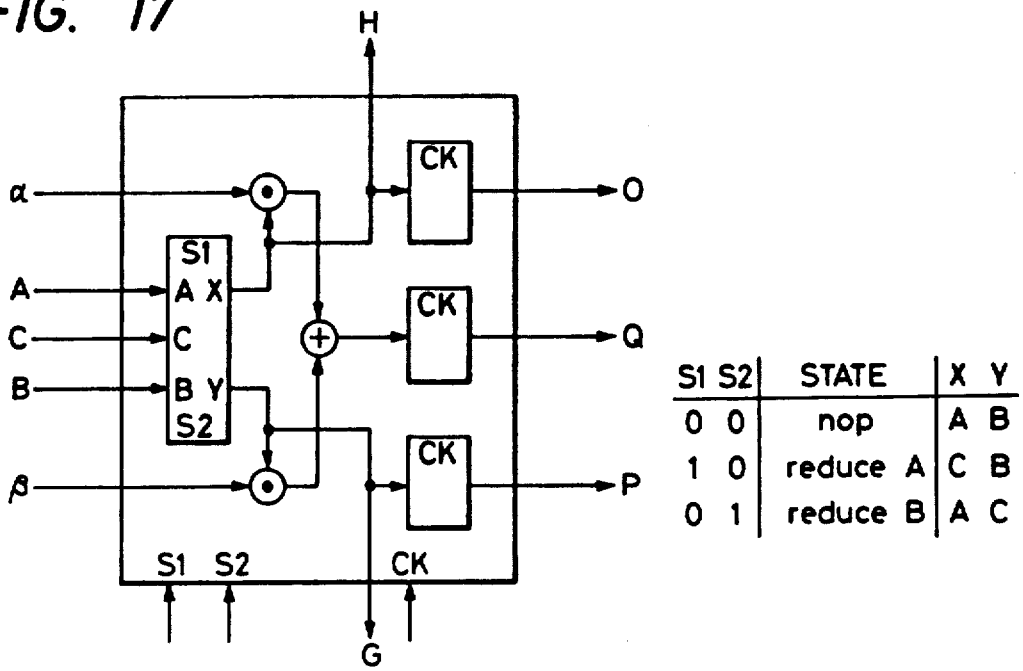
FIG. 17 is an illustration of the GCD generating PE making use of the construction shown in FIG. 1.
Figure 18:
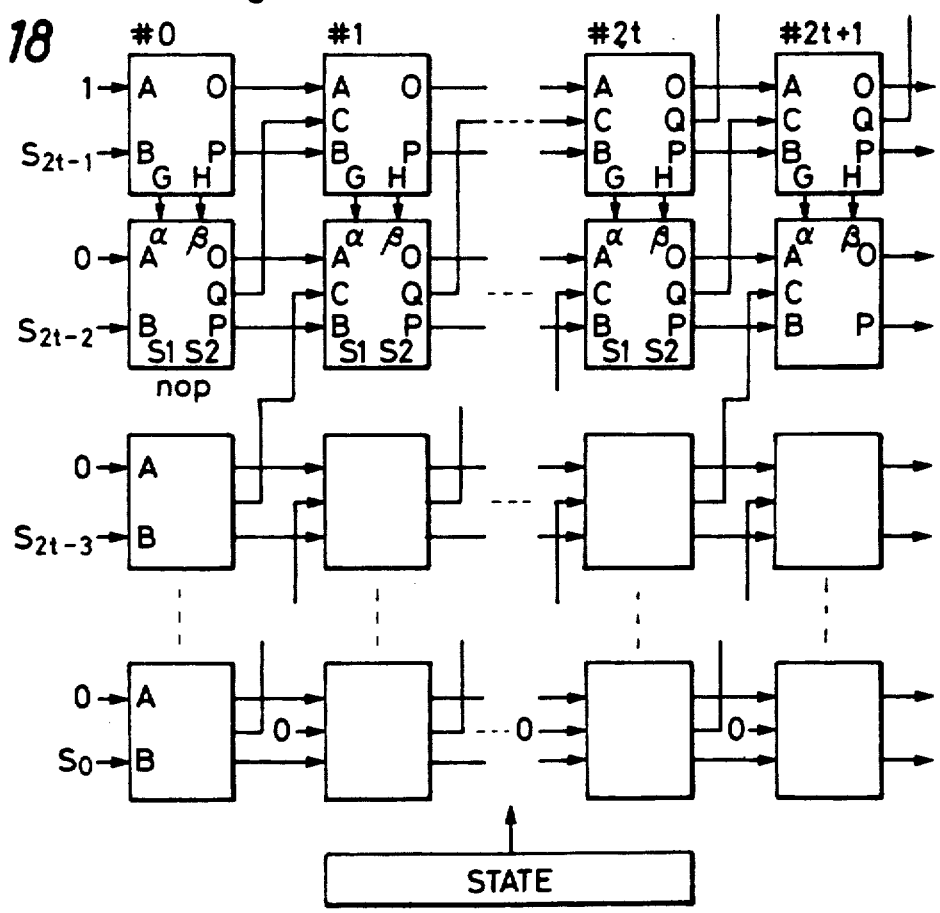
FIG. 18 is a connection diagram of the GCD generating PE shown in FIG. 17.
Figure 21:
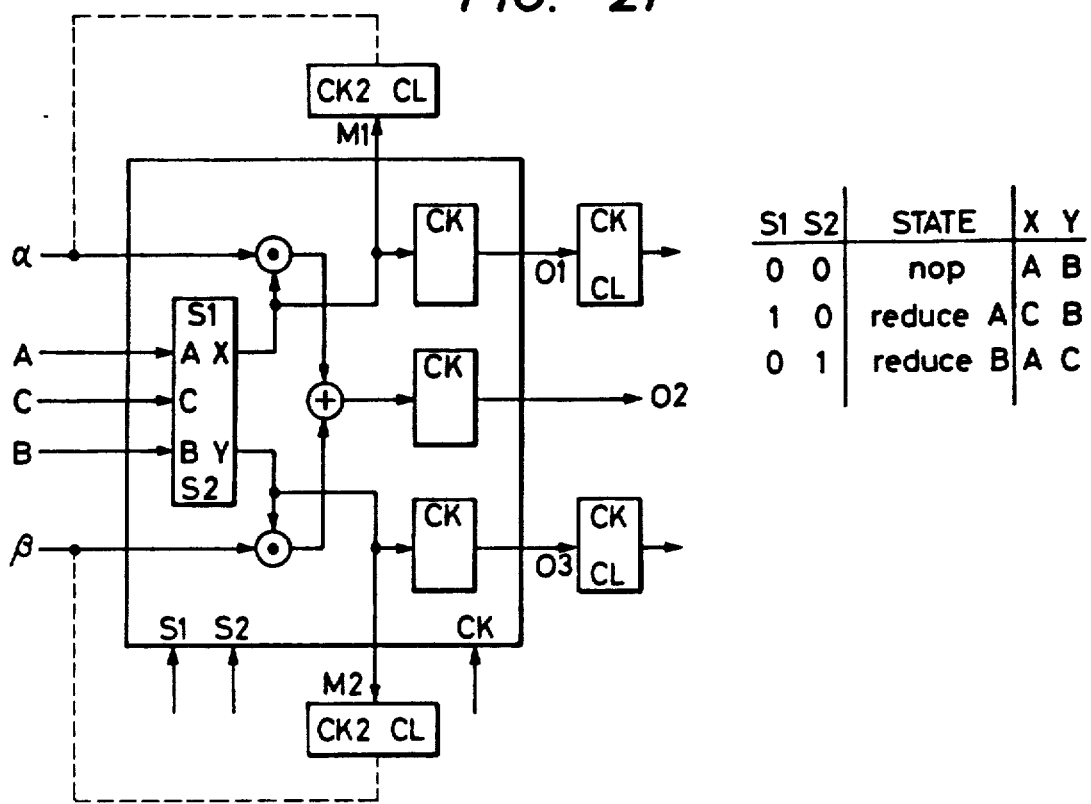
FIG. 21 is an illustration of another GCD generating PE making use of the construction shown in FIG. 1.

The "Process" shown in FIG. 16B includes input, selection and multiplication/addition which can conveniently correspond to the operation of a single PE. The state of the "State" can be changed in accordance with the selection signals S1 and S2, in a manner as shown in Table 4 of FIG. 17. When a single process is allocated to a single PE, the PEs are connected in a manner shown in FIG. 18. In FIG. 18, the PEs of the uppermost stage are intended for setting $\alpha$ and $\beta$. The values $\alpha$ and $\beta$ determined by each PE are commonly used for the PEs of the same column. The states of the "State" also are common in the respective columns.

This system necessitates $2t*(2t+2)$ PEs, and the processing speed is 10-20Mlps(length/sec)=n*(10-20)Mwps (word/sec)=n*(80-160)Mbps (bit/sec), where n represents the code length.

Figure 22:
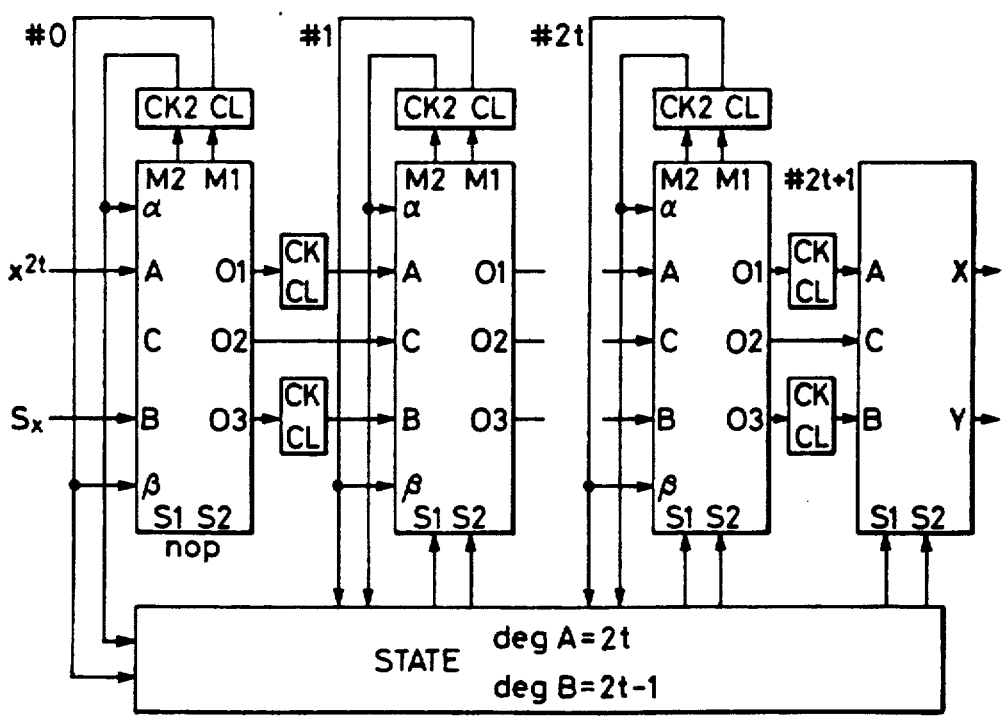
FIG. 22 is a connection diagram of the GCD generating PE shown in FIG. 21.

When the processing of the "Process" is conducted twice, i.e., when the process of each polynomial is allocated to one PE, the PEs are connected as shown in FIG. 22. Referring to FIG. 22, a register is connected to the outputs of the registers 5 and 7, in order to realize $a_i$, $b_i$ and $C_{i-1}$. By this arrangement, it is possible to conduct the input of coefficient data to the next PE for all the polynomials A, B and C, with the terms of the corresponding degrees set aside, from the terms of the highest degrees to the lowest. For the purpose of setting of $\alpha$ and $\beta$, it is necessary to externally provide a register controlled by CK2 and CL. The input polynomials A, B and C are selected according to State so as to obtain X and Y output polynomials, and the coefficients of the highest degrees of these polynomials are set as $\alpha$ and $\beta$ in a staggered manner, and outputs derived from H and C are latched by CK2 and the values for the respective PEs are stored in the register. However, during inputting of the maximum degrees of the polynomials A, B and C, the values $\alpha$ and $\beta$ are indefinite so that 0 is output by the CL. This is because the result of the processing of the highest degree is 0. In this case, the number of the required PEs is $2t+2$. and the processing speed is (10-20)/2tMlps because 2t times of processing operation is allocated to one PE.

Figure 23A:
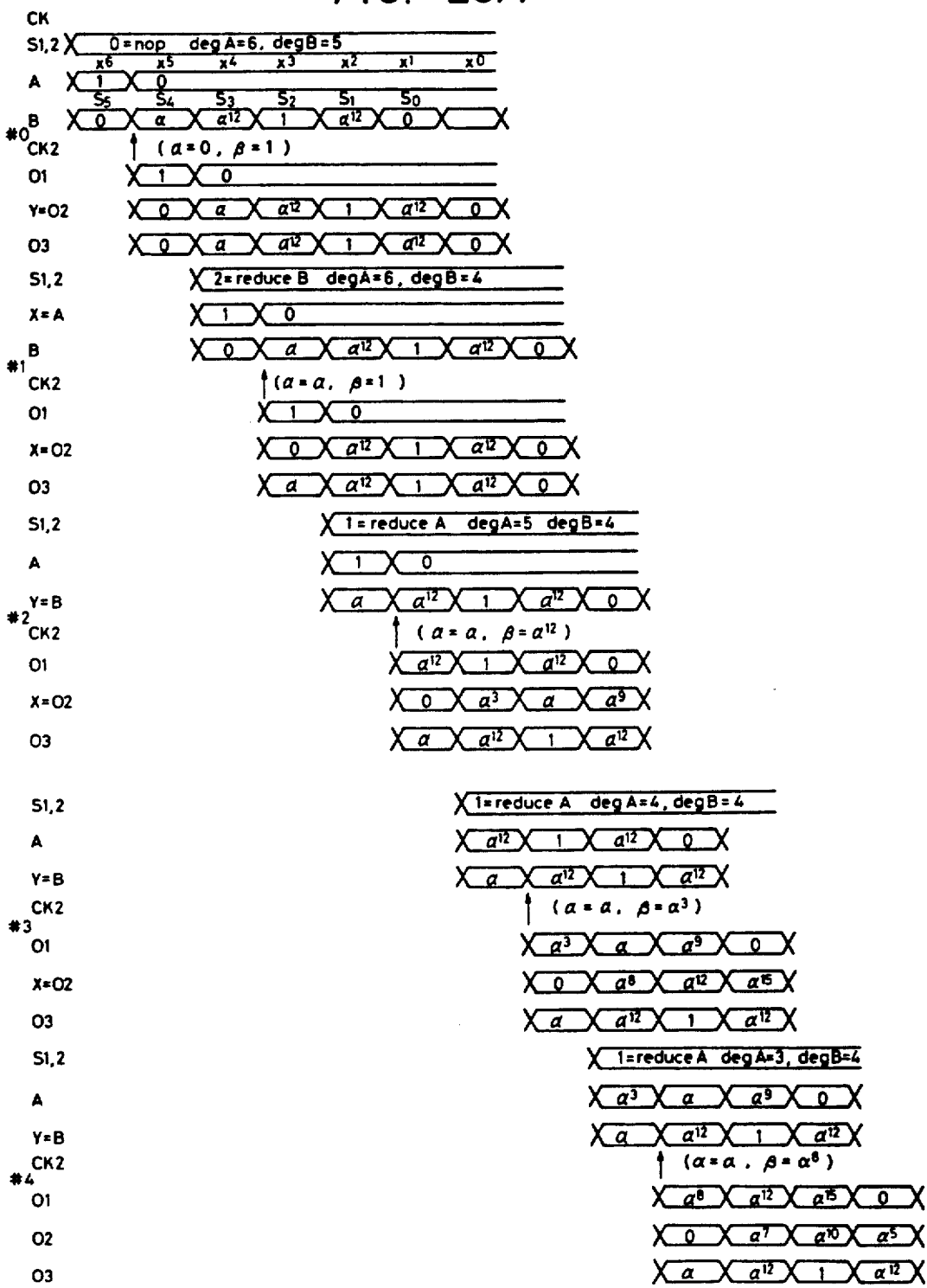

FIGS. 19 and 23 shown, respectively, the flow of signals which are used in determining the polynomial A (B) when the connections as shown in FIGS. 18 and 22 are used in connection with the arrangement shown in FIG. 25. Similarly, flow of signals for determining the polynomial L(M) are shown in FIGS. 20 and 24. The values $\alpha$ and $\beta$ are determined when the processing of the polynomial A(B) is commenced and are preserved until the processing of the polynomial L(M).

Figure 26:
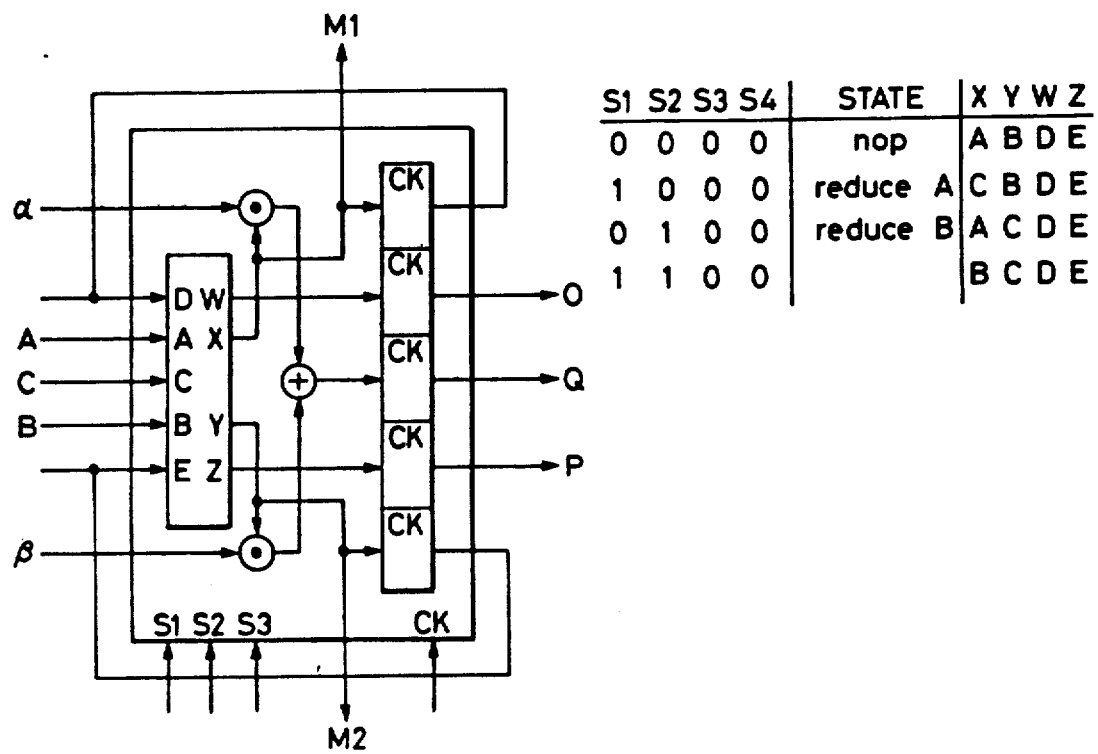
FIG. 26 is an illustration of the construction of a GCD generating PE making use of the construction shown in FIG. 5.
Figure 27:
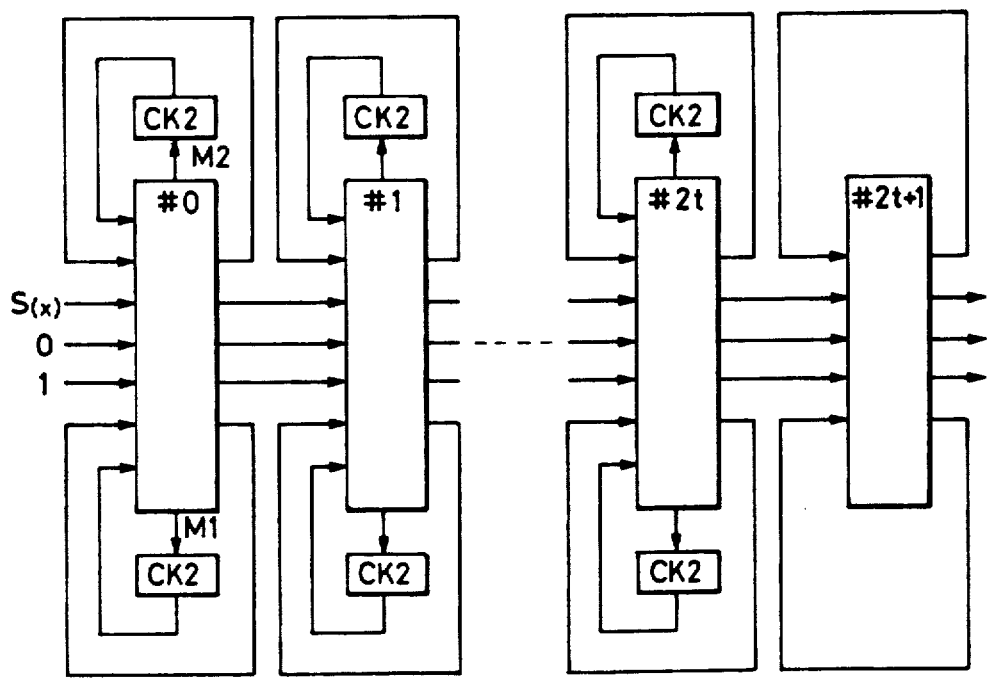
FIG. 27 is a connection diagram of the GCD generating PE shown in FIG. 26.

It is also possible to arrange the PEs of FIG. 5 in a manner shown in FIG. 26, and to connect the PEs as shown in FIG. 27. The connection as shown in FIG. 27 enables the connection of FIG. 22 to be parallel or singular which is the initially set condition for the communication path. The connection shown in FIG. 27 also can directly receive the syndrome S(x) of FIG. 13 and to output the error correction polynomial and the error value polynomial. The timing of this operation is the same as that of FIG. 23 and 24. In the case of the #0 PE, however, the input as shown in FIGS. 23 and 24 can be realized by adopting S1 ... 4=0000 only in the beginning of processing of the polynomial A(B) and thereafter, adopting S1 ... 4=0100, while adopting S1 ... 4=1100 only in the beginning of processing of the polynomial L(M) and thereafter S1 ... 4=0100.

When each cycle of the process is allocated to one PE, a plurality of PEs of the type shown in FIG. 5 are arranged as shown in FIG. 28 and connected in a manner shown in FIG. 29. In this case, the whole system requires 2t units of PE, and the processing speed is $(10-20)/(2t+2)$Mlps. The timing of this operation is the same as that shown in FIGS. 19 and 20.

Error Position and Error Value Generating Section

In Step 3), a computation is necessary for determining the values of three polynomials obtained in Step 2), i.e., the error position polynomial $\sigma(x)$, error value polynomial $\omega(x)$ and the differential $\sigma'_i(x)$ of $\sigma(x)$, by successively inputting to these polynomials the unknowns $\alpha^{-i}$ (i=n-1, ..., 1,0) of the GF($2^m$) which defines the RS code. Practically, the computation can be executed simply by substituting the variances of the polynomials so as to determine the values of the polynomials. Thus, a cyclic algorithm similar to that used in the syndrome computation can be used effectively. For instance, the computation of a $(t-1)$ degree polynomial f(x) can be developed as follows.

$$f(x) = f_{t-1} * x^{t-1} + f_{t-2} * x^{t-2} \ldots + f_1 * x + f_0$$
$$= (\ldots((f_{t-1} * x + f_{t-2}) * + f_{t-3}) * x + \ldots + f_1) * x + f_0)$$

Thus, the operation can be reduced as follows, as in the case of the syndrome computation.

$Z_0 = 0$
$Z_j = Z_{j-1} * x + f_{t-j}$ (j=1, ..., t)
$f(x) = Z_t$

In contrast to the syndrome computation in which each PE has a value of x to be substituted and the coefficients are input to the respective PEs, the error position and error value generating computation now described makes use of known coefficients $f_{t-j}$ (j=1, ..., t) and x is input to each PE.

Figure 32:
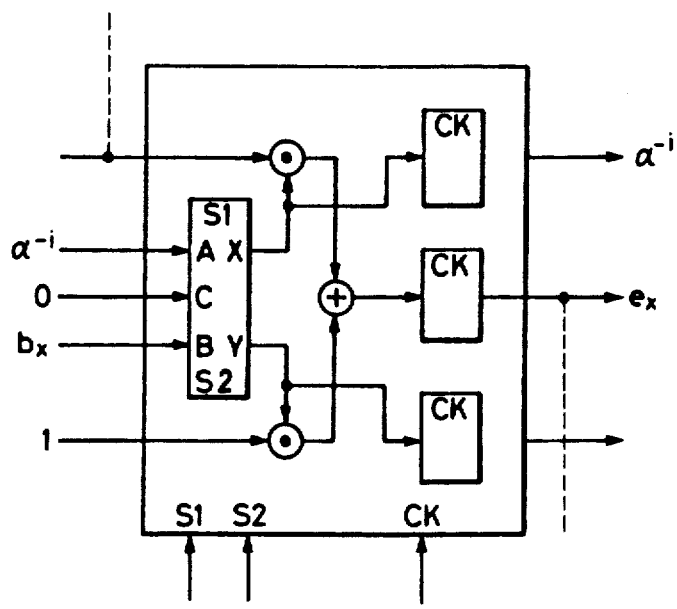
FIG. 32 is an illustration of the construction of an error evaluation PE making use of the construction shown in FIG. 1.
Figure 33:
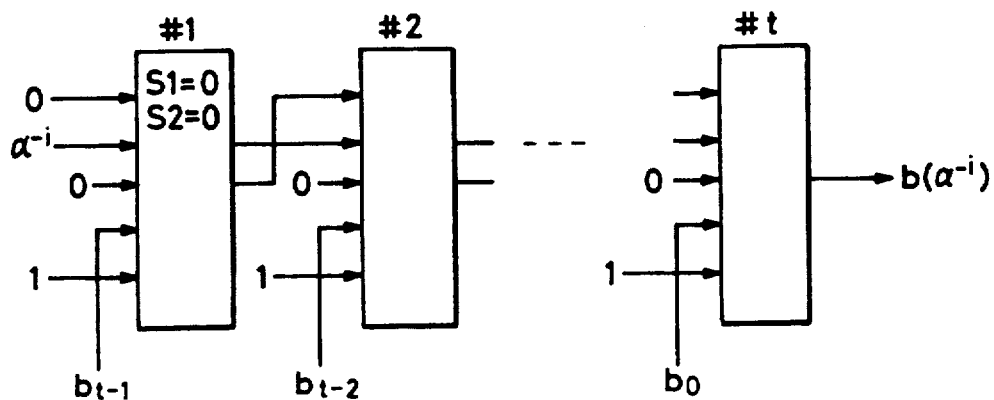
FIG. 33 is a connection diagram of the error evaluation PE shown in FIG. 32.

Thus, a plurality of PEs of the type shown in FIG. 1 are arranged as shown in FIG. 32 and are connected as shown in FIG. 33. Referring to FIG. 33, the selection signal is set as $S1, 2 = 00$ and a coefficient $f_{t-j}$ is set in the B input. In this state, the values of $\alpha^{-i}$ are successively input to the A input, whereby a series of values $f(\alpha^{-i})$ are successively output from the last PE. Each PE simultaneously receives both $Z_{j-1}$ (e$_x$ output of preceding PE) and $\alpha^{-i}$ ($\alpha^{-i}$ output of the preceding PE), and outputs $Z_j = Z_{j-1} * x + f_{t-j}$ and $\alpha^{-i}$.

By allocating this process to the respective PEs from j=1 to j=t, whereby f(x) is computed.

Figure 34:
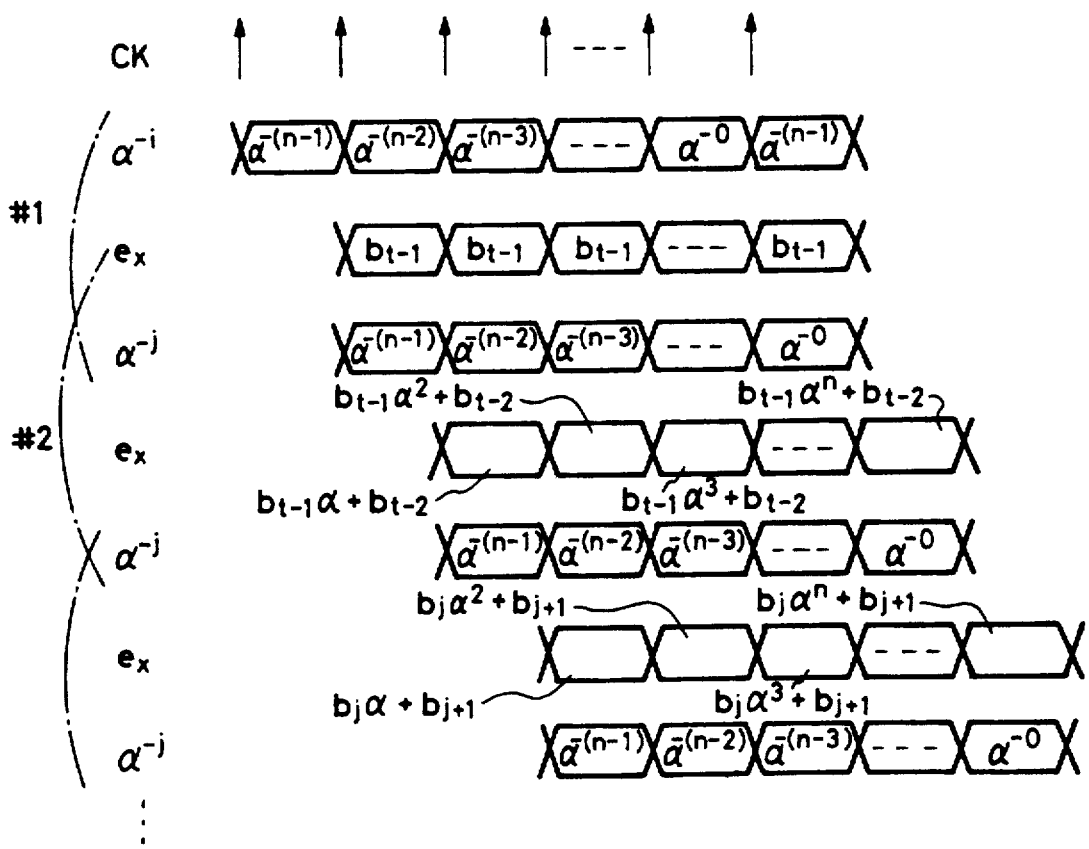
FIG. 34 is a timing charge illustrating the operation of the error evaluation PE shown in FIG. 33.
Figure 35:
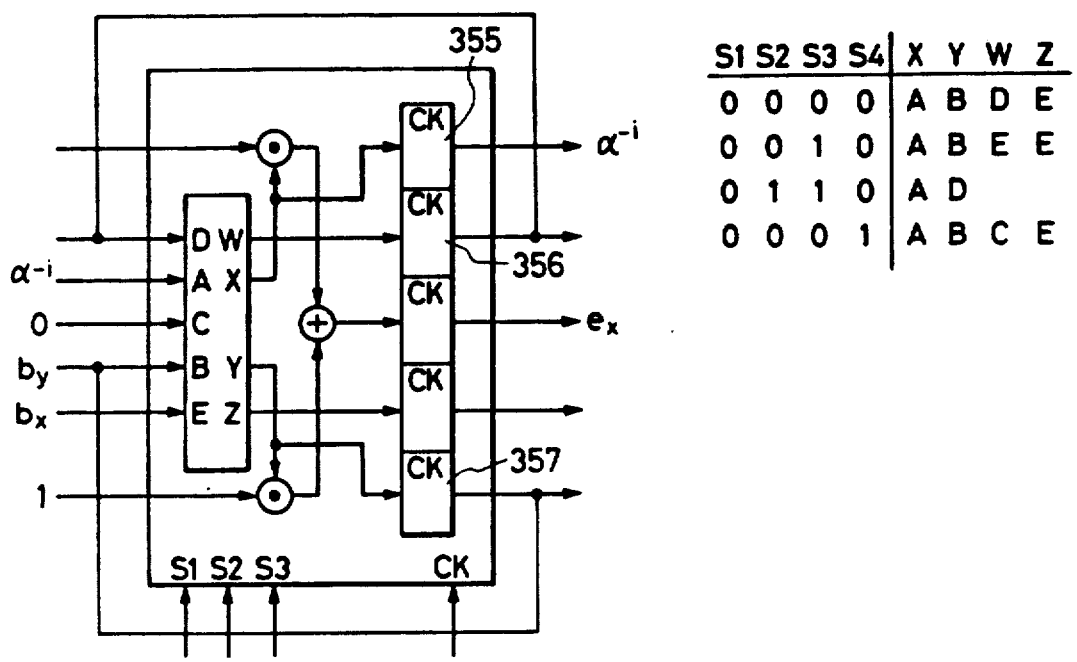
FIG. 35 is an illustration of an error evaluation PE making use of the construction shown in FIG. 5.
Figure 36:
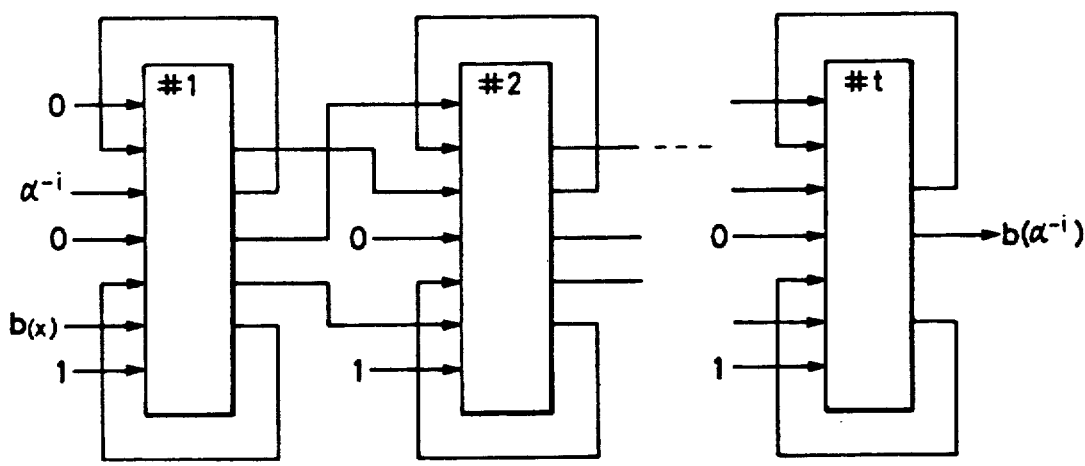
FIG. 36 is a connection diagram of the error evaluation PE shown in FIG. 35.
Figure 37:
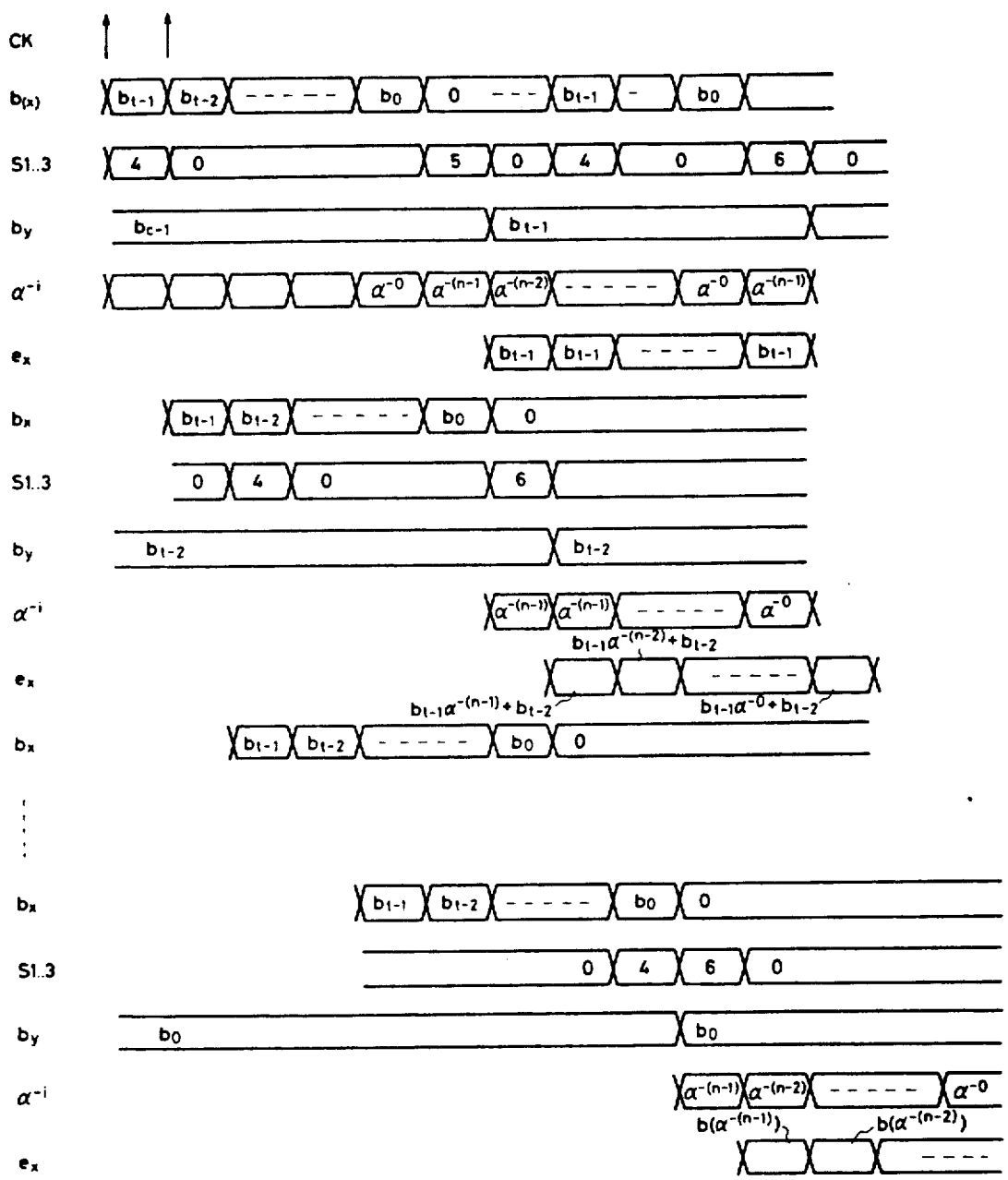
FIG. 37 is a timing chart showing the operation of the error evaluation PE shown in FIG. 36.

A plurality of PEs of the type shown in FIG. 5 are arranged as shown in FIG. 35 and connected as shown in FIG. 36. FIG. 37 shows the flow of signals in this connection shown in FIG. 37. The setting of the coefficient is conducted by successively inputting $f_{t-j}$ (j=1, ..., t) into the E input, and the selection signal is set as S1 ... 4=0010 when $f_{t-j}$ of the value to be set in the respective PEs are input. Consequently, $f_{t-j}$ is output from the W and Z outputs and the thus output $f_{t-j}$ is input to the register 356. Thereafter, the selection signal is set as S1 ... 4=0000, so that the successive values of $f_{t-j}$ are accumulated in the register 356. When the next received system row is processed, the selection signal is set as S1 ... 4=0110, so that the values $f_{t-j}$ accumulated in the register 356 are output from the Y output and re input to the register 357. Thereafter, the selection signal is set as S1 ... 4=0000 so that the Y output continuously outputs $f_{t-j}$, whereby $f_{t-j}$ is set in each PE. Meanwhile, the X output selects the A input so that $\alpha^{-i}$ (i=n-1, ..., 0) are output consecutively. This output is successively transferred to the next PE from the register 355 after a delay by an amount corresponding to one clock. The described operation is conducted for each receiving system row, so that the computation of $f(\alpha^{-i})$ shown in FIG. 34 is conducted. By connecting this function to the circuits shown in FIGS. 13 and 27, Steps 1 to 3 can be realized without necessitating an interface circuit.

The circuits shown in FIGS. 34 and 36 are necessarily arranged in three sets: one for computation of $\omega(x)$, one for computation of $\sigma(x)$ and one for computation of $\sigma'(x)$. Each set requires t units of PE so that 3t units of PE are used in total. The processing speed is 10-20 Mwps, because $\alpha^{-i}$ (i=n-1, ..., 0) are successively processed for each of the words.

A description will be made hereinunder as to the differential $\sigma'(x)$ of $\sigma(x)$.

It is assumed that f(x) is expressed as follows.

$$f(x) = f_{t-1} * x^{t-1} + f_{t-2} * x^{t-2} + \ldots + f_1 * x + f_0$$

In this case, the differential f'(x) of f(x) is represented as follows.

$$f'(x) = (t-1)*f_{t-1}*x^{t-2} + (t-2)*f_{t-2}*x^{t-2} + \ldots + f_1$$

When $(t-i)$ is an even number, the condition of $(t-i)=0$ is essentially met because of the nature of the Galois field. Consequently, alternating coefficients of the differential f'(x) is zero. Therefore, by setting the selection signal as S1 ... 4=0001 in place of S1 ... 0010 when setting the zero coefficient, the input 0 from the C input is output from the W output and is set in the register 8.

Erasion Position Polynomial Generation Section

It is assumed here that s pieces of erasure error are taking place in j1, j2, ..., js and r pieces of error other than erasure error are in positions k1, k2, ..., kr.

It is assumed here that the following condition is met.

$$2r + s + 1 \leq d \quad (d: \text{minimum distance})$$

The erasure position polynomial $\lambda(x)$ is expressed as follows:

$$\lambda(x) = (1 - Y_1 * x)*(1 - Y_2 * x) \ldots (1 - Y_s * x)$$

where,
$Y_i = \alpha^{ji}$ (i=1, 2, ..., s)
The following formula is derived from the erasure position polynomial $\lambda(x)$.

$$S(x) * \lambda(x) * \sigma(x) = \omega(x) \mod x^{d-1}$$

$$\omega(x) = \sum_{i=1}^{r} e_i \prod_{k \neq i} (1 - L_k * x) * \lambda(x) +$$

$$\sum_{i=1}^{s} E_i \prod_{k \neq i} (1 - Y_k * x) * \sigma(x)$$

where, $\sigma(x)$ is an error position polynomial, while $\omega(x)$ is the following polynomial the highest degree of which is not higher than $r + s - 1$. $E_i$ represents the value of the error at the position ji, while $L_k$ is expressed by $\alpha^{ki}$ (i=1, ..., r). The symbol $e_i$ represents the value of the error at the position $k_i$.

For the purpose of determining $\sigma(x)$ and $\omega(x)$ in accordance with Euclidean division method, the syndrome polynomial $S(x)$ in the algorithms shown in FIGS. 15 and 16 is substituted by $S(x)*\lambda(x)$, while substituting degA$<$t (degB$<$t) with degA$<$t+s (degB$<$t+s).

In order to effect correction of erasure error, $S(x)*\lambda(x)$ is generated by means of PE. The substitution by degA(B)$<$t+s is conducted by the control section.

The polynomial $\lambda(x)$ is reduced as follows for the purpose of computation.

$Z_0 = 1$ $$Z_i = (1 - Y_i * x) * Z_{i-1}$$
$$= Y_i * Z_{i-1} * x + Z_{i-1} (i = 1, \ldots, s)$$

$\lambda(x) = Z$

The practical computation of the polynomial $\lambda(x)$ therefore is carried out by executing $Z_i = Y_i * Z_{i-1} * x + Z_{i-1}$.

Figure 42:
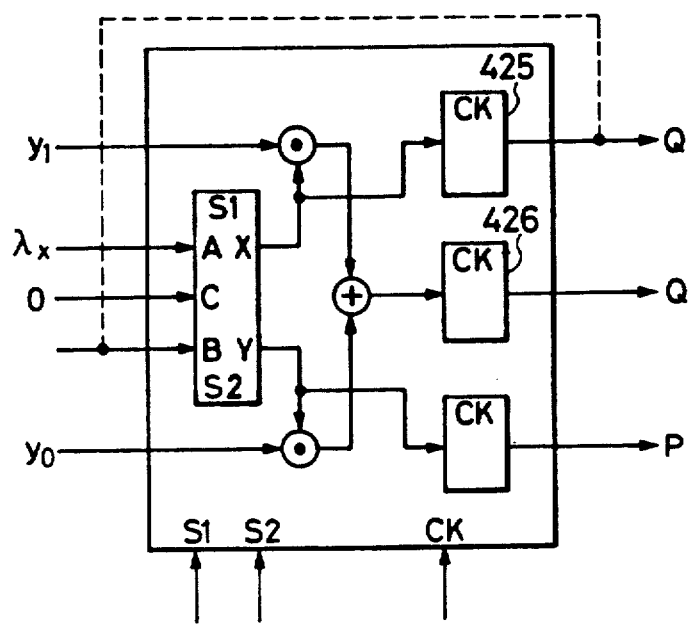
FIG. 42 is an illustration of the construction of an erasure position polynomial generating PE making use of the construction shown in FIG. 1.
Figure 43:
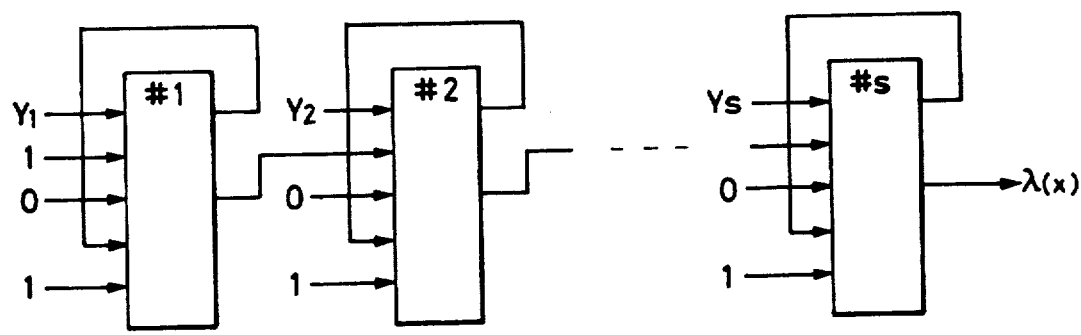
FIG. 43 is a connection diagram of the erasure position polynomial generating PE shown in FIG. 42.
Figure 44:
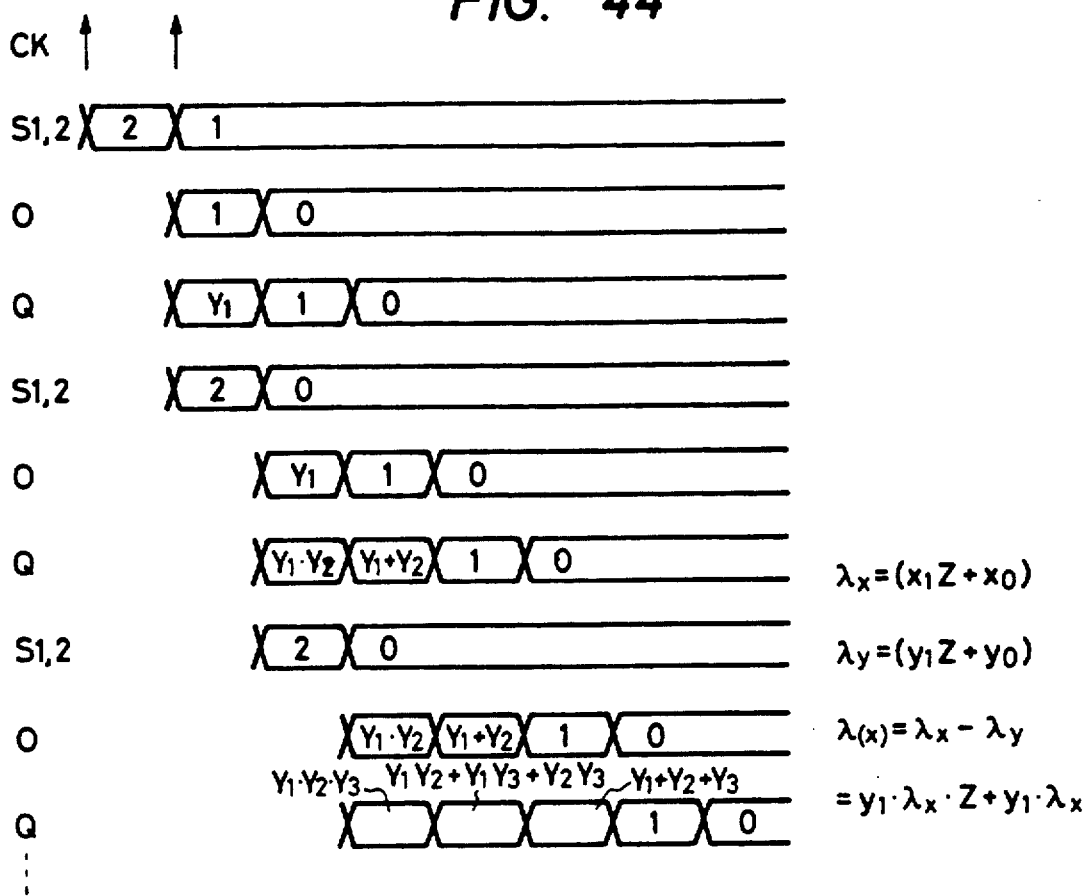
FIG. 44 is a timing chart showing the operation of the erasure position polynomial generating PE shown in FIG. 43.

The numbers of degrees merely show the sequence of the signals. This computation therefore can be conducted by multiplying the input of $Z_{i-1}$ with $Y_i$ and adding the product to $Z_{i-1}$ which has been delayed by one clock. For the purpose of generating the $\lambda(x)$, therefore, the PEs are arranged as shown in FIG. 42 and connected as shown in FIG. 43. The operation timing is shown in FIG. 44.

As the first step, the selection signal of the selector is set at S1, 2=01 for the #1 PE (i=1) so that the input $Z_0 = 1$ through the A input is output from X, while the input 0 from the input C is output to Y. The computation result $Y_1 * Z_0 = Y_1$ is input to the register 426, so that the X output $Z_0$ is delayed by one clock by the register 5 and is input to B. Thereafter, the selection signal is set as S1, 2=10, so that the C input 0 is output to X and the output $Z_0$ delayed by one clock is output to Y. Then, the computation result $Z_0 = 1$ is input to the register 426 in accordance with the next clock, whereby $Z_1 = (Y_1 * x + 1)$ are successively output from Q. With respect to the #2 PEs onward (i=2, ..., s), the selector selection signal is set at S1,2=01, and the coefficient of the greatest degree of the output $Z_{i-1}$ from Q is output to X as the A input, while the C input 0 is output to Y. Consequently, the term of the highest degree of $Y_i * Z_{i-1}$ is computed and input to the register 426. The signal $Z_{i-1}$ delayed by one clock is output from the register 425 and is fed back to the B input. By setting the section signal as S1,2=00 when the signal $Z_{i-1}$ is fed back to the B input, the results of computation of $Y_i * Z_{i-1} * x + z_{i-1}$ are successively output from the register 426 and input to the next PE. Consequently, the result of computation of the polynomial $\lambda(x)$ is output from the #s PE, starting from the term of the highest degree. Since the condition of $S \geq 2t$ is met, the number of the PEs required is 2t. By allocating 0 to all PEs $\cdot$S onward, the result of computation of polynomial $\lambda(x)$ is output from the #2t PE, starting from the term of the highest degree.

Figure 45:
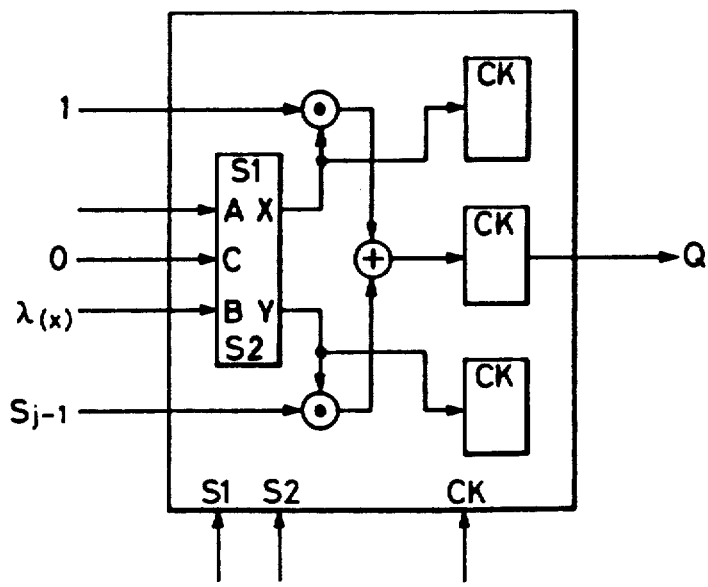
FIG. 45 is an illustration of a multiplying PE in accordance with the present invention.
Figure 46:
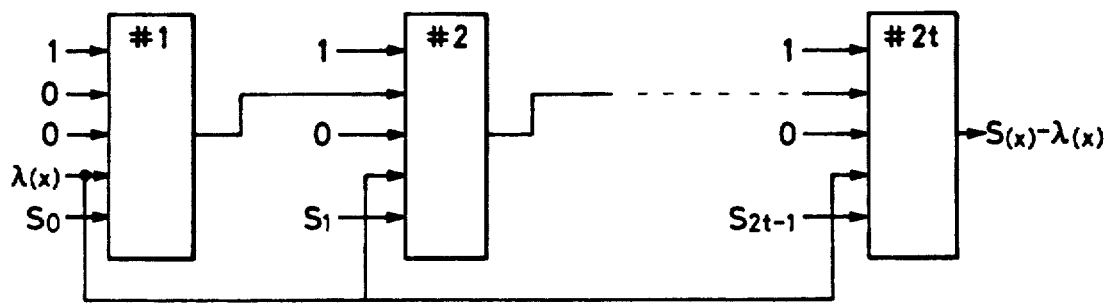
FIG. 46 is a connection diagram of the multiplying PE shown in FIG. 45.
Figure 47:
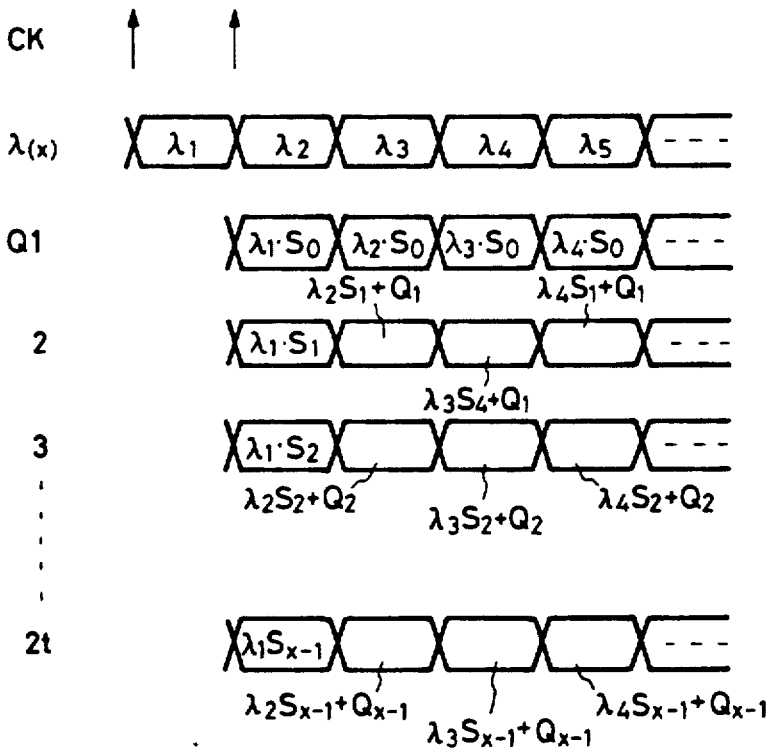
FIG. 47 is a timing chart showing the operation of the multiplying PE shown in FIG. 46.
Figure 48:
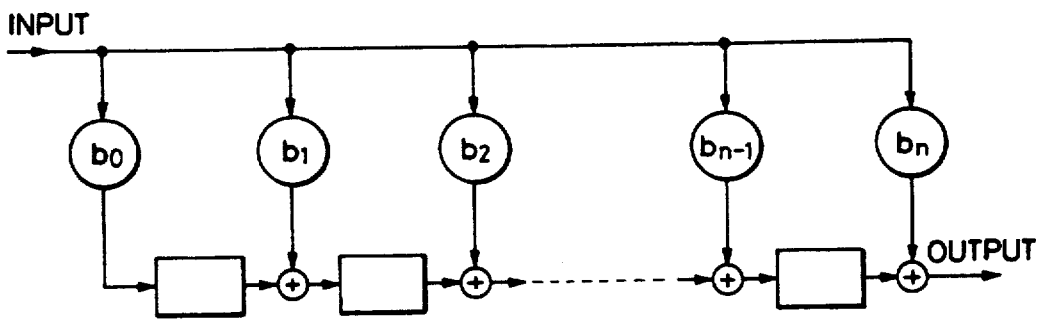
FIG. 48 is an illustration of the construction of a known multiplying circuit.

The generation of $\lambda(x)*S(x)$ becomes possible by using PEs in a manner shown in FIG. 45 and connecting them as shown in FIG. 46. The operation timing is shown in FIG. 47. The construction of the connection shown in FIG. 46 is identical to that of the multiplication circuit of the polynomial shown in FIG. 48. The select signal is in this case fixed at S1, 2=00. The operation of the multiplication circuit is not described here, because it is well known.

Figure 52:
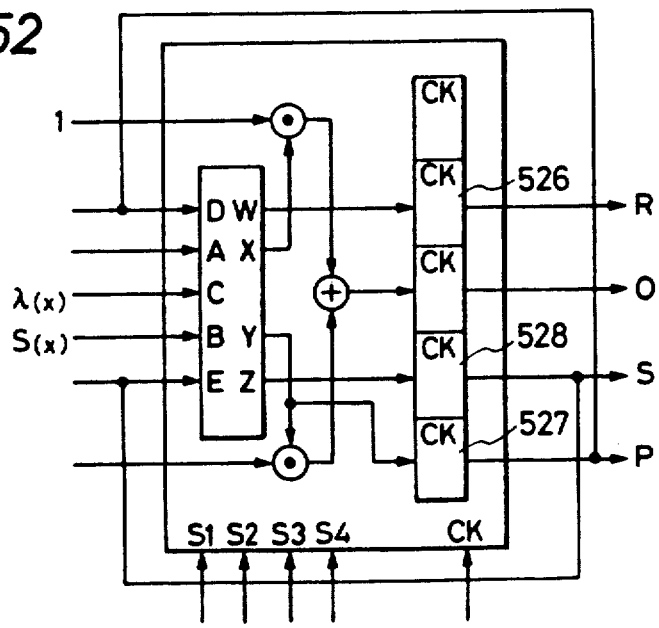
FIG. 52 is an illustration of the construction of a multiplying PE making use of the construction shown in FIG. 5.
Figure 53:
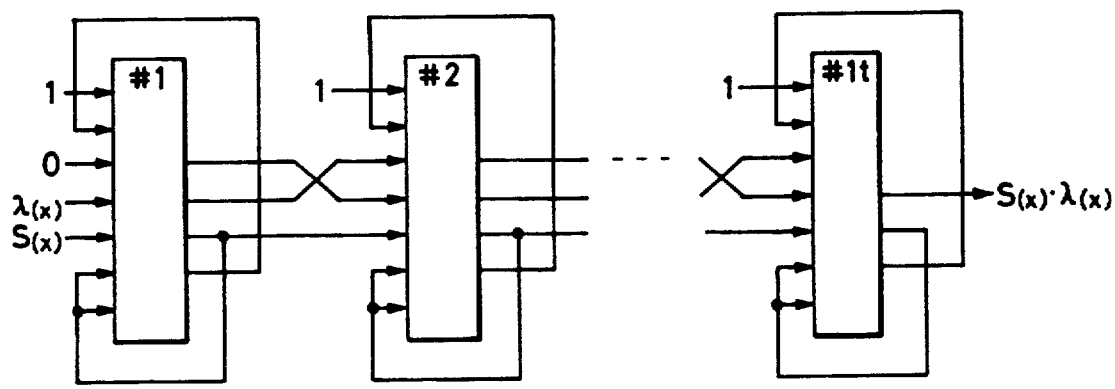
FIG. 53 is a connection diagram of the multiplying PE shown in FIG. 52.
Figure 54:
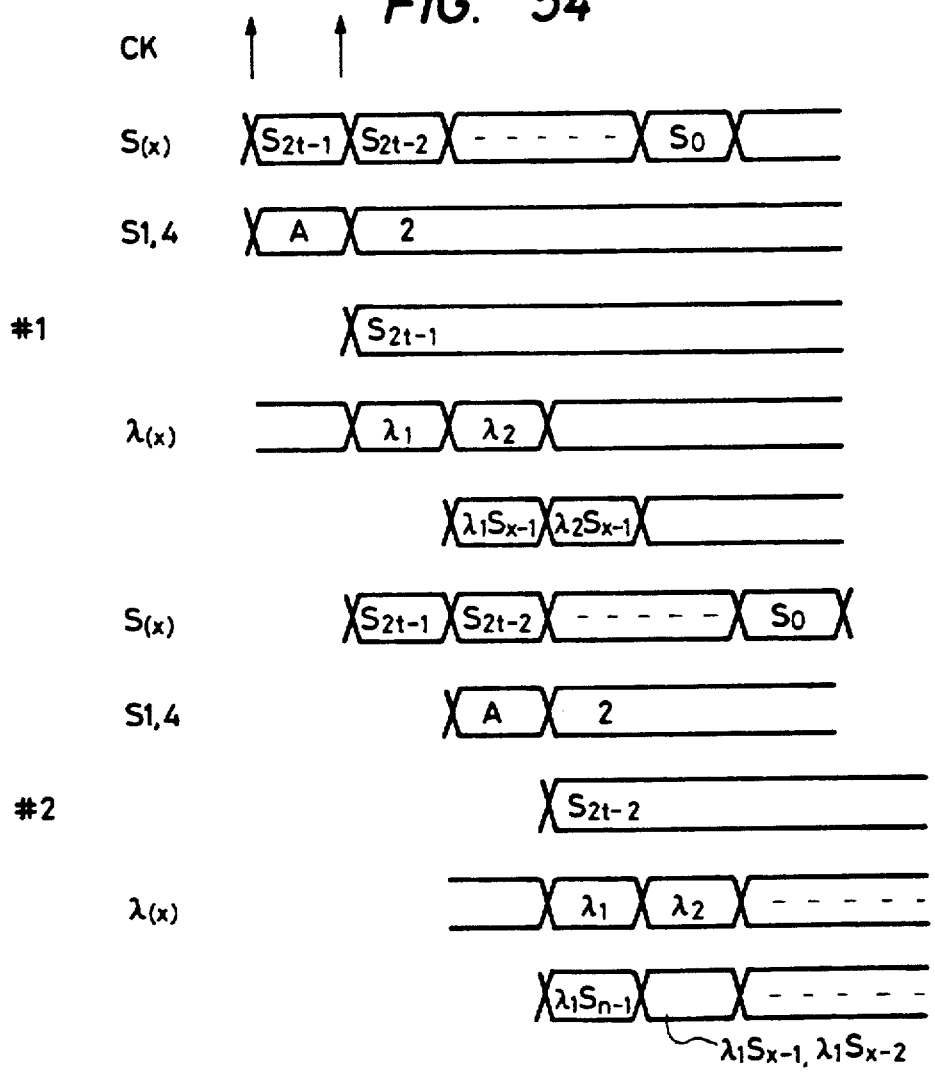
FIG. 54 is a timing chart illustrating the operation of the multiplying PE shown in FIG. 53.

In the multiplication circuit shown in FIG. 46, the polynomial $\lambda(x)$ is input to all the PEs which are at different communication distances. It is therefore advisable to use the PEs of the type shown in FIG. 5 in the manner shown in FIG. 52 and to connect them as shown in FIG. 53, whereby the communication distances are equalized Operation timing in this case is shown in FIG. 54. In this case, the computation of the multiplying operation $C(x) = A(x)*B(x)$ is reduced as follows.

$A(x)$ is represented as follows.

$$A(x) = a_{m-1} * x^{m-1} + a_{m-2} * x^{m-2} + \ldots + a_1 * x + a_0$$

Using this representation of $A(x)$, the multiplication $C(x)$ can be written as follows.

$$C(x) = a_{m-1} * B(x) * x^{m-1} + a_{m-2} * B(x) * x^{m-2} + \ldots + a_1 * B(x) * x + a_0 * B(x)$$

Thus, the multiplication $C(x)$ can be reduced into the following three parts.

$Z_0 = 0$
$Z_i = Z_{i-1} * x + B(x) * a_{m-1}$ (i=1, ..., m)
$C(x) = Z_m$

In this case, therefore, the order of allocation of $S_i$ to the PEs is reversed. Thus, $S_{2t-1}$ is allocated to #i PE. The method of allocation will be explained later. In the #1 PE, $Z_0$ is set as $Z_0 = 0$, and an operation is conducted to compute $Z_1 = Z_0 B(x) * a_{m-1}(a_{m-1} = S_{26-1}$, $B(x) = \lambda(x))$. In the next PE, the $B(x)$ as $B(x) * a_{m-i}$ delayed by one clock is added to the output, whereby a computation of $Z_i = Z_{i-1} * x + B(x) * a_{m-1}$ is conducted. This operation is repeated for m−2t times by allocating the operation to 2t units of PE, thus completing the computation of $C(x)$.

The connection shown in FIG. 53 is adapted to generate $S(x)*\lambda(x)$ upon direct receipt of the output $S(x)$ from the syndrome generating section shown in FIG. 13.

In the circuit shown in FIG. 53, when signals $S_j$ (j=2t−1, ..., 0) which are to be set in the respective PEs are received, the selection signal is set as S1 ... 4=0101 so that the signals $S_j$ is input to the register 528. Thereafter, the selection signal is set as S1 ... 4=0100 so that the output of the register 528 is fed back to the E input, whereby the $S_j$ is stored in the register 528, i.e., the $S_j$ is selected by the PE. The aforementioned multiplication is conducted by setting the selector signal of the respective PEs as S1 ... 4=0100, while inputting $Z_{i-1}$ and $\lambda(x)$ to the A input and C input, respectively. In order that the timing of input $\lambda(x)$ is delayed by one clock from the timing of input of $Z_{i-1}$, the $\lambda(x)$ output from the register 527 is fed back to D input in the preceding PE and is output from the register 526 via the W output.

Figure 49:
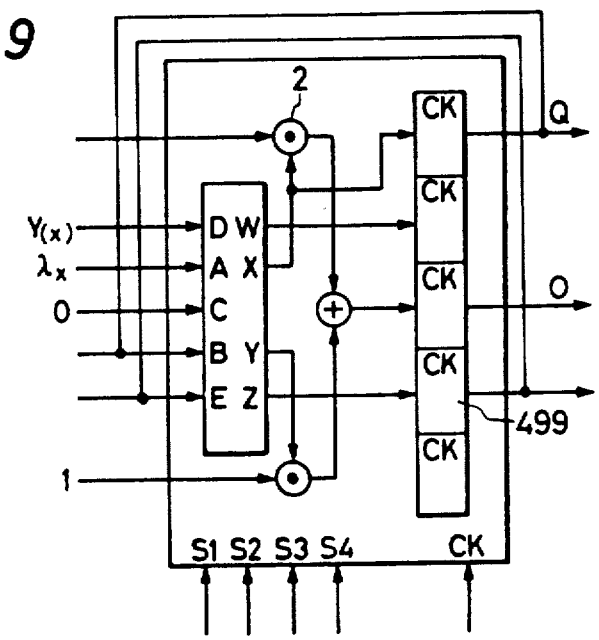
FIG. 49 is an illustration of an erasure position polynomial generating PE.
Figure 50:
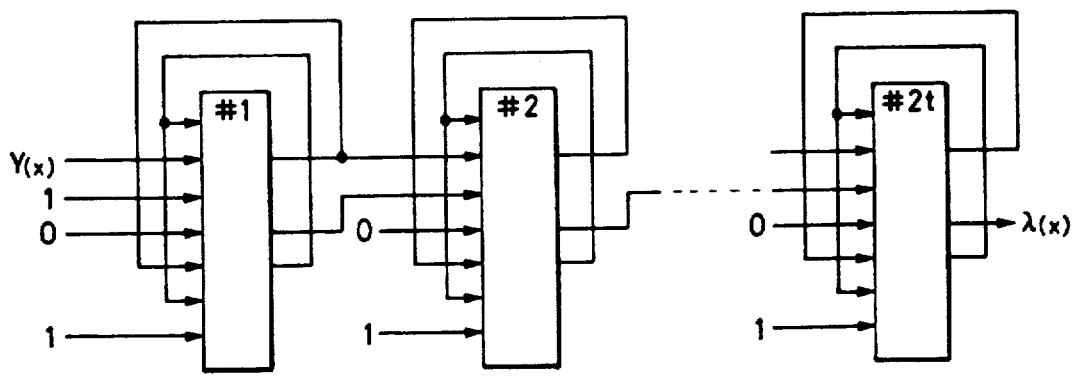
FIG. 50 is a connection diagram of the erasure position polynomial generating PE shown in FIG. 49.
Figure 51:
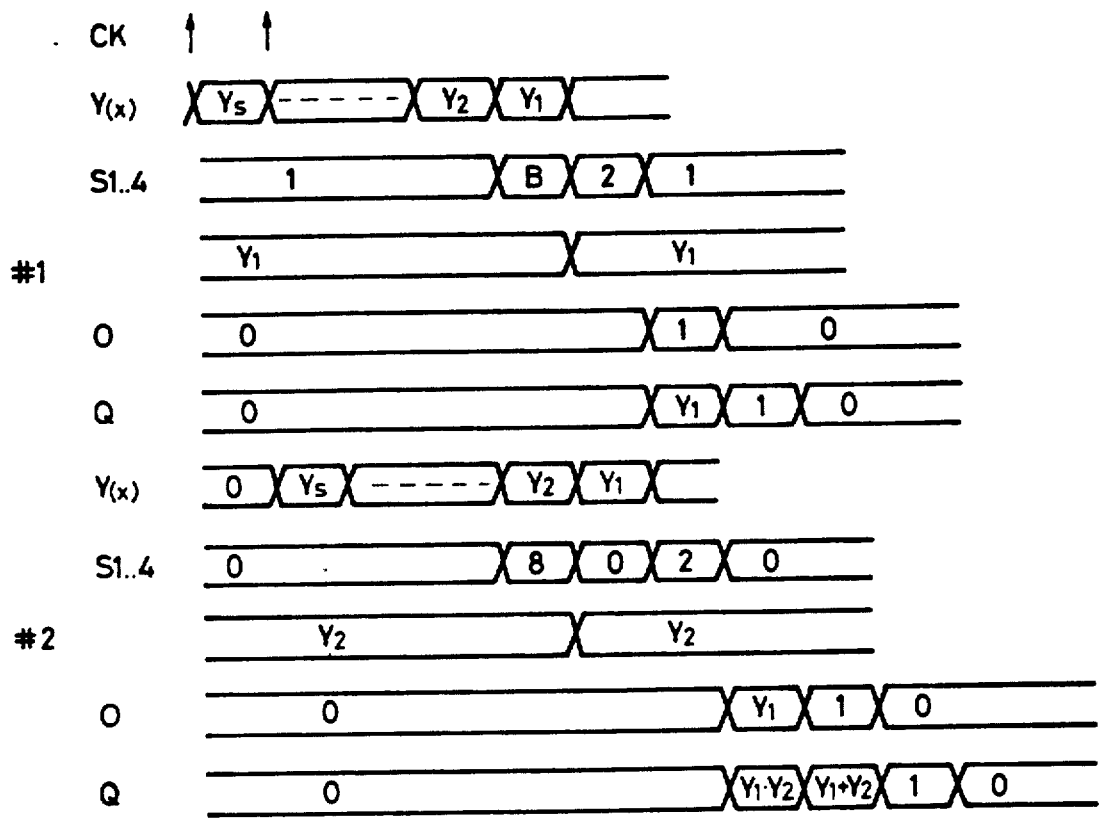
FIG. 51 is a timing chart illustrating the operation of the erasure position polynomial generating PE shown in FIG. 50.

The circuit shown in FIG. 50 shows the $\lambda(x)$ generating section which is used when $Y_i$ (i=1, ..., s) are consecutively output. This can be achieved by using the PE of FIG. 5 as shown in FIG. 49 and transmitting the signal in the manner shown in FIG. 51 so as to set the inputs of $Y(x)$ in the respective PEs. Usually, the selection signal is set as S1 ... 4=0000 (S1 ... 4=1000 only for the #1 PE). When the $Y_i$ to be set is input through the D input, the selection signal is set as S1 ... 4=0001 (1 ... 4=1101 only for the #1 PE), whereby the D input is selected and output through the Z output so that Y$_i$ is input to the register Y$_i$. Then, by resetting the selection signal in the selector, the output from the register 499 is fed back to the register 499 through the E input and the Z output, whereby the value of Y$_i$ is stored in the register 499. Thus, the value of Y$_i$ is set as the input t the multiplier 2. The operation for generating $\lambda(x)$ after the setting of Y$_i$ is the same as that shown in FIG. 44:

Coding Device

Figure 55:
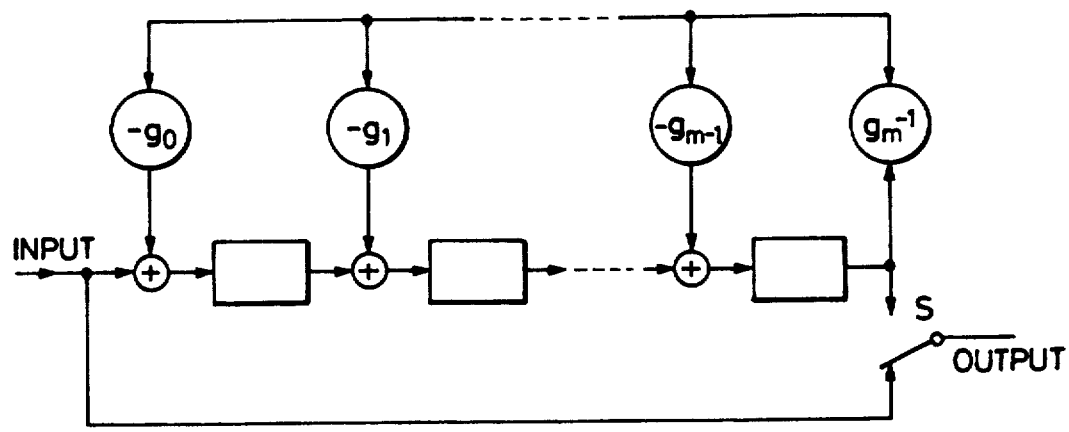
FIG. 55 is an illustration of a conventional coding circuit.
Figure 56:
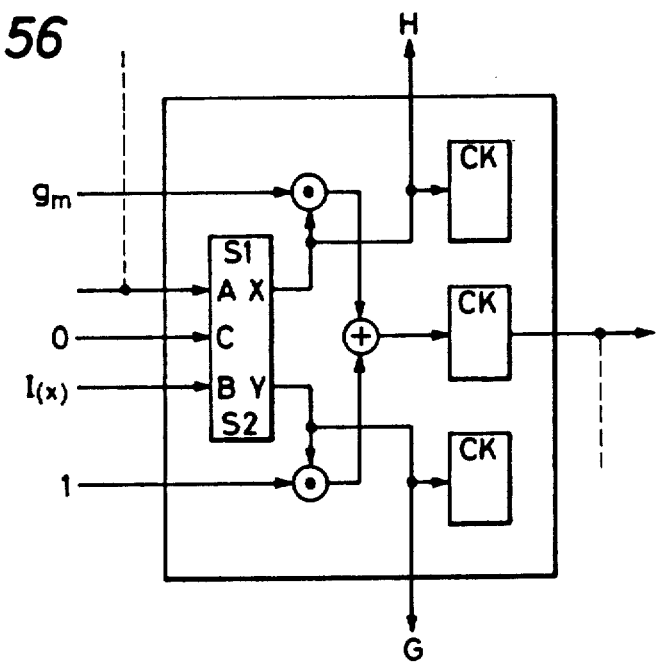
FIG. 56 is an illustration of the construction of a coding PE making use of the construction shown in FIG. 1.
Figure 57:
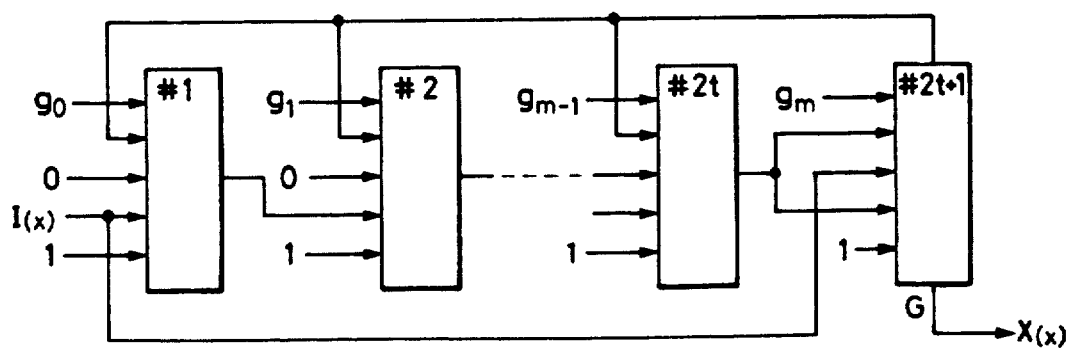
FIG. 57 is a connection diagram of the coding PE shown in FIG. 56.
Figure 58:
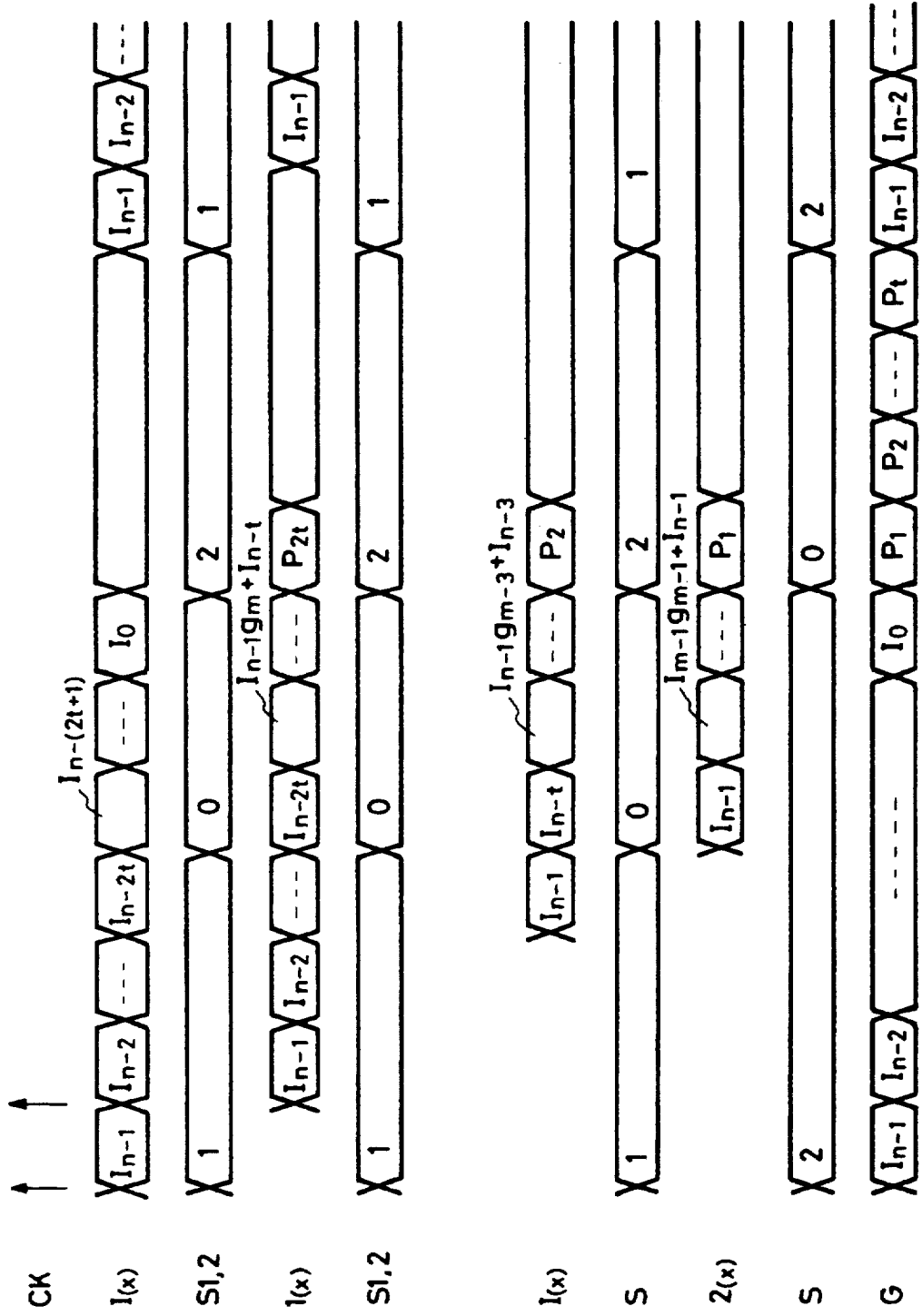
FIG. 58 is a timing chart illustrating the operation of the coding PE shown in FIG. 57.

The coding device is usually constituted by a division circuit for conducting division of polynomials. The construction of the division circuit is shown in FIG. 55. An arrangement equivalent to the circuit of FIG. 55 can be obtained by using the PEs in a manner shown in FIG. 56 and connecting them as shown in FIG. 57. The connection of the #2t+1 PE is different from that of other PEs, because this PE is intended to have a function of a selector which selects information $I(x)=(I_{k-1}, I_{k-2}, \ldots, I0)$ and parity $P(x)=(P_{2t}, P_{2t-1}, \ldots, P_1)$ so as to code them. Therefore, the selection signal is set as S1,2=10 for the #1 to #2t PE, and as S1,2=01 for the #2t+1 PE. When the initial word $I_{k-1}$ of the information $I(x)$ is input from the C input of the #2t+1 PE, the selection signal is set as S1,2=00 for the #1 to #2 t PEs. Meanwhile, information $I(x)$ is output from G of the #2t+1 PE via the C input and the Y output. When the final word I$_0$ of the information $I(x)$ is input to the C input, the selection signal is set as S1,2=01 for the #1 to #2t PEs, whereby the parity is output following the information (I) from G of the #2t+1 PE. The timing of this operation is shown in FIG. 58. In the circuit shown in FIG. 57, different PEs have different communication paths.

Error Correction Executing Section and System

Figure 38:
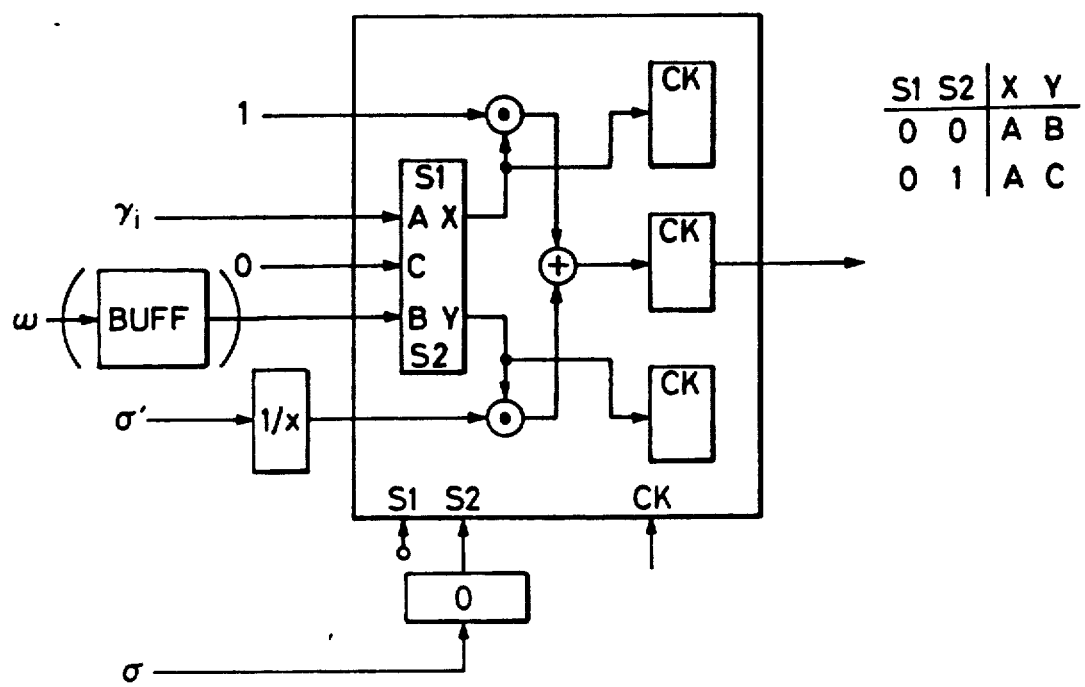
FIG. 38 is an illustration of an error correction executing PE making use of the construction shown in FIG. 1.

The section for executing the error correction in Step 4 is composed of PEs of FIG. 1, as shown in FIG. 38. IN this case, however, it is necessary to externally provide a 0 detection circuit (composed of an OR circuit indicated at [0] in FIG. 38 and input to 52), as well as a reciprocal number generating circuit (constituted by, for example, a ROM and denoted by 1/x in FIG. 38). When a single processing section is used twice, once for A(B) and once for L(M), the coefficient of $\omega(x)$ is sent first so that the value of $\omega(\alpha^{-i})$ is computed first and sent to this circuit. In this case, a buffer is used in order to attain a matching of output timings $\sigma(\alpha^{-i})$, $\sigma'(\alpha^{-i})$ so as to delay the output of the $\omega(\alpha^{-i})$. When the GCD generating section has two processing sections for conducting processing of A(B) and the processing of L(M) simultaneously, it is not necessary to use such a buffer. When $\omega(\alpha^{-i})$ and $\sigma'(\alpha^{-i})$ are input at the same timing, $\omega(\alpha^{-i})$ is delivered to B, while $\sigma'(\alpha^{-i})$ is inverted to become a reciprocal number and delivered to the multiplier 3. The signal $\sigma(\alpha^{-i})$ is input to the 0 detection circuit which provides an output 0 and 1, respectively, on conditions of $\sigma(\alpha^{-i})=0$ and $\sigma(\alpha^{-i})\neq 0$.

Thus, when the condition of $\sigma(\alpha^{-i})=0$ is met, the selection signal is S1,2=00, so that the T output delivers $\omega(\alpha^{-i})$ which is multiplied by $\sigma'^{-1}(\alpha^{-i})$ so that the error value $\omega(\alpha^{-i})/\sigma'(\alpha^{-i})$ is output from the multiplier 3. When the instant position is not an error position, the condition of $\sigma(\alpha^{-i})\neq 0$ is met, so that the selection signal is set as S1, 2=01, whereby the Y output outputs 0 which is the input through C. Consequently, the multiplier 3 produces an output 0. The X output continuously outputs the received word system row $r_i'$ (i=n−1, ..., 0), so that the multiplier 2 outputs the received word row $r_i'$.

It is therefore possible to execute the error correction by computing EXOR of the outputs from the multiplier.

Figure 39:
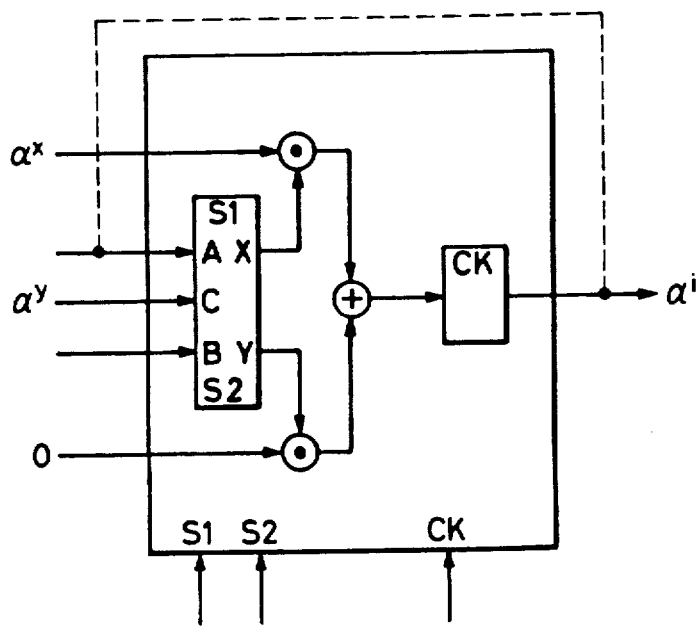
FIG. 39 is an illustration of the construction of an $\alpha y *(\alpha^x)^i$ generating PE.
Figure 40:
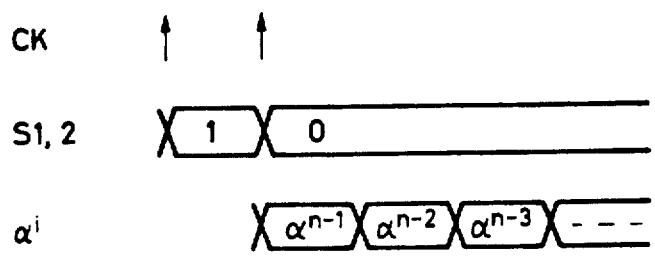
FIG. 40 is a timing chart showing the operation of the $\alpha y *(\alpha^x)^i$ generating PE shown in FIG. 39.

For the purpose of determining the value $f(\alpha^{-i})$, it is necessary to input the values $\alpha^{-i}$ (i=n−1, ..., 0). The generation of the values $\alpha^{-i}$ (i=n−1, ..., 0) can be performed by a circuit shown in FIG. 39 composed of PEs of the type shown in FIG. 1. In operation, on conditions of $a^y = \alpha^{-n}$ and $a^x = \alpha$, and the selection signal is set as S1,2=10 at the clock which is just before the timing of generation of $\alpha^{n-1}$. The selection signal is thereafter set as S1,2=00. This operation is shown in FIG. 40.

As will be understood from the foregoing description, according to the invention, the steps of decoding of RS code by Euclidean algorithm are conducted by PEs of the same construction. In an example of the described embodiment, it is possible to operate the whole system solely by the selection signal S1 ... 4 of the respective PEs. by adopting the following combination of steps.

Step 1) Generation of syndrome: FIG. 13

Step 2) Generation of error position polynomial and error value polynomial: FIG. 27

Step 3) Generation of error position and error value (Evaluate): FIG. 36

Step 4) Execution of error correction: FIG. 38

Consequently, the total number of PEs required by the whole system is as follows.

$$\begin{array}{cccc} S & G & E & C \\ \{(2t) + & (2t + 2) + & (3t) + 1\} & \to (7t + 3) \end{array} * 1000 \text{ gate}$$

A control circuit for controlling the selection signals S1 ... 4 for the respective PEs as illustrated in FIGS. 14, 23, 24 and 37 is added thereby constituting the whole system. The control circuit is realized in a very small circuit scale by means of, for example, ROMs. In order to generate $\alpha^{-j}$ by the circuit shown in FIG. 39, 7t+5 units of PE have to be employed. When the single processing section is used twice in the GCD generating section, the process requires a processing time which is not shorter than 4t clocks. If the code length n is determined to meet the condition of n>4t, a processing speed of 10–20 Mwps can be attained. When two process sections are available, the processing time is 2t so that no problem is encountered.

Figure 59:
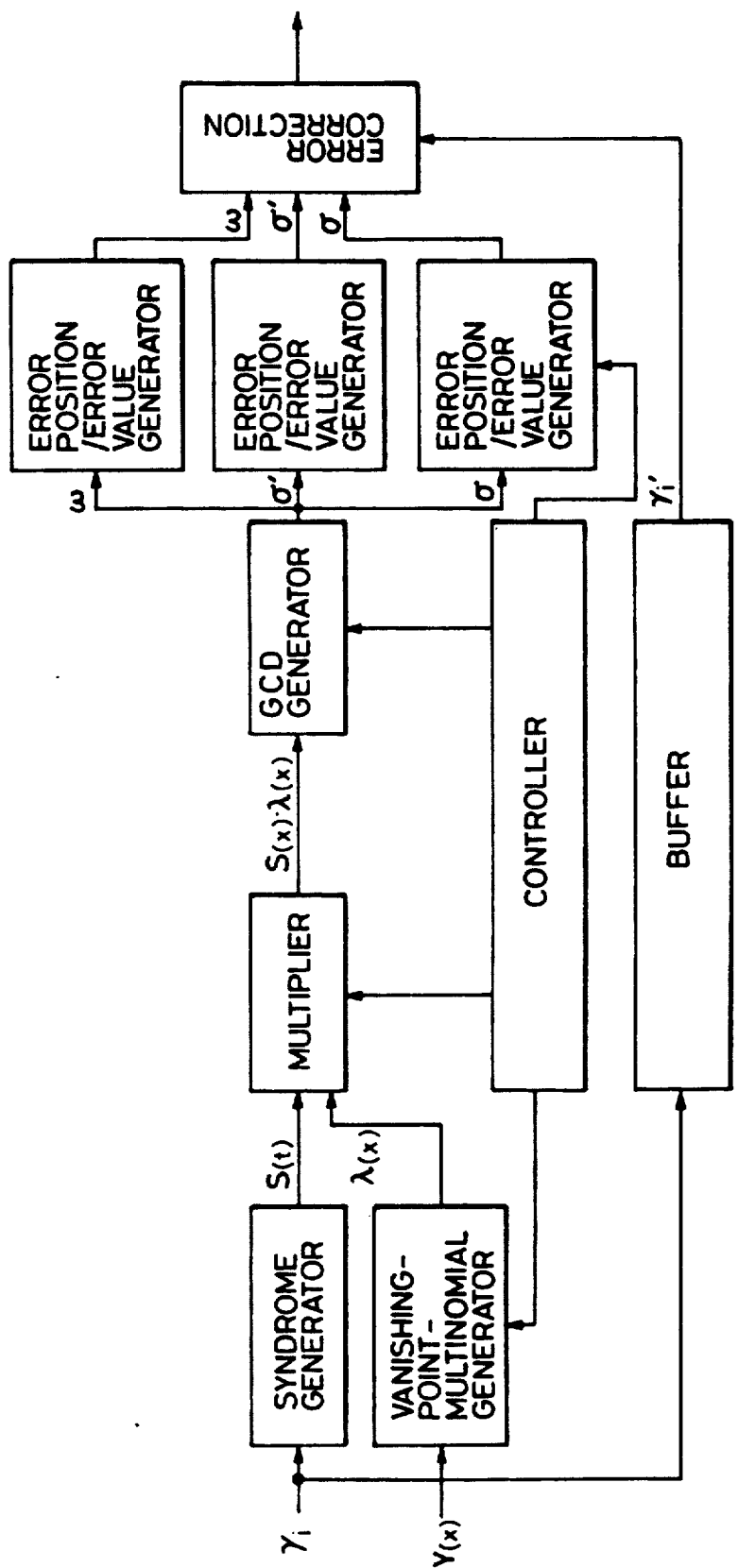
FIG. 59 is a block diagram of an erasure error correction coding decoder in accordance with the present invention.

When the coding decoder is considered as a system, the decoder for the correction of erasure error can also be used as a coding device. The decoder for the correction of the erasure error in FIG. 59 can be realized, for example, as a coding decoder composed of the following combination.

1) Syndrome generation (SYNDROME): FIG. 13

2) Generation of error position polynomial and error value polynomial: FIG. 27

3) Generation of error position and error value (EVALUATE): FIG. 36

4) Execution of error correction (CORRECT): FIG. 38

5) Erasure position polynomial generation (ERASURE I): FIG. 50

6) Multiplication (ERASURE II): FIG. 53

Figure 41:
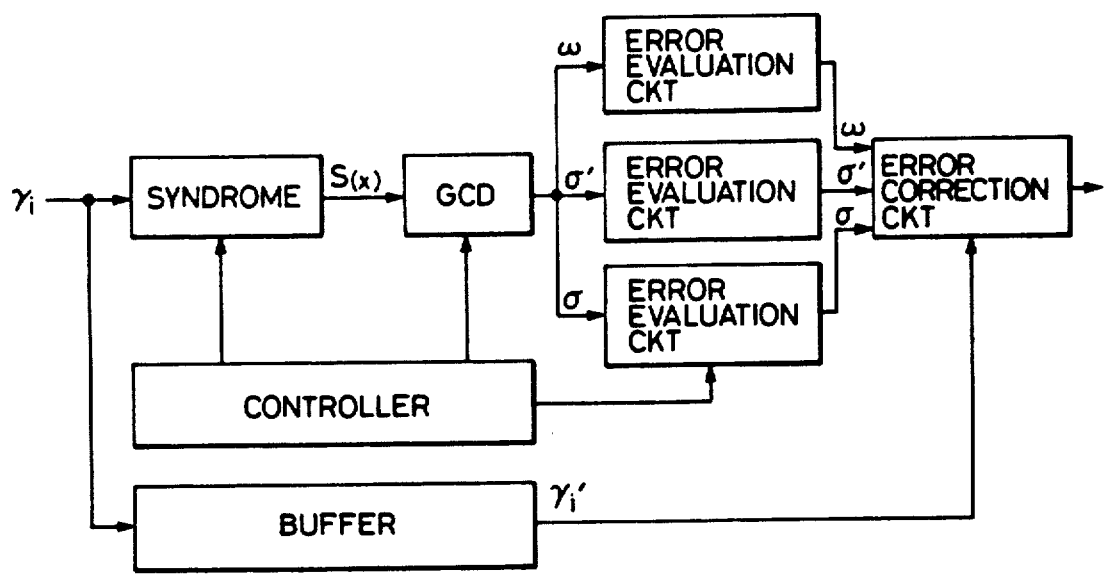
FIG. 41 is an illustration of an error correction decoder in accordance with the present invention.

This arrangement is obtained by adding the ERASURE I and ERASURE II to the decoder shown in FIG. 41. The processing speed, however, is not changed. The total number of PEs required by the whole system is given as follows.

$$\{\underbrace{(2t)}_{1)} + \underbrace{(2t+1)}_{2)} + \underbrace{(4t)+1}_{3)\ 4)} + \underbrace{(2t)}_{5)} + \underbrace{(2t)}_{6)}\} =$$

$$(12t + 3) * 1000 \text{ gate}$$

When there is no need for the erasure correction, it is necessary to add the coding device of FIG. 57 to the decoder shown in FIG. 41. The number of PEs required by the whole system is (9t+4) which is (2t+1) greater than the number (7t +3) required by the decoder of FIG. 41. When the coding and decoding are not conducted simultaneously, the connection of PEs and the control of PEs are made switchable between coding mode and decoding mode, so that a coding decoder is realized with the circuit shown in FIG. 41 without changing the scale of the circuit.

By using the PE of the type shown in FIG. 1 of FIG. 5, an RS coding decoder having a processing speed on the order of 10 to 20 Mwps can be obtained in the following circuit scale.

RS coding decoder: 7t+3(9t+4)

Erasure error correction coding decoder: 12t+3

Thus, the circuit scale is 17000 gates when t is 2(t=2), and 59000 gate when t is 8 (t=8). It is therefore possible to obtain a VLSI structure even when a control circuit is included. The design of the VLSI circuit is facilitated by the regularity of the internal structure and the optimization of the communication distances. In addition, the processing capacity can be increased in proportion to the number of PEs. In the design of the VLSI circuit, the processing section including the selector, multiplier and adder can be arranged in a concentrated manner so that a processing speed on the order of 10 to 20 Mwps can be obtained by optimization of arrangement.

Figure 60:
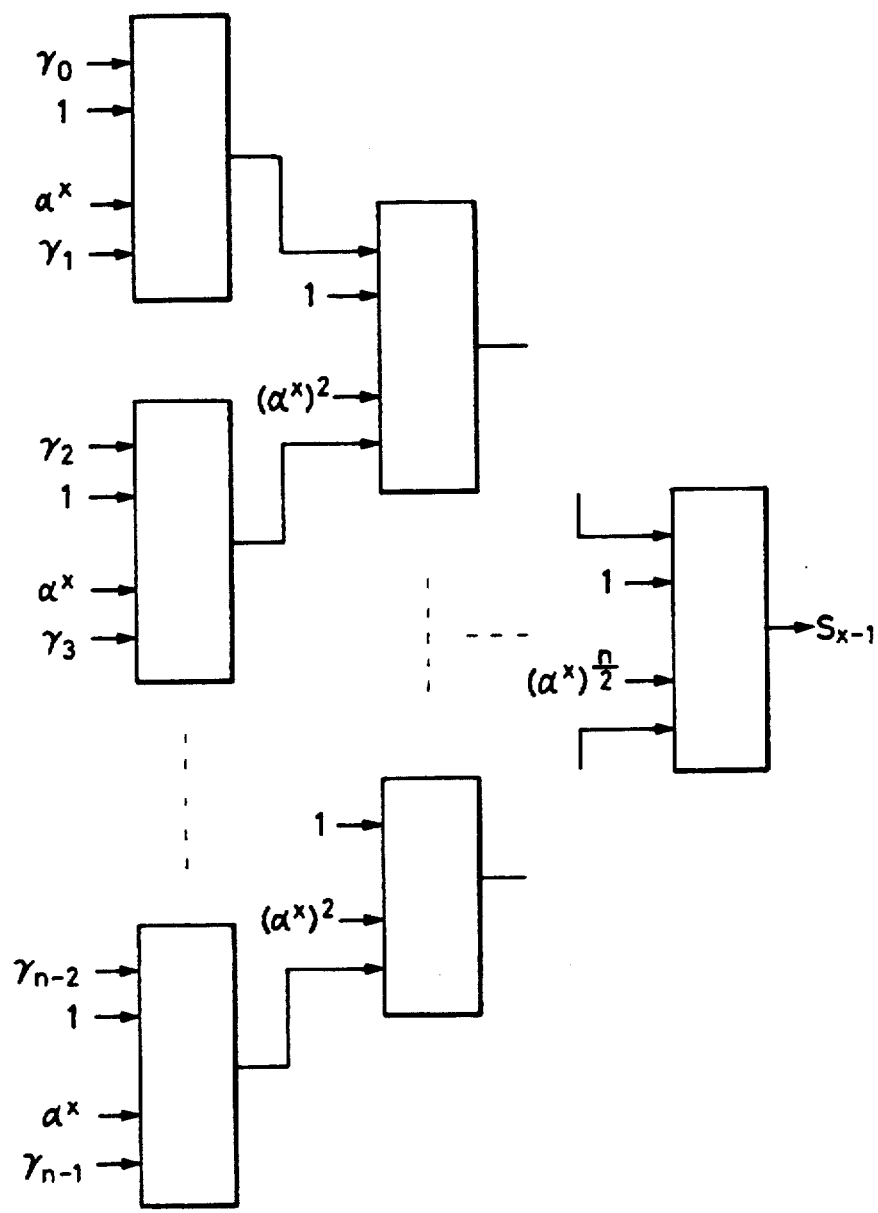
FIG. 60 is a block diagram of a high-speed multiplication/addition computer making use of the PE shown in FIG. 1.

The generation of an error position polynomial and the generation of an error value polynomial in Step 2, which is the main portion of the decoding process, can be realized with a high processing speed of 10 to 10 Mlps, by connecting PEs in a manner shown in FIG. 18. The processes of Steps 1 and 3 also can be realized with high processing speed of 10 to 10 Mlps, by adopting a special arrangement (parallel arrangement for independent code words) or by connecting the PEs in a manner shown in FIG. 60. In such cases, however, the scale of the circuit becomes very large.

Figure 61A:
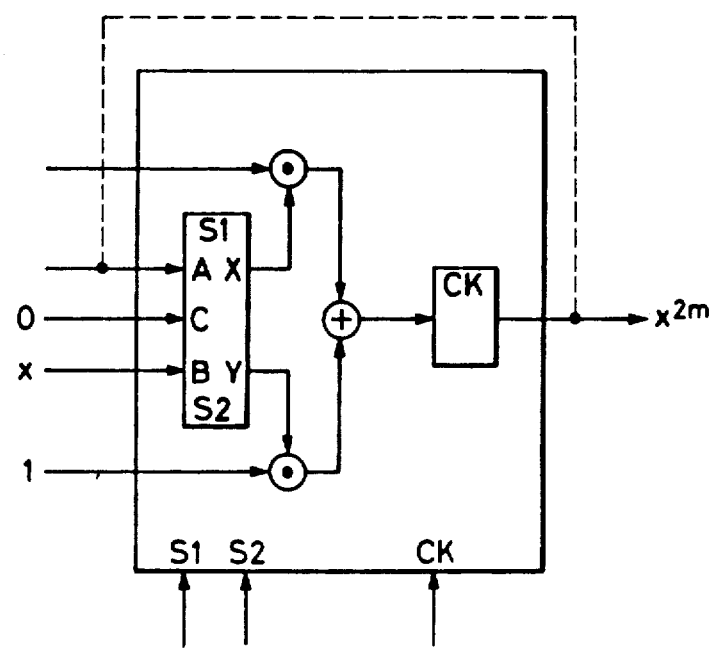
FIGS. 61A and 61B are illustrations of the construction and operation timing of an $X^{2m}$ generating circuit making use of the PE shown in FIG. 1.
Figure 61B:
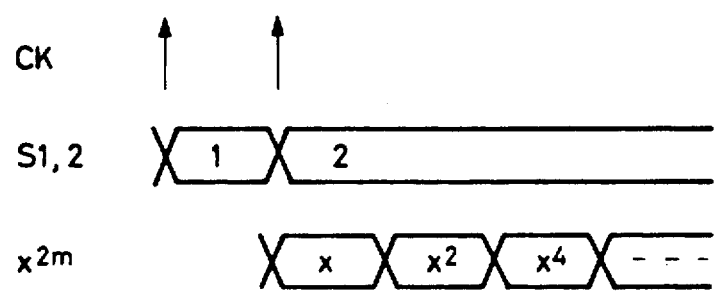
Figure 62A:
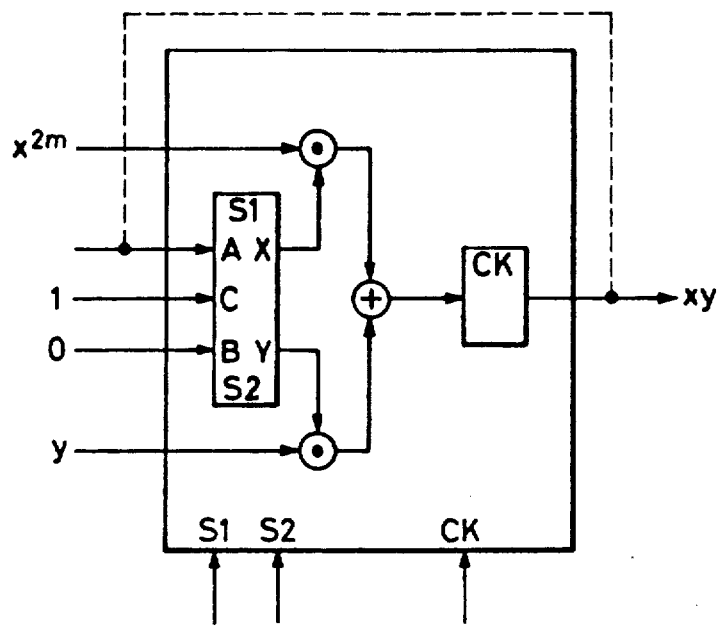
FIG. 62A-62B is an illustration of and operation timing of a divider making use of the PE shown in FIG. 1.
Figure 62B:
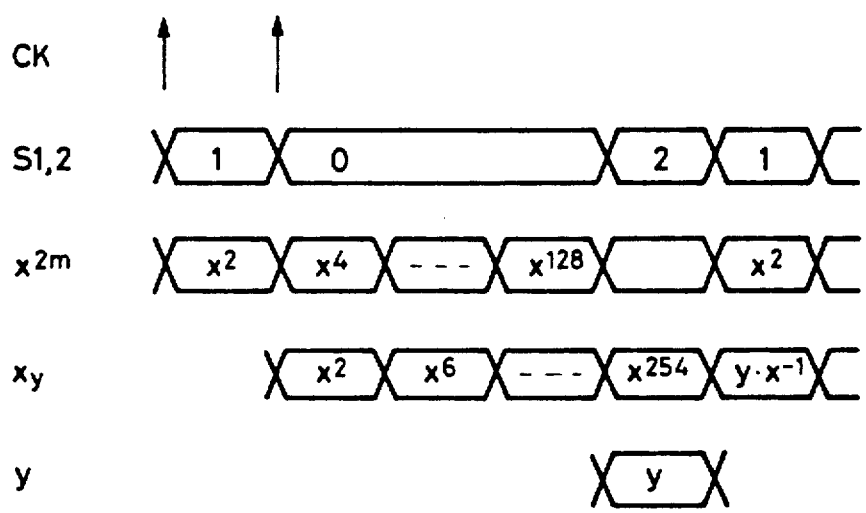

An $X^{2m}$ generating circuit and a divider can be constructed using the PEs, as shown in FIGS. 61A and 62A. Operation timings of these circuit are shown in FIG. 61B and 62B.

It is thus possible to conduct various computations on a Galois field by making use of these PEs, whereby a coding decoder of an RS code can be efficiently constructed.

Second Embodiment

Figure 63:
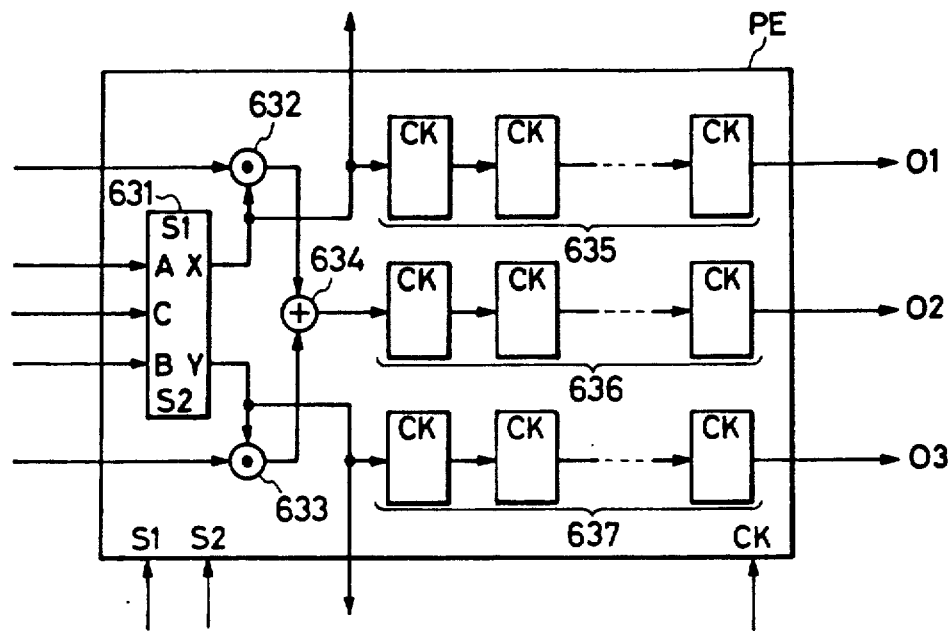
FIG. 63 is an illustration of a smallsized processing element (PE)

A description will be made as to a second embodiment of the present invention. The coding decoder described hereinbefore is constructed by making use of the concept of systolic architecture. The critical feature of the systolic architecture resides in that a process can be undertaken by a network of the same PEs. This means that all the processing units conduct the same task with the same inputs and outputs. This means that, if the result of a process conducted by one PE is not sent to the next PE, but is fed back to the same PE after a storage in a memory (register), the process can be conducted without requiring the number of PEs to be increased. In the second embodiment of the invention, therefore, the basic structure of the PE is determined as shown in FIG. 63. In this structure of PE, the parts 1 to 4 are the same as those shown in FIG. 1, but the registers 5 to 7 are arranged in m-stages of register rows or memory. In the case of $GF(2^8)$, when the arrangement shown in FIG. 2 is adopted, the selector 1 can be composed of about 50 gates. Each of the multipliers 2 and 3 can be realized by about 300 gates with the arrangement shown in FIG. 3. The adder 4 can be constructed by about 50 gates, with the arrangement shown in FIG. 4. Each of the registers 5 to 7 can be constructed with about 50 gates.

In the architecture of the first embodiment, each PE can receive a new input when it has output a processing result after a single cycle of operation. In such an architecture, therefore, the processing capacity of each PE can be fully utilized so that a high-speed processing is possible. In the second embodiment, however, the result of the computation is not supplied to the next PE, but is fed back to the same PE. The PE, therefore, cannot receive a new input. Thus, the rate of transfer of data to each PE is seemingly reduced. The processing speed of the PE itself, however, is determined by the processing section of the PE constituted by the parts 1 to 4 and, hence, is 10 to 20 MHz. For the sake of convenience, the processing speed of one PE is set at 16 Mhz.

The processes of Steps 1) to 4) explained before is realized by using this PE as a base unit. In order to reduce the size, however, the PEs are optimized for the respective steps of removing unnecessary parts.

A description will be made hereinunder as to the construction and operation of each section of the RS coding decoder in accordance with the second embodiment.

Syndrome Generation Section

In Step 1), it is required to produce, from a row of a receiver system $R = (r_{n-1}, r_{n-2}, \ldots, r_1, r_0)$, coefficients $(S_{2t-1}, S_{2t-2}, \ldots, S_1, S_0)$ of a syndrome polynomial required by Step 2) and to output these coefficients in a serial manner. Practically, the computation of the syndrome polynomial is conducted by making use of the following cyclic algorithm.

$$S_{j-1} = (\ldots ((r_{n-1} * \alpha^j + r_{n-2}) * \alpha^j + r_{n-3}) * \alpha^j + \ldots + r_1) * \alpha^j + r_0$$

Figure 64:
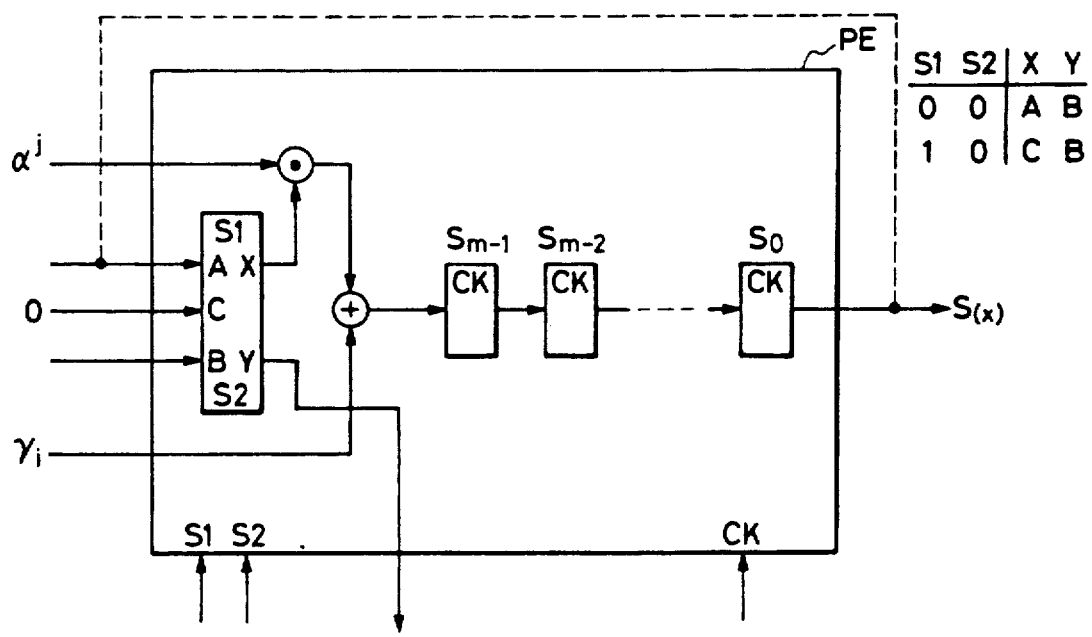
FIG. 64 is an illustration of a syndrome generating circuit employing an optimized form of the PE shown in FIG. 63.

This formula can be reduced as follows.
$Z_0 = 0$
$Z_i = Z_{i-1} * + r_{n-i}$ (i = 1, \ldots, n)
$S_{j-i} = Z_n$ A PE for the generation of syndrome is illustrated in FIG. 64.

In order to reduce the size of the circuit, the multiplier 633 and the registers 635, 637 which are not essential in the generation of syndrome are omitted from the basic PE shown in FIG. 63. As a result, the computing section of PE has 400 gates.

In operation, values of $\alpha^j$ (j=1, \ldots, 2t) are successively input through the input $\alpha^j$. The input of the values $\alpha^j$ (j=k+1, \ldots, k+m) are cyclically conducted such that the values of from j=k+1 to k+m are input in the period of each operation cycle. The receiving symbols $r_{n-i}$ (i = 1, \ldots, n) from the receiving system row is conducted such that the value of each receiving symbol is also maintained throughout each period.

When such a method is used, it is possible to neglect the registers 7 so that $r_i$ input is directly input to the adder. It is, however, necessary that the register 6 is arranged in m stages, because the result of computation of $Z_i$ has to be held by an amount corresponding to one period, i.e., the values of $Z_i$ for m PEs. The flow of signals as obtained on condition of m=2t is shown in FIG. 65.

In the beginning (i=1), the selection signal S1,2 is set as S1,2=10 only when $r_{n-1}$ is being input. In this state, 0 as the C input is derived from the X output, and $Z_1 = r_{n-1}$ which is the result of the computation obtained under the condition of i−1 is successively input to the registers arranged in 2t stages. Thereafter, i.e., when i is 2, . . . , n, the selection signal is set as S1,2=00, so that the X output of the selector selects the A input, and the value $Z_{i-1}$ obtained in the preceding computations are successively output from the X output and are multiplied with $\alpha^j$ (j=1, . . . 2t) and the results are added to $r_{n-1}$, whereby $Z_i = Z_{i-1} * \alpha^j + r_{n-1}$ (j=1, . . . , 2t) are computed. Thus, the registers arranged in 2t stages constitute a memory section for temporarily storing the values obtained in the course of computation of $S_{i-1}$(j=1, . . . , 2t) and feeding back the same. With this arrangement, it is possible to realize the processes of 2t units of PE by a single unit of PE. However, since the inputs $r_{n-1}$ of a number corresponding to the register stages have to be maintained, the processing speed is (16/2t)Mwps.

In this case, the for purpose of reduction in the size of the circuit, the multiplier 633 is omitted, as well as registers 635 and 637. Therefore, the PEs shown in FIG. 64 have a circuit scale of (400+m*50) gates, and the processing speed is (16/m)Mwps. A symbol m represents the number of stages of the registers. When the whole process is conducted by a single PE, the stage number m is 2t. When the correction capacity t is 8 (t=8), the PE has a circuit scale of 1200 gates and a processing speed of 1 Mhz = 8 Mbps.

Figure 67:
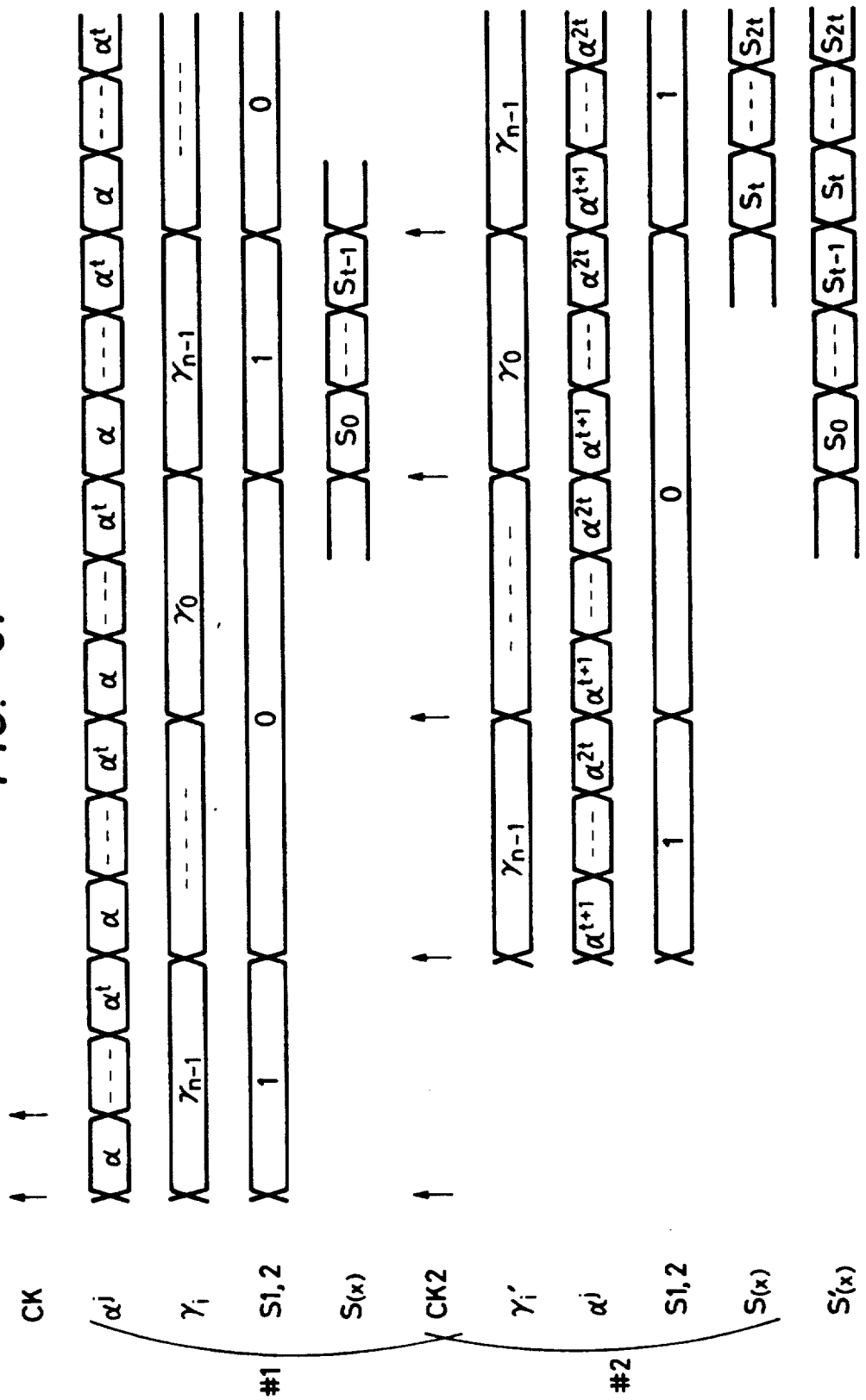
FIG. 67 is a timing chart illustrating the operation of a syndrome generating circuit having a pair of PEs shown in FIG. 64.

When the process is undertaken by a plurality of PEs, the PEs of the type shown in FIG. 64 are connected in a manner shown in FIG. 66. In this case, the receiving symbol is delayed by an amount corresponding to one period for each PE. To this end, it is necessary to employ a register which is controlled by CK2 which is a clock generated for each period. Representing the number of PEs by k, each PE is required to undertake 2t/k of the whole process. This means that the number m of stages of registers to be employed by each PE is determined as m=(2t/k). Thus, the circuit shown in FIG. 66 has a circuit scale of (2t/m)*(400+m*50) gates. FIG. 67 shows the flow of signals as obtained when the circuit is composed of a pair of PEs. In this case, $\alpha^j$ (j=1, . . . , t) are allocated to the #1 PE, while $\alpha^j$ (j=t+1, . . . , 2t) are allocated to the #2 PE. The number m of the register stage is t (m=t), so that a processing speed of 2 MHz = 16 Mbps and a circuit scale of 800*2 = 1600 gates are obtained.

On the condition of m=1, the number of PEs required is k =2t. Since the condition of CK2=CK is met, the register controlled by CK2 is equivalent to the register 637, and a processing speed of 16 Mwps is attained. Thus, unnecessary circuit parts are omitted from the circuit shown in FIG. 42. It is possible to make an effective use of the empty B input of the selector, by inputting the S(x) output of the preceding PE therethrough, so as to output from the final PE a series of coefficients ($S_{2t-1}$, $S_{2t2}$, . . . , $S_j$, $S_0$) of the syndrome polynomial, as the output S'(x).

GCD Generating Section

Generation of Error Position Polynomial and Error Value Polynomial Generation The algorithm for deriving the error position polynomial $\sigma(x)$ and the error value polynomial $\omega(x)$ can be attributed to an expanded GCD question. In the circuit shown in FIG. 43, each PE delivers its output to the next PE after completing one cycle of process. At the same time, it receives the next input. This operation is repeated so that each PE conducts 2t times of operation cycles. In this embodiment, however, each PE does not deliver the results of 2t times of operation to the next PE. Namely, in this embodiment, the results are accumulated in registers of the PE and, after the completion of input of the syndrome polynomials S(x) and $x^{2t}$, the results stored in the register are fed back, whereby the whole process is conducted by a single PE.

FIG. 68 shows the construction of such a PE. This PE requires, as is the case of the arrangement shown in FIG. 105, a circuit for setting "State", registers controlled by CK2 and CL for holding $\alpha$ and $\beta$, and an additional stage of register on the output side of the registers rows 685, 687. Representing the number of stages of registers in the PE by m, the circuit scale required for the single PE (except for State setting circuit, because it belongs to the control section) has (700+(3m+4)*50) gates. (700 represents the circuit scale of the computing section, while (3m+4) represents the total number of registers.)

Figure 69:
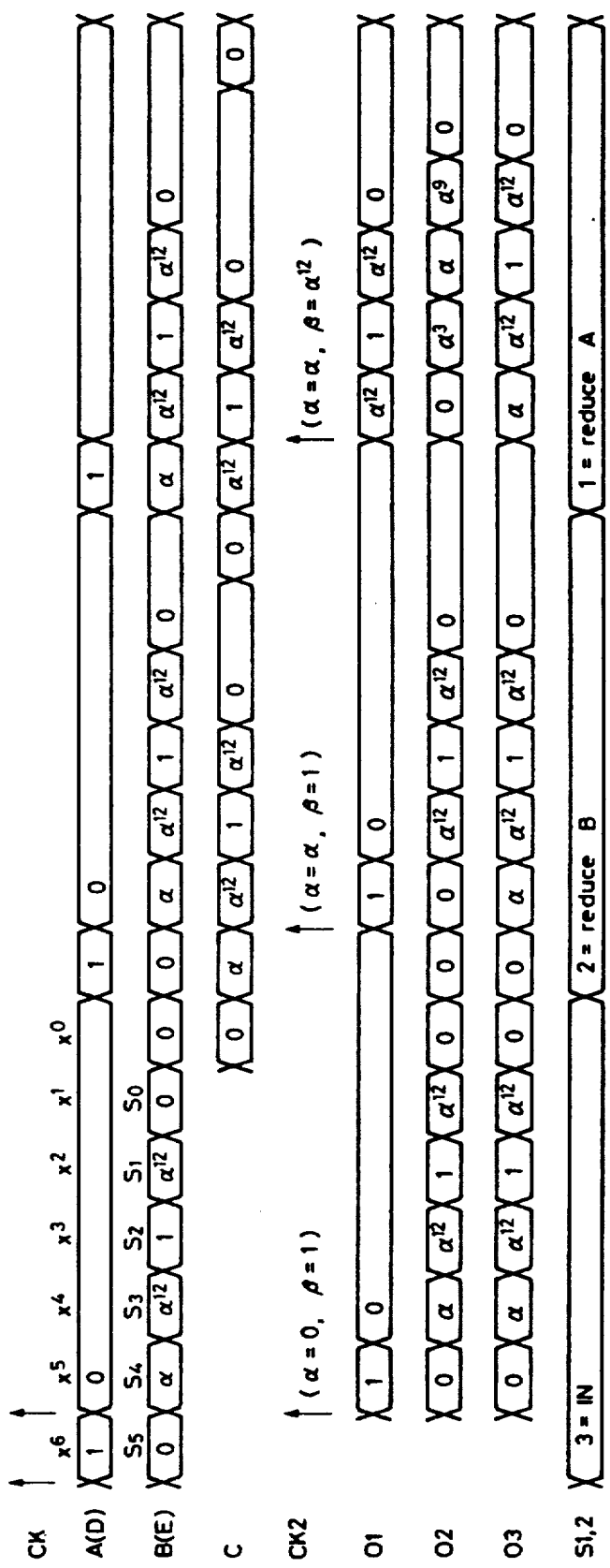
FIG. 69 is a timing chart illustrating the operation of the GCD generating circuit shown in FIG. 64.
Figure 70:
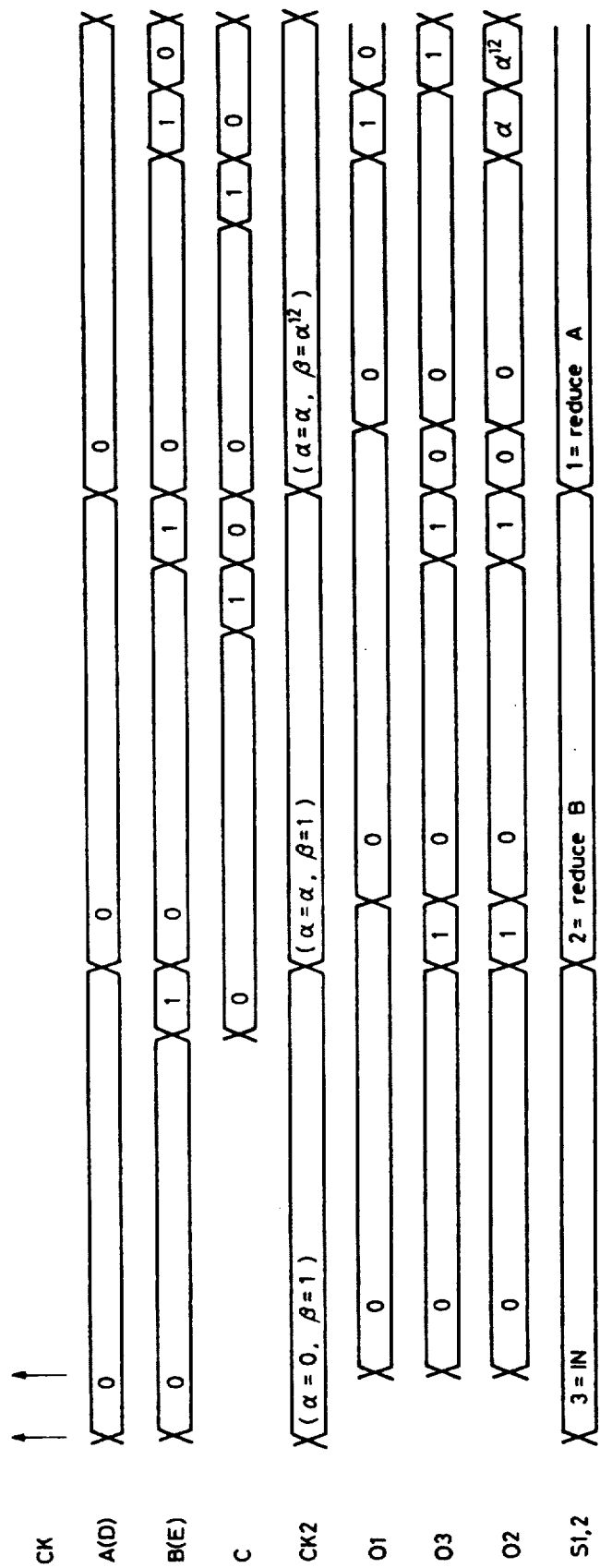
FIG. 70 is a timing chart illustrating the operation of the GCD generating circuit shown in FIG. 63.
Figure 102:
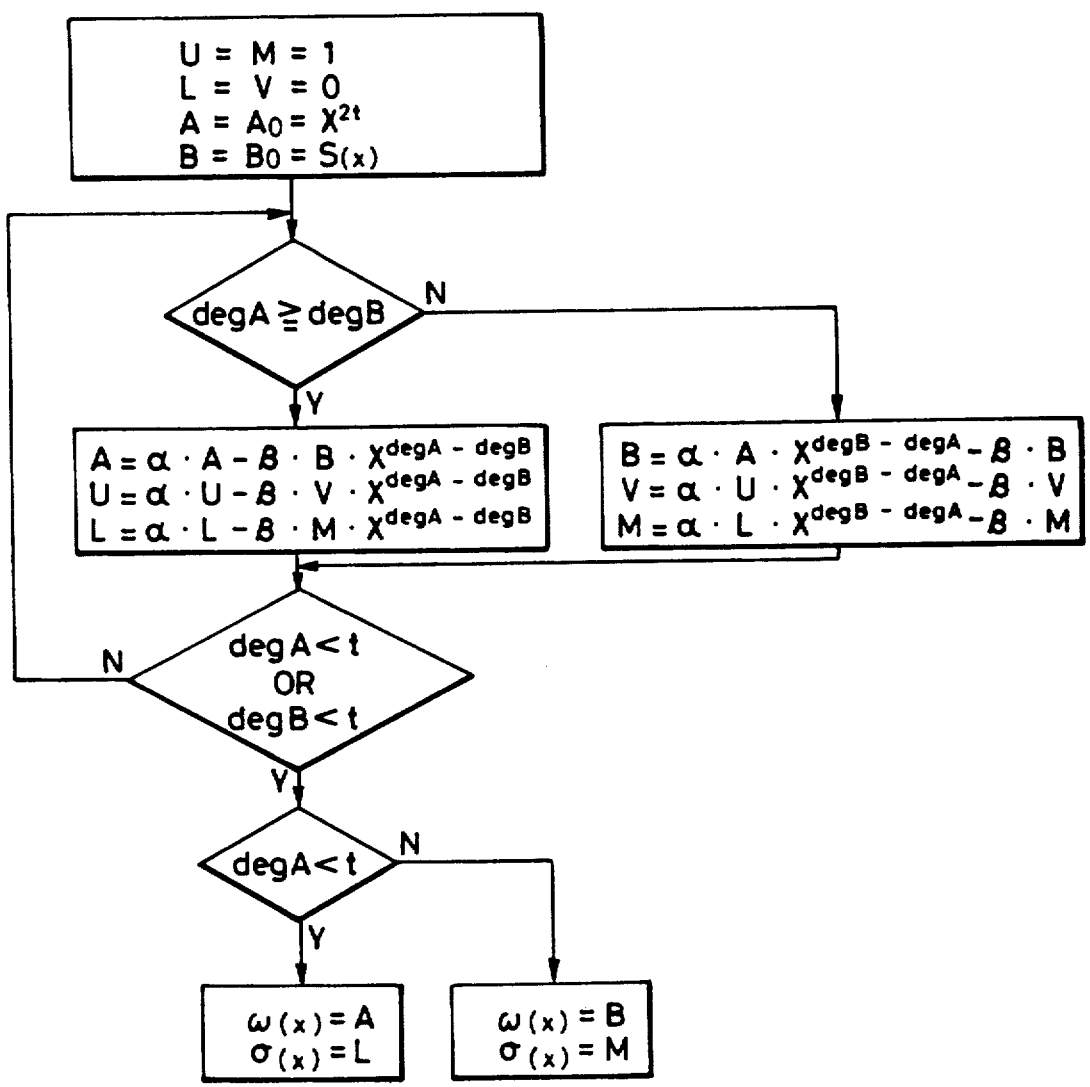
FIG. 102 is an illustration of a algorithm for determining the GCD.
Figure 103:
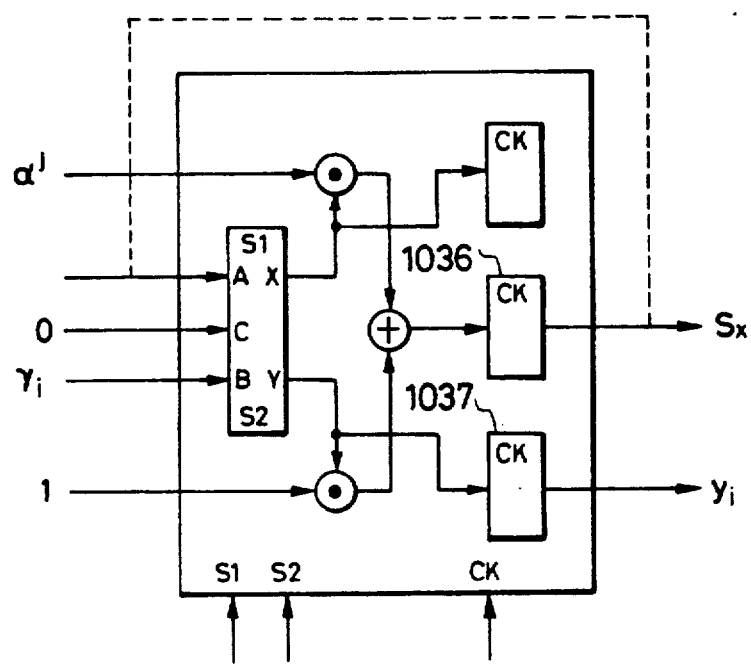
FIG. 103 is an illustration of a conventional syndrome generating PE.
Figure 104:
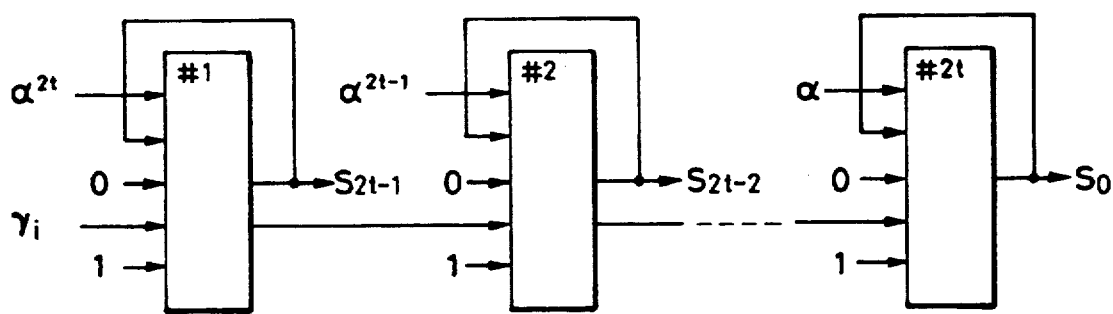
FIG. 104 is a connection diagram of the conventional syndrome generating PE.
Figure 106A:
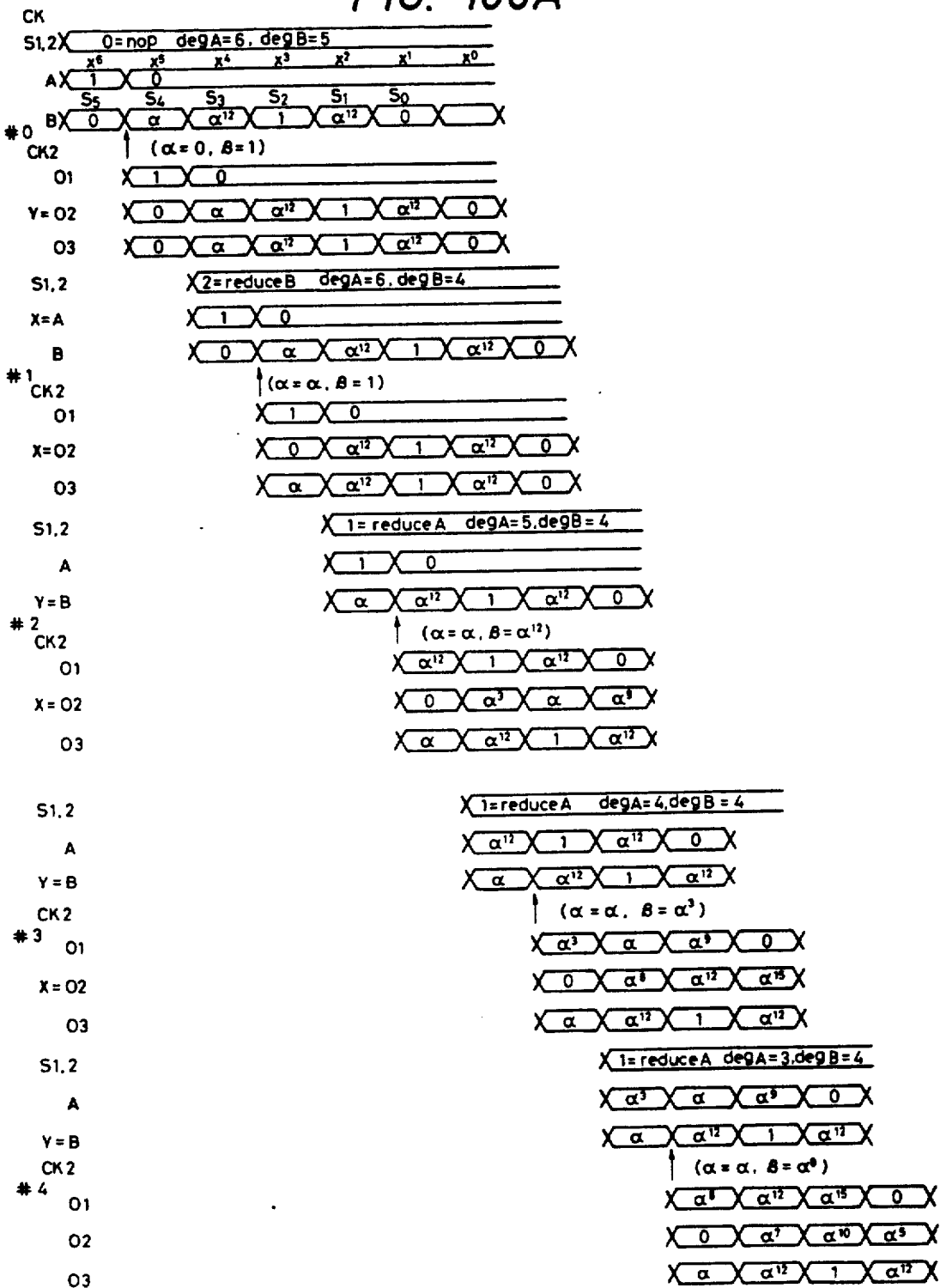
Figure 107B:
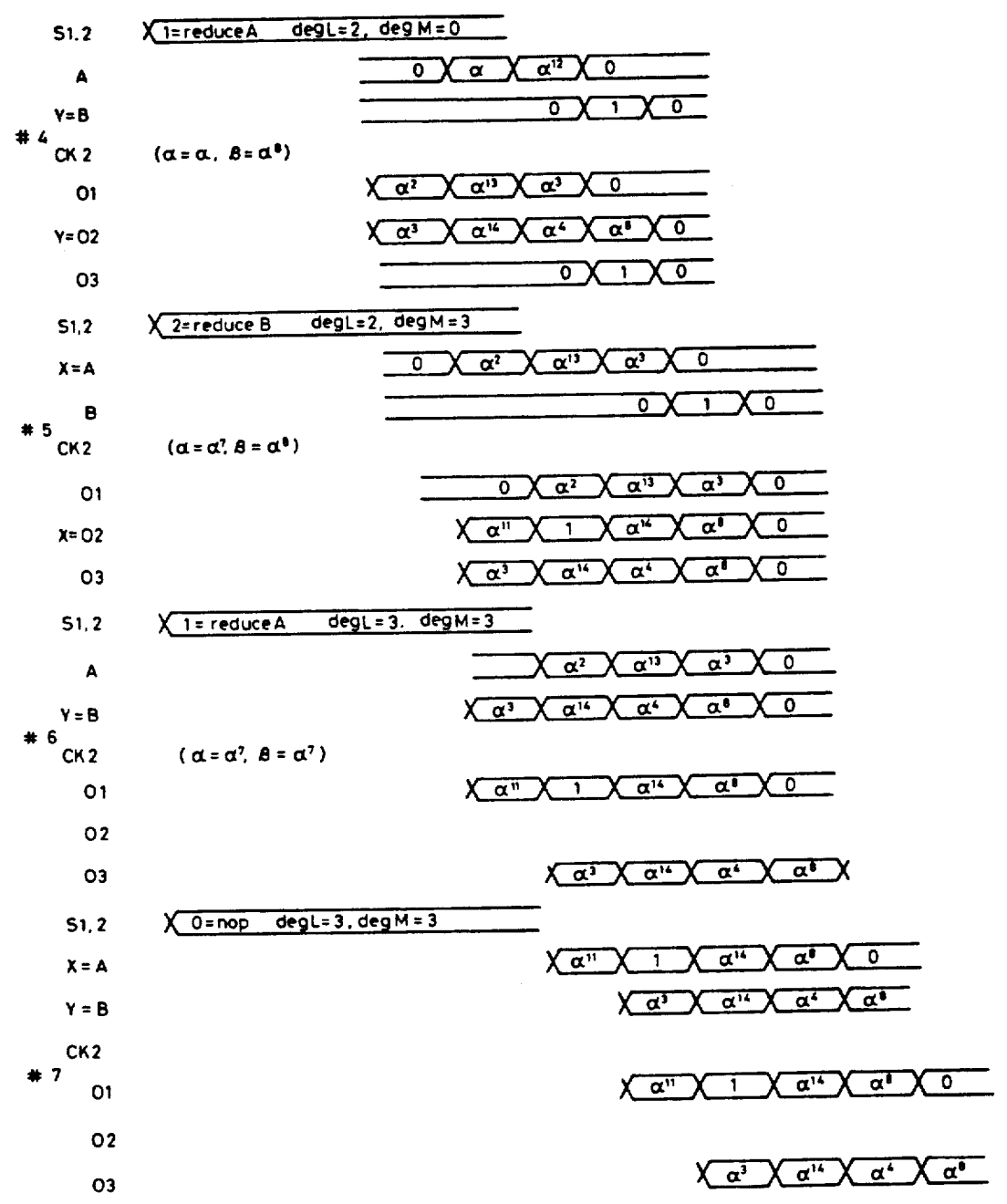
Figure 108:
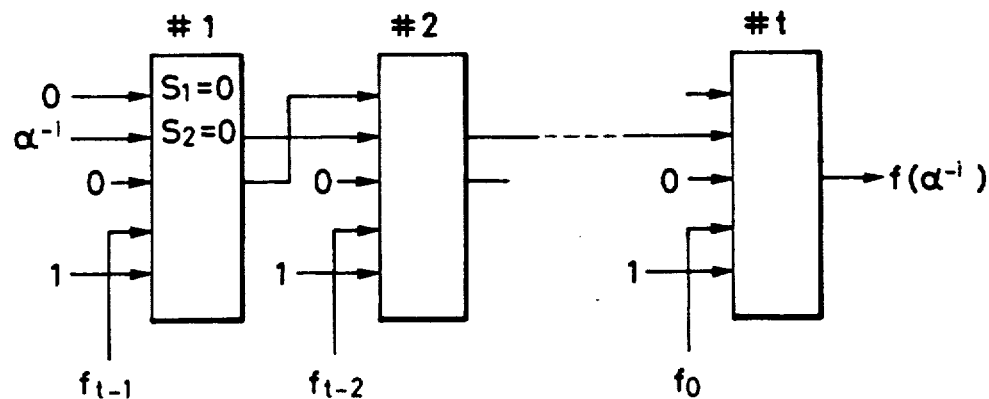
FIG. 108 is a connection diagram of a conventional error evaluation PE.
Figure 109:
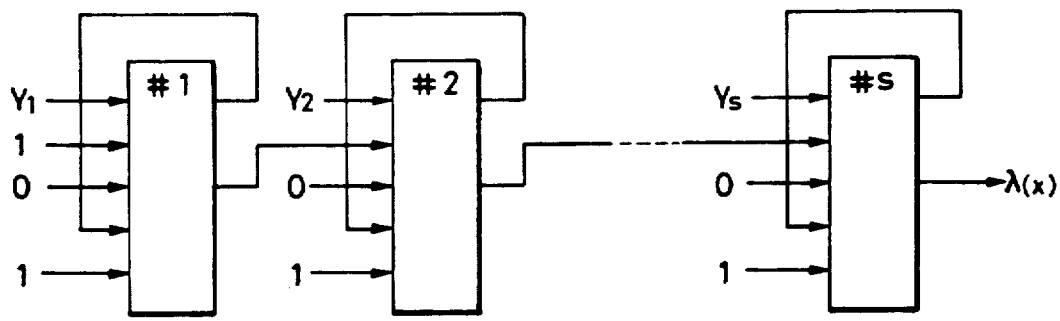
FIG. 109 is a connection diagram of a conventional erasure position polynomial generating PE.

When the whole process is conducted by a single PE, the number m of stages of registers is 2t, because the degree of the polynomial obtained through processing does not exceed 2t. FIG. 69 shows an initial portion of the flow of signals for determining A(B) with the arrangement shown in FIG. 102, while FIG. 70 shows the initial portion of the flow of signals for determining L(M). It will be understood that the operations shown in FIGS. 106 and 107 can be consecutively conducted by the single PE as the switching of the selection signal and the control of the clock CK2 are effected by the basic clock SK at a period of (m+1).

There are two alternatives of arrangement for determining A(B) and L(M), i.e., to use two independent processing sections and to use a single processing section twice. The description will be made hereinunder as to the case where a single processing section is used. It will be understood that, when the single processing section is used twice, the processing speed is to be reduced by one half, while, when two independent processes are used, the number of PEs is to be doubled.

Figures 71, 72:
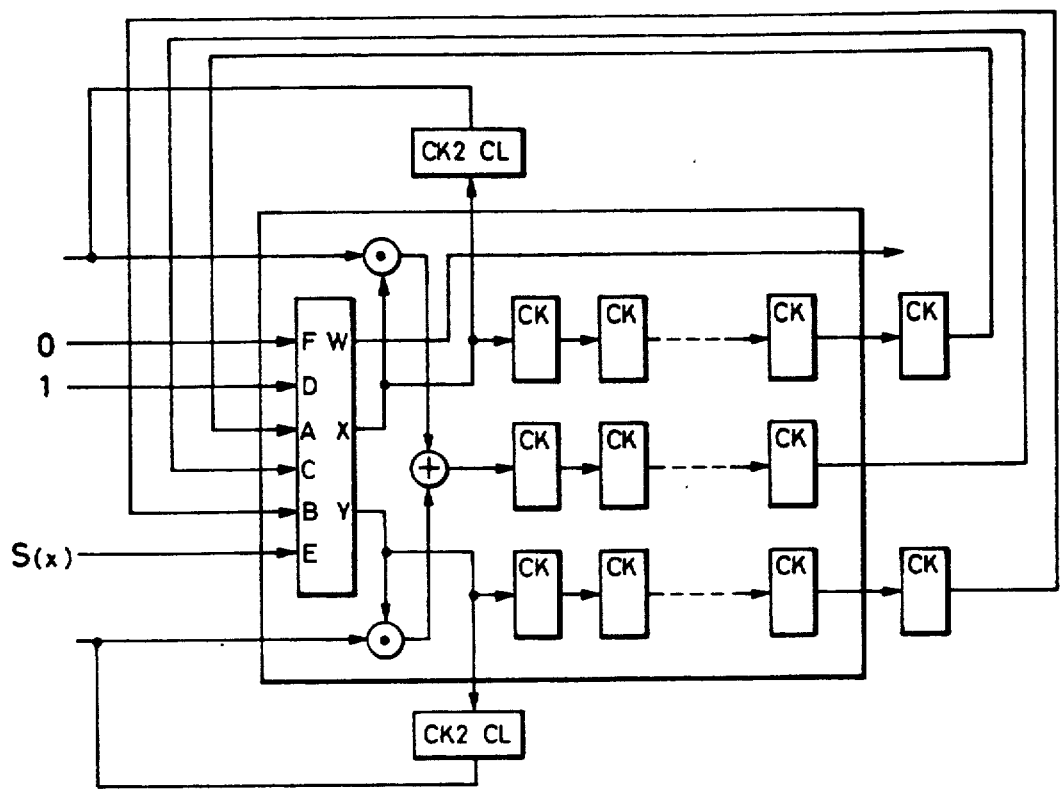
FIG. 71 is an illustration of the GCD generating circuit making use of the PE shown in FIG. 63.
FIG. 72 is an input timing chart of the GCD generating circuit shown in FIG. 71.

This arrangement employs a selector which sets the select signals as S1,2=11 so as to allow D and E inputs to be output from X and Y outputs, only when the syndrome polynomial S(x) (or M=1) and $x^{2t}$ (or L=0) are input. Table 10 in FIG. 69 shows the combinations of the selector outputs. When both the A(B) and L(M) are processed by a single processing section, it is possible to control the select signals S1 to S4 as shown in FIG. 72 by making use of the PE shown in FIG. 71, thereby enabling the input of A = $x^{2t}$, B = S(x), L = 0 and M = 1. Table 11 in FIG. 72 illustrates the combinations of the selection signals. The #2t+2 PE shown in FIG. 105 has a significance only in the selection of signal by the selector. This PE therefore can be operated by the W output of the PE shown in FIG. 71, so that the number of the processing cycles is reduced to 2t+1. The selection signal for the #2t+1 PE is set as S4=1 when the condition of degB<t is met so that B input is output from W.

Figure 105:
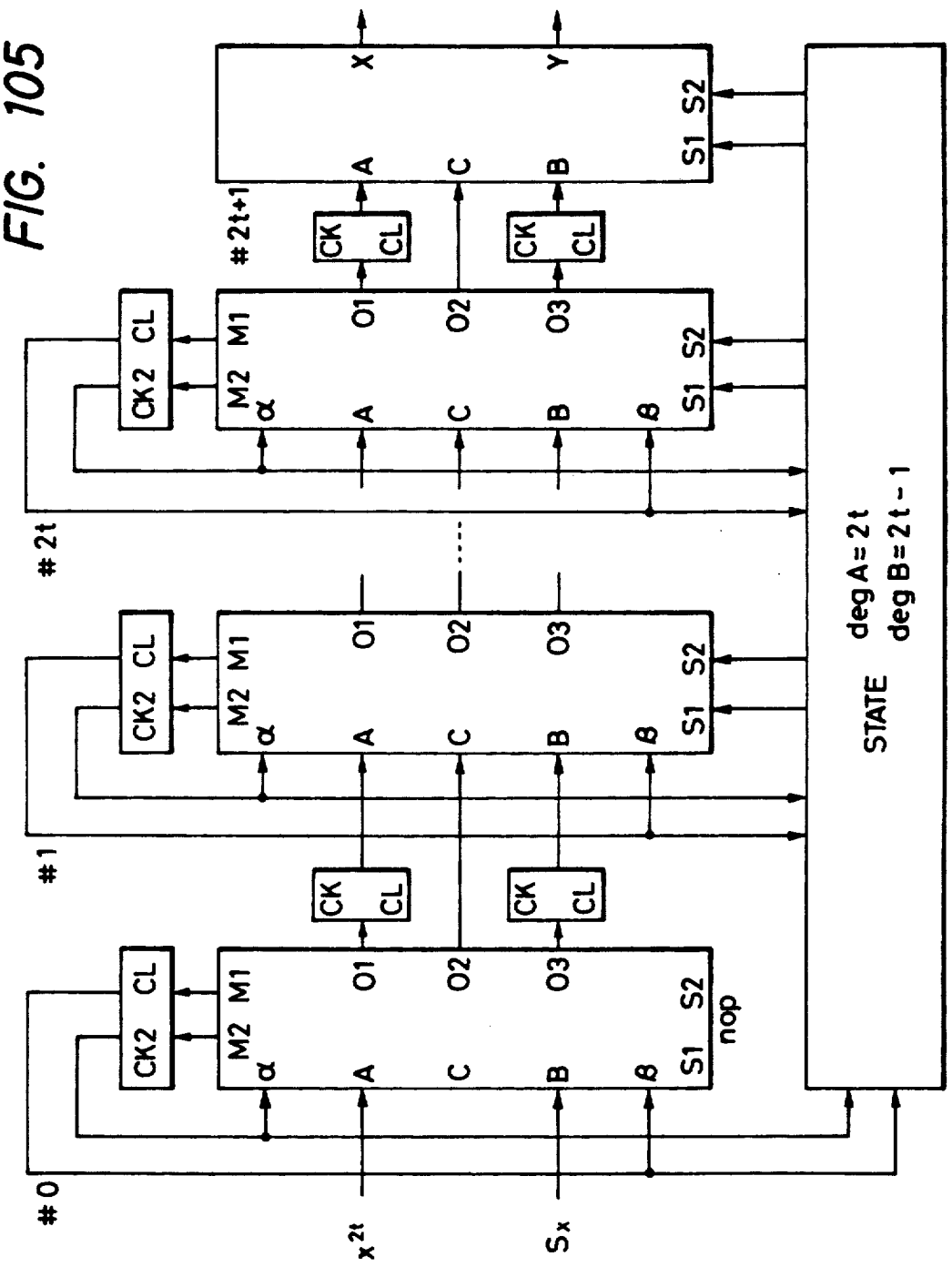
FIG. 105 is a connection diagram of the conventional GCD generating PE.

In this case, since the process shown in FIG. 105 is executed for each of m stages, the processing speed is (16/2t/m)Mlps. For instance, on the condition of t=8 and m=2t, the circuit scale is 3300 gates and the processing speed is 1/16 Mlps=n/16 Mwps.

Figure 73:
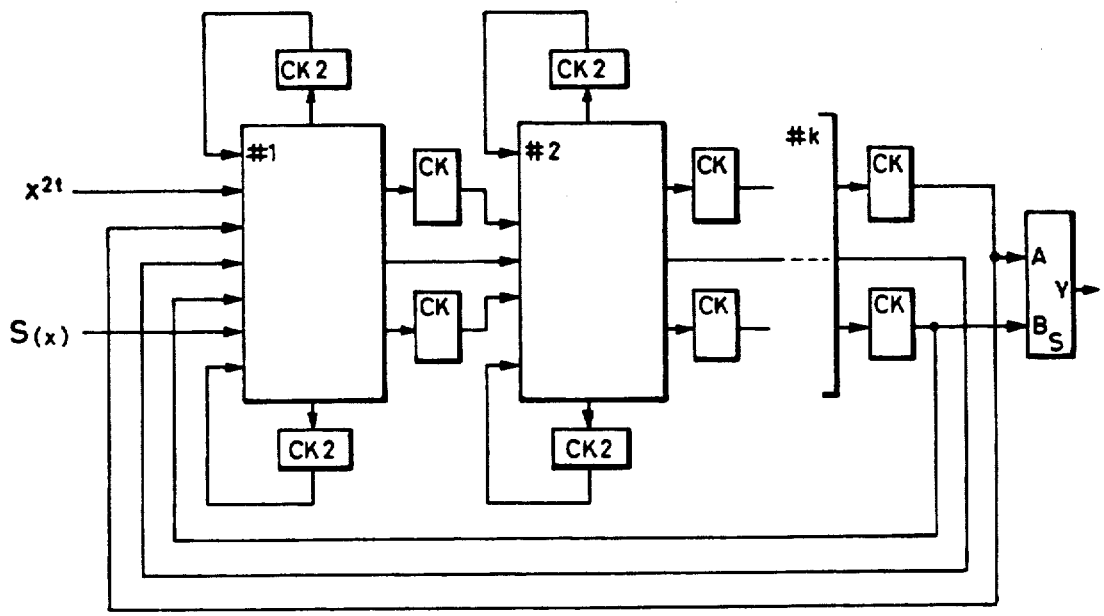
FIG. 73 is an illustration of a GCD generating circuit employing an optimized form of the PE shown in FIG. 63.

When the process is conducted not by a single PE, but by a plurality of PEs, the PEs of the type shown in FIG. 70 are connected in a manner shown in FIG. 73. In this case, in order to operate the PEs while circulating the coefficient data, it is necessary to feed the output of the final PE to the first PE. Representing the number of the PEs by k, the whole process is divided into (2t/k) portions so that each PE is required to have m=(2t/k) stages. The circuit scale of the circuit shown in FIG. 73 therefore, is (2t/m)*(700+(3m+4)*50) gates.

Figure 74:
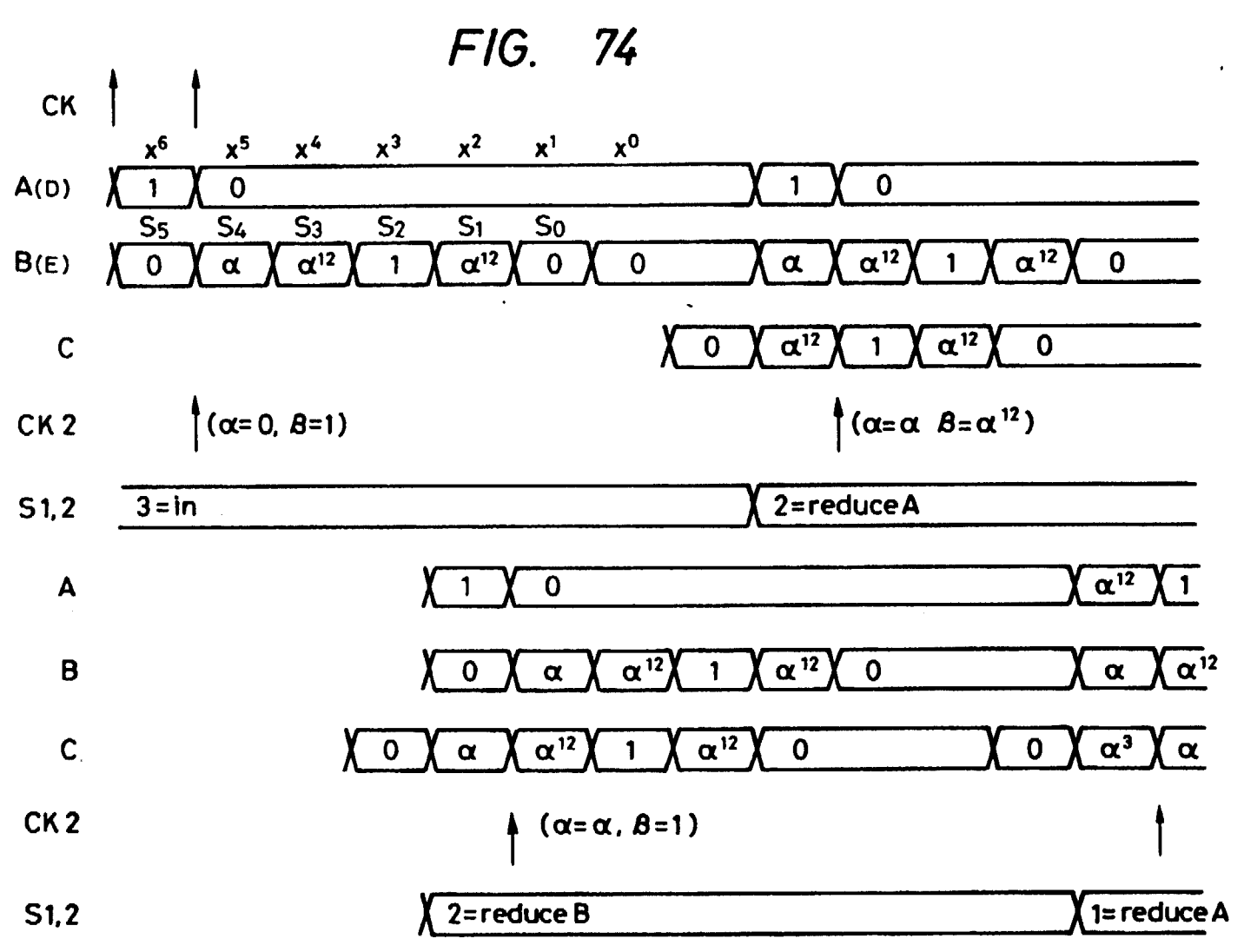

FIG. 74 shows the flow of signals when the circuit employs a pair of PEs. In this case, since the number m of the stages of registers is t (m=t), the processing speed is 2/16 Mlps, while the circuit scale is 1950*2=3900 gates. On the condition of m=1, the required number of PE is k=2t, while the processing speed is 16 Mlps. In this case, since a feed back is conducted from the final PE to the initial PE, 2t+1 times of processing operation can be performed by 2t units of PE. If the number of PEs is made to correspond to the number of the processing times which is 2t+1 so as to obtain a systolic connection, a construction which is the same as that shown in FIG. 105 can be used, because in this case, there is no need for the signal feedback. In this case, the 2t+2 PE serves as a selector.

Section for Generating Error Position and Error Value

As in the case of the step 1), the following cyclic algorithm and reduced formulae can be used in Step 3).

$$f = (x) = f_{t-1} * x^{t-1} + f_{t-2} * x^{t-2} \ldots + f_1 * x + f_0$$
$$= (\ldots ((f_{t-1} * x + f_{t-2}) * x + f_{t-3}) * x + \ldots + f_1) * x + f_0)$$

$$Z_0 = 0$$
$$Z_j = Z_{j-1} * x + f_{t-j} (j=1, \ldots, (t))$$
$$f(x) = Z_t$$

In order to miniaturize the circuit, the multiplier 3 and the register 5 are omitted as in Step 1). In the circuit shown in FIG. 46, the input of $a^{-i}$ (i=n−1, ..., 0) is merely set to #1 to #t PEs without changing values, as in the case of Step 1). Therefore, the values $a^{-i}$ (i=n−1, ..., 0) are input cyclically such that one value of $a^{-i}$ is maintained through each period of j=1 to j=m.

Figure 75:
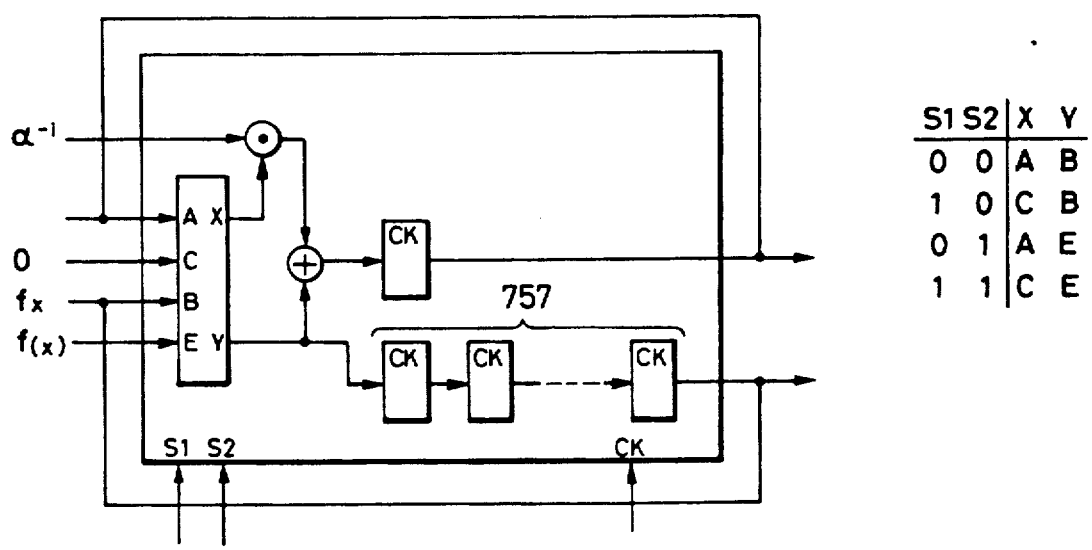
Figure 76:
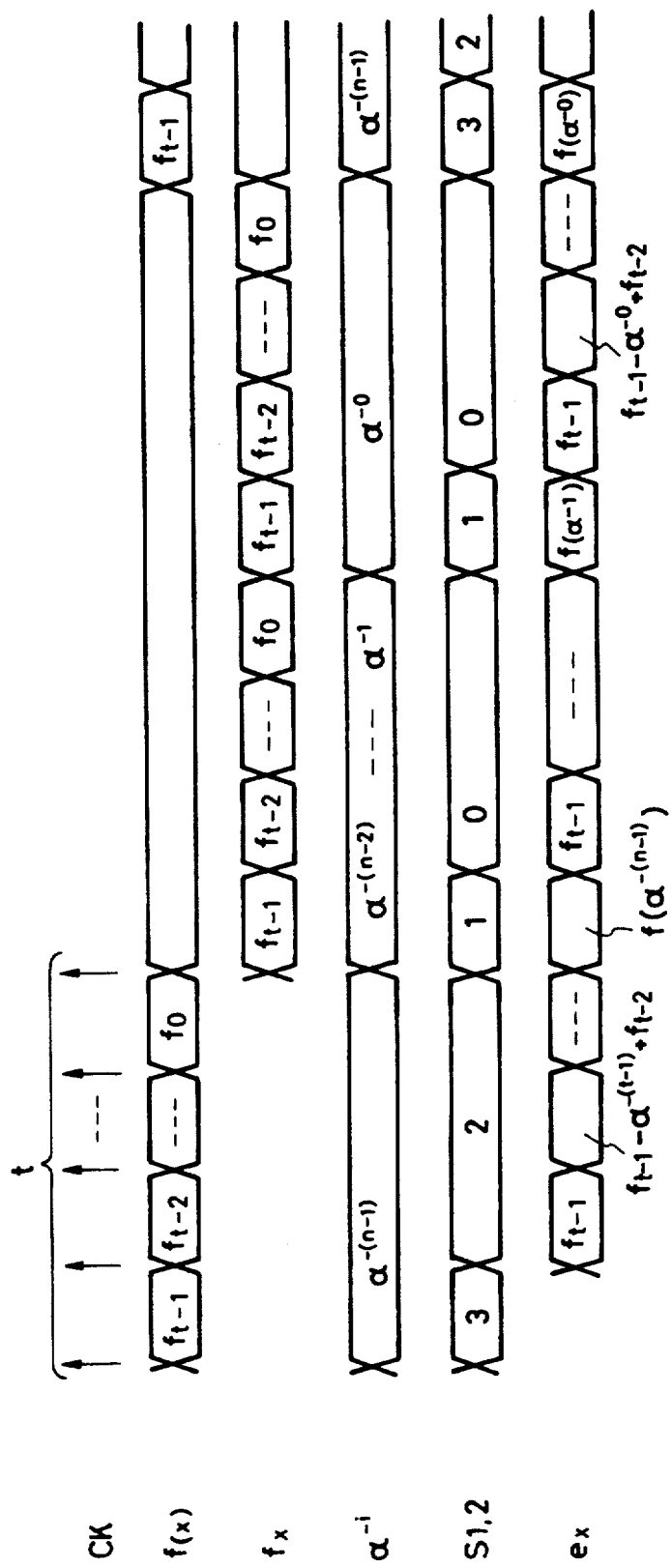
FIG. 76 is a timing chart illustrating the operation of the error evaluation circuit shown in FIG. 75.

As in the case of Step 1), the coefficient of $t_j$ requires that the input of $f_{t-j}$ (j=1 ..., m) has to be conducted cyclically for the successive periods. Considering the output from GCD generating section, the coefficient $f_{t-j}$ (j=1, ..., t) is output only once and not repeatedly. Therefore, PEs are arranged as shown in FIG. 75 by main use of a selector capable of selecting combinations of outputs in accordance with the selection signals S1, S2 as shown in the Table, as well as m stages of registers, and signals are transmitted as shown in FIG. 76.

When the coefficient $f_{t-j}$ (j=1, ..., t) is being output from the GCD generating section, the selection signal is set as S1, 2=11 only when $f_{t-1}$ is being input and then the selection signal is changed to S1,2=01 so that the coefficients $f_{t-j}$ (j=1, ..., t) are successively output from the Y output and input to the register row 757.

This output is fed back to the B input. By setting the selection signal as S1,2=10 only when $f_{t-1}$ is being input and then changed to S1,2=00, so that the coefficients $f_{t-j}$ (j=1, ..., t) is output from the Y output and input to the register row 757. By repeating this operation, it is possible to attain periodical input of the coefficients $f_{t-j}$ (j=1, ..., t), so that the process to be conducted by m units of PE can be conducted by a single PE. Since it is required to hold the inputs $a^{-i}$ the number of which corresponds to the number m of stages of the register, the processing speed is (16/m)Mwps.

The scale of circuit necessary for 1 PE is (400+(m+1)*50) gates.

A symbol m represents the number of stages of the registers. When the whole process is to be conducted by a single PE, number m is 1 (m=1). It is, however, to be noted that three sets of PE are necessary, one for the processing $\omega(x)$, one for the processing $\sigma(x)$ and one for the processing of $\sigma'(x)$. For instance, when the correction capacity t is 8 (t=8), the circuit scale is 3*850=2550 gates and the processing speed is 2 Mwps.

Figure 77:
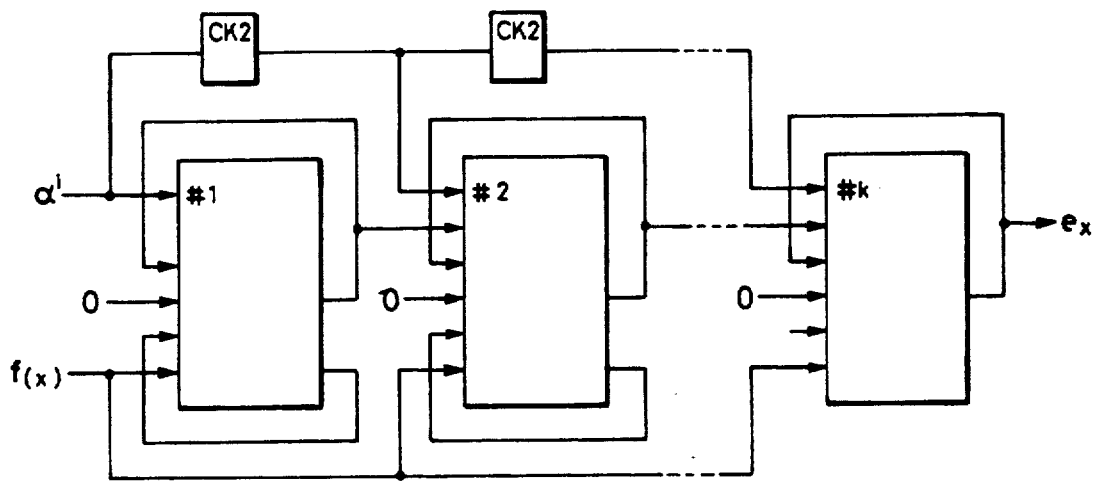
FIG. 77 is a connection diagram of the error evaluation circuit shown in FIG. 75.

When the whole process is conducted not by a single PE, but by a plurality of PEs, the PEs of the type shown in FIG. 75 are connected in a manner shown in FIG. 77. In this case, for the purpose of delaying the $a^{-i}$ for the successive PEs by a predetermined period, it is necessary to employ a register which is controlled by a clock CK2 which is generated once for each period.

Representing the number of PEs employed by k, the whole process is divided into (t/k), so that each PE is required to have registers m=(t/k). Therefore, the circuit shown in FIG. 77 has a circuit scale of (t/m)*(400+(m+1)*50) gates.

Figure 78:
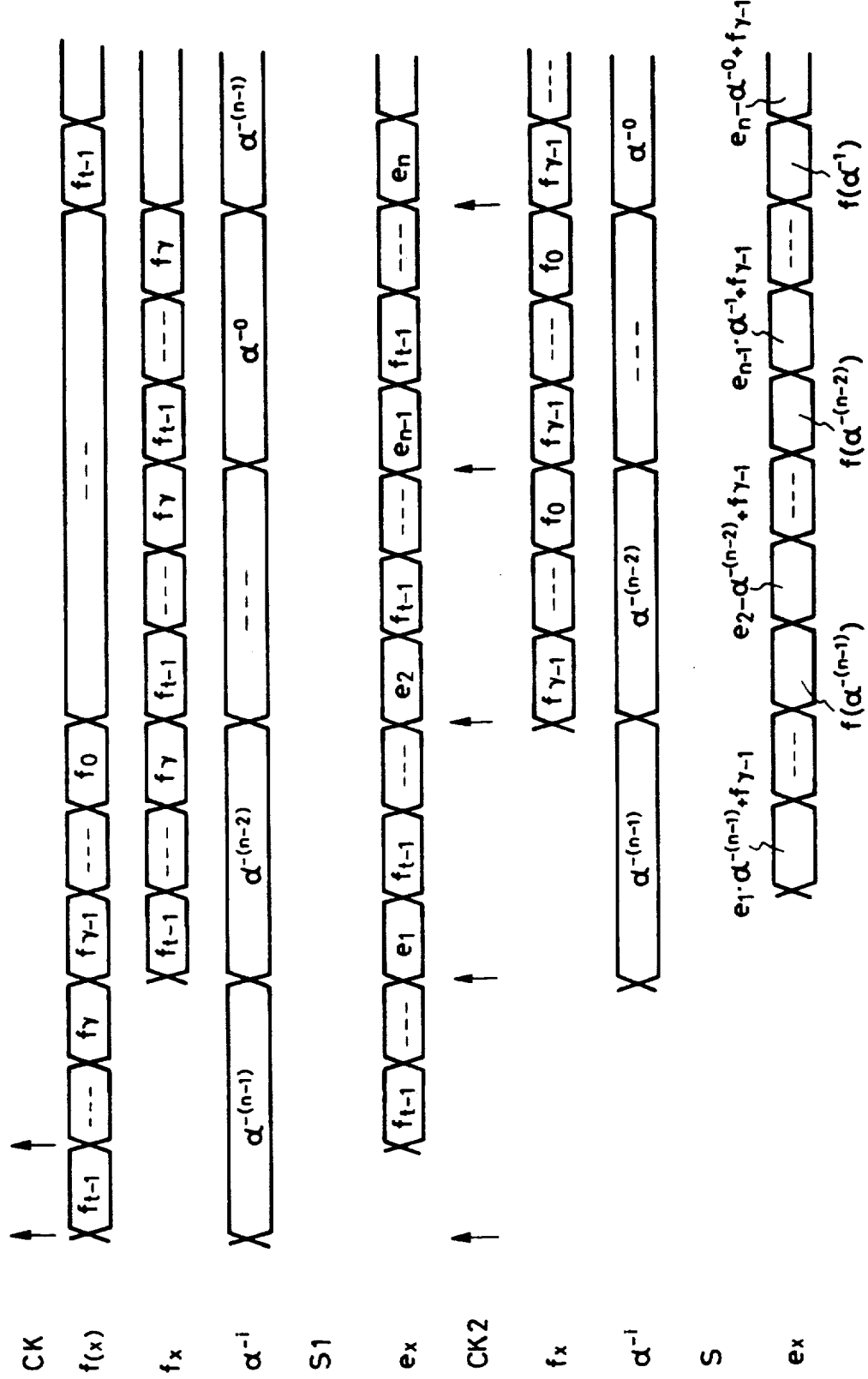
FIG. 78 is a timing chart employing a pair of PEs shown in FIG. 75.

FIG. 78 shows the flow of signals as obtained when the circuit is composed of a pair of PEs. In this case, since t is 8, the number of stages is given by m=(t/2)=4, so that the circuit has a circuit scale of 3*2*650=3900 gates, and the processing speed is 4 MWps.

When the stage number m is 1, the number of the PEs required is given as k≦t. In this case, since the condition of CK2=CK is met, the register controlled by CK2 is equivalent to the register 685. The construction of this arrangement therefore becomes identical to thât shown in FIG. 46 except for the portion for allocating $f_{t-j}$, and the processing speed is as high as 16 Mwps.

Figure 79:
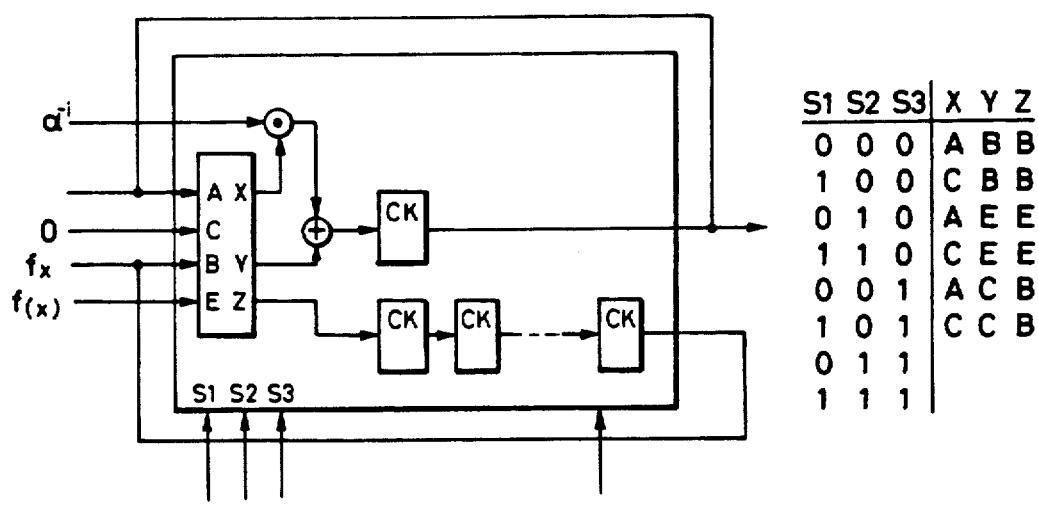
FIG. 79 is an illustration of an error evaluation circuit employing an optimized form of the PE of the invention shown in FIG. 75.

FIG. 79 shows the construction of a single PE which is capable of processing both $\sigma(x)$ and $\sigma'(x)$, while FIG. 80 shows the flow of the signal shown in FIG. 79. In Step 3), the period of one cycle of operation is t, so that a single PE can be used twice. The fact also is utilized that the coefficient of $\sigma'(x)$ makes use of the coefficient of $\sigma(x)$.

With this arrangement, it is possible to execute Step 3) by a pair of PEs. In this case, as shown in FIG. 80, the processing of $\sigma(x)$ and $\sigma'(x)$ is conducted at a period of 2t, and, by adopting an arrangement shown in FIG. 81, the output of $\omega'(x)$ also can be obtained for each of the period 2t. In this case, a selector which provides output combinations as shown in the Table is used and the selection signal is set as S1 ... 3=001 only when the Y output is zero. In this case, the circuit scale is 2×850=1700 gates, because a pair of PEs are used. The processing speed is given by 2 Mwps/2=1 Mwps.

Erase Position Polynomial Generating Section

In this section, $S(x)*\lambda(x)$ necessary for the erasure correction is generated in response to the syndrome polynomial coefficient output $S(x)$ from Step 1).

The description will e first commenced with the generation of erasure position polynomial $\lambda(x)$.

$$\lambda(x)=(1-Y_1*x)*(1-Y_2*x)\ldots(1-Y_s*x)$$

As is the case of the preceding sections, the polynomial $\lambda(x)$ is reduced into the following formulae.

$$Z_0=1$$

$$\begin{aligned}Z_i &= (1-Y_i*x)*Z_{i-1}\\ &= Y_i*Z_{i-1}*x+Z_{i-1}(i=1,\ldots,s)\end{aligned}$$

$$\lambda(x)=Z_x$$

Figure 84:
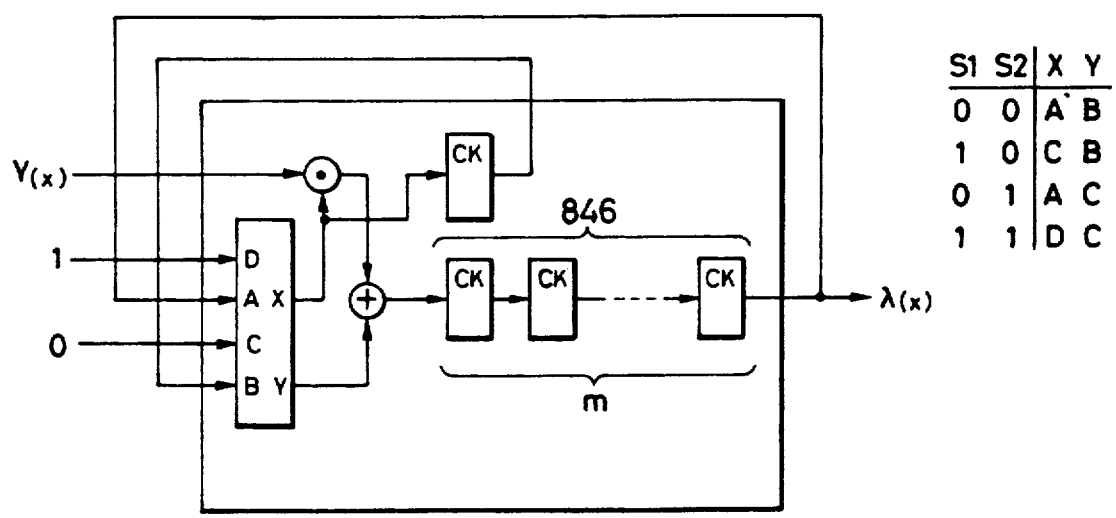
FIG. 84 is an illustration of an erasure position polynomial generating circuit employing an optimized form of the PE shown in FIG. 63.
Figure 85:
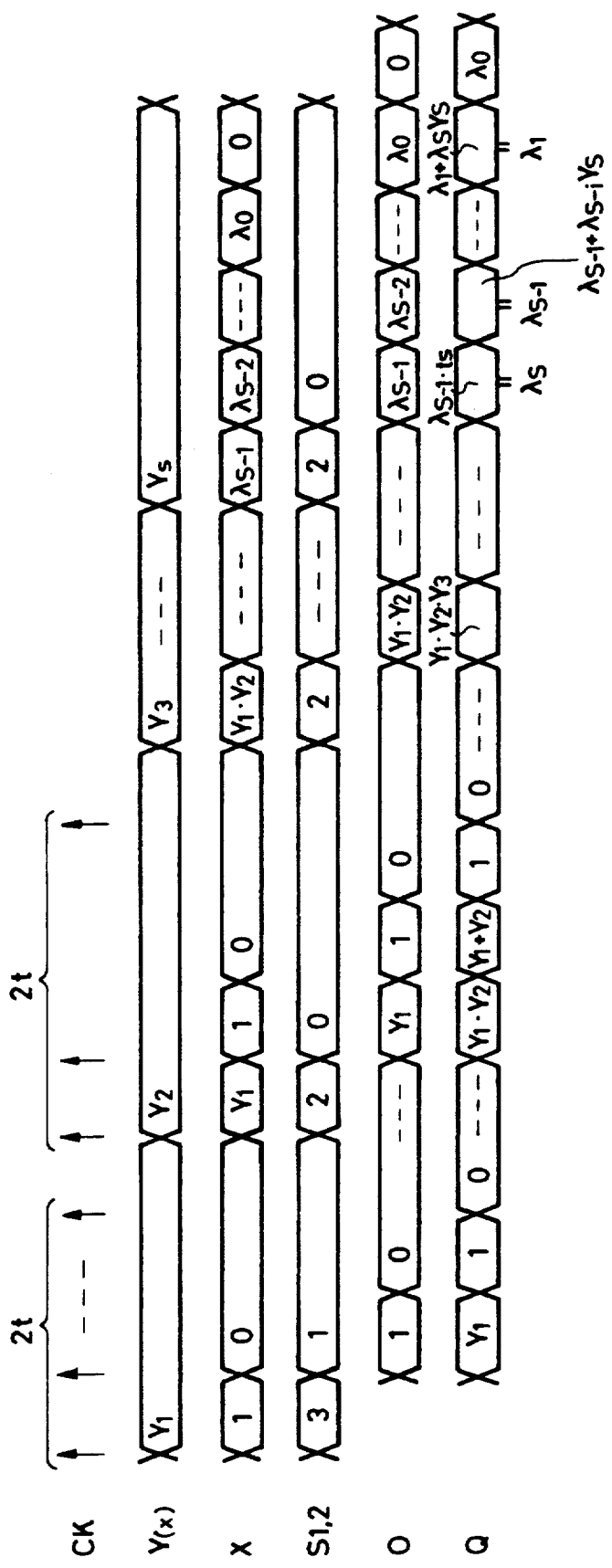
FIG. 85 is a timing chart illustrating the operation of the PE shown in FIG. 84.

The number of the multipliers and the registers are reduced to obtain a smaller circuit size. The numbers of the multiplier and the register are made to correspond to the number of stages of the register. At the same time, a register for delaying the $Z_{i-1}$ input by one clock is prepared. Thus, the PE has a construction as shown in FIG. 84. The circuit scale of each PE is $(400+(m+1)*50)$ gates, where m represents the number of stages of the registers. Flow of signals in this PE is shown in FIG. 85.

Signals $Y_i(i=1,\ldots,s)$ are input in such a manner that one value of $Y_i$ is maintained throughout a period corresponding to the number m of stages of the register in the single PE. In this embodiment, m is determined as $m=2t$. As the first step, when $Y_i$ is input, the selection signal is set as $S1,2=11$. The D input $Z_0=1$ is input to x, while the C input 0 is input to Y, and the result of computation is input to the register row 846 by the next clock. Thereafter, the selection signal is set as $S1,2=10$, so that the C input 0 is input to X while ZY receives the A input which has been delayed by one clock. Thus, the result of computation $Z_0=1$ is input to the register row 846 in accordance with the next clock. The result of computation conducted in synchronism when the next clock is zero and the same applies also to subsequent clocks. Therefore, signals 0 are input to the register row 6 in synchronism with these clocks.

When a time corresponding to the one period is over (when $Y_2$ is input), the result $Z_1=Y_1*x+1$ (degree x represents the sequence of signals) of the preceding computation is derived from the register row 6. Then, the selection signal is set as $S1,2=01$ and the coefficient $Y_1$ of the highest degree of the result of preceding computation is input to X through the A input, and the C input 0 is delivered to Y, whereby $Y_1*Y_2$ is computed and the result is input to the register row 846 in accordance with the next clock.

Thereafter, the selection signal is set as $S1,1=00$ so that the next coefficient 1 of $Z_1$ is passed from A input to X, while the coefficient $Y_1$ of the highest degree of $Z_1$ delayed by one clock is passed from B input to Y, so that the computation result $Y_1+Y_2$ is input to the register row 846 by the next clock. In this state, X outputs 0, while Y delivers the next coefficient 1 of $Z_1$. The computation result 1 is input to the register row by the next clock. Thereafter, computation results are all zero, so that zeroes are input to the register row. The operation performed when $Y_2$ is input is conducted for the coefficients $Y_3$ onwards. After inputting $Y_5$, the polynomial $\lambda(x)$ is output from the register row 846 starting from the coefficient of the highest degree.

Since the condition of $s\leq 2t$ is met, the input of the coefficient $Y_i=0$ $(i=s+1,\ldots,2t)$ suffices.

In this case, therefore, a processing speed of $(16/2t/m)$Mlps is obtained. For instance, if all the process has to be completed under the condition of $t=8$, the circuit scale is 1250 gates and the process speed is 1/16 Mlps.

Figure 86:
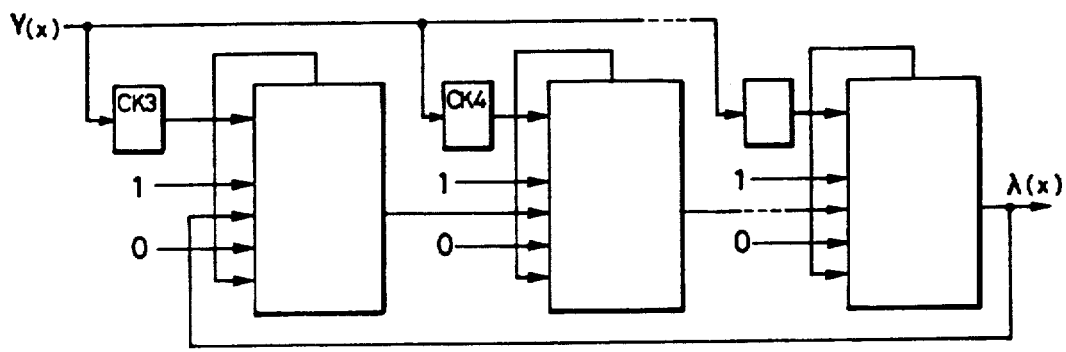
FIG. 86 is a connection diagram of the erasure position polynomial generating circuit shown in FIG. 84.
Figure 87:
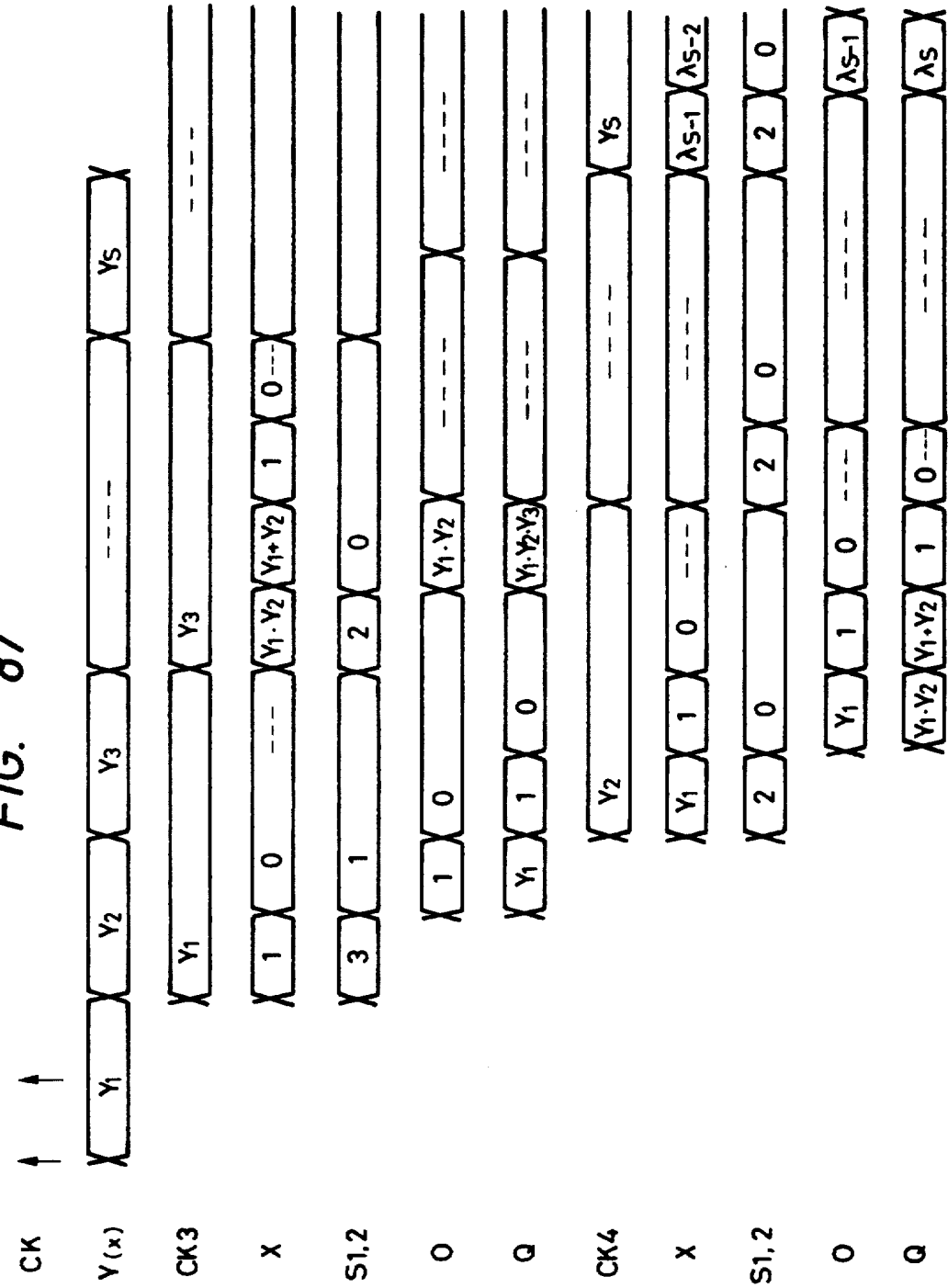
FIG. 87 is a timing chart illustrating the operation of a unit having a pair of PEs shown in FIG. 84.

When the whole process is conducted not by a single PE, but by a plurality of PEs, the PEs shown in FIG. 84 are connected in a manner shown in FIG. 86. In order to hold the value of Yi for a period corresponding to 2t clocks, a register is used for each PE for the purpose of setting $Y_i$. Representing the number of PEs by k, the whole process is divided into $(2t/k)$ portions, so that each PE is required to have m stages of registers $(m=(2t/k))$. Thus, the circuit shown in FIG. 86 is required to have a circuit scale of $(2t/m)*(400+(m+1)*50)$ gates. FIG. 87 shows the flow of signals obtained when the circuit employs a pair of PEs. In this state, the circuit has a scale of $850*2=1700$ gates, and the processing speed is 2/16 Mlps.

When the number m of stages is 1, the number k of the PEs required is expressed as $k=2t$, and the processing speed is $(16/2t)$Mlps. Thus, the circuit is equivalent to the circuit explained before in connection with FIG. 47.

A description will be made hereinunder as to the multiplication circuit for computing $S(x)*\lambda(x)$. The multiplying operation $C(x)=A(x)*B(x)$ is reduced as follows, as in the case of the preceding sections.

$A(x)$ is expressed as follows:

$$A(x)=a_{m-1}*x^{m-1}+a_{m-2}*x^{m-2}+\ldots+a_1*x+a_0$$

Then, $C(x)$ is expressed as follows:

$$C(x)=a_{m-1}*B(x)*x^{m-1}+a_{m-2}*B(x)*x^{m-2}+\ldots\\+a_1*B(x)*x+a_0B(x)$$

Thus, the computation $C(x)$ is reduced, as follows.

$Z_0=0$ $Z_j=Z_{j-1}*x+B(x)*a_{m-j}$ $(j=1,\ldots,m)$ $C(x)=Z_m$

Figure 88:
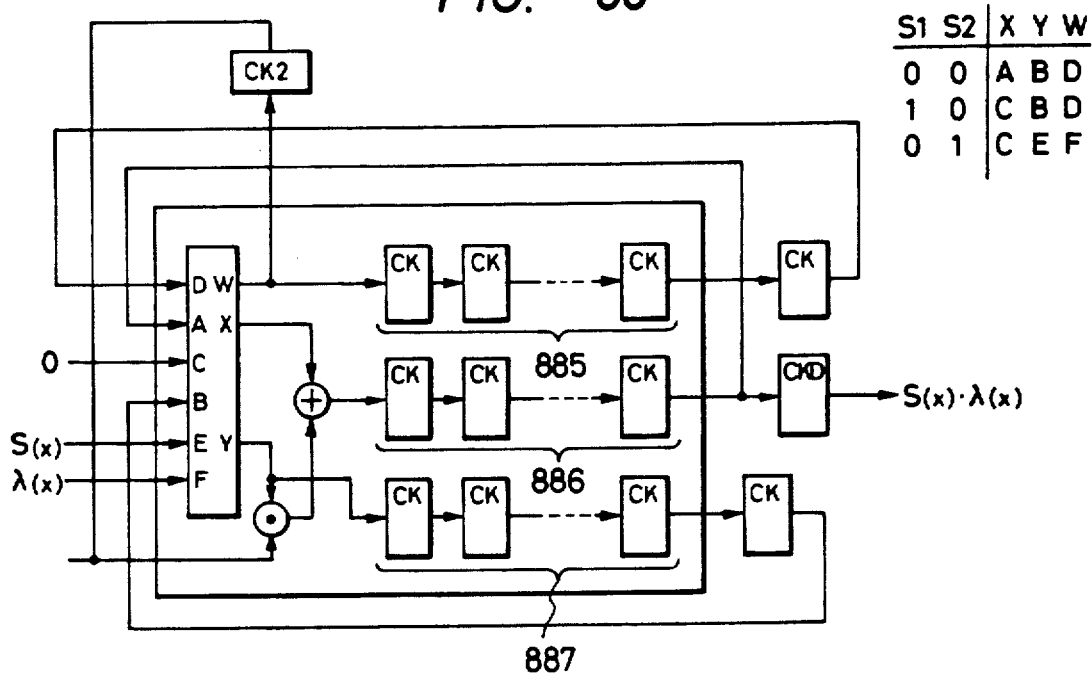
FIG. 88 is an illustration of a multiplying circuit employing an optimized form of the PE shown in FIG. 63.
Figure 89:
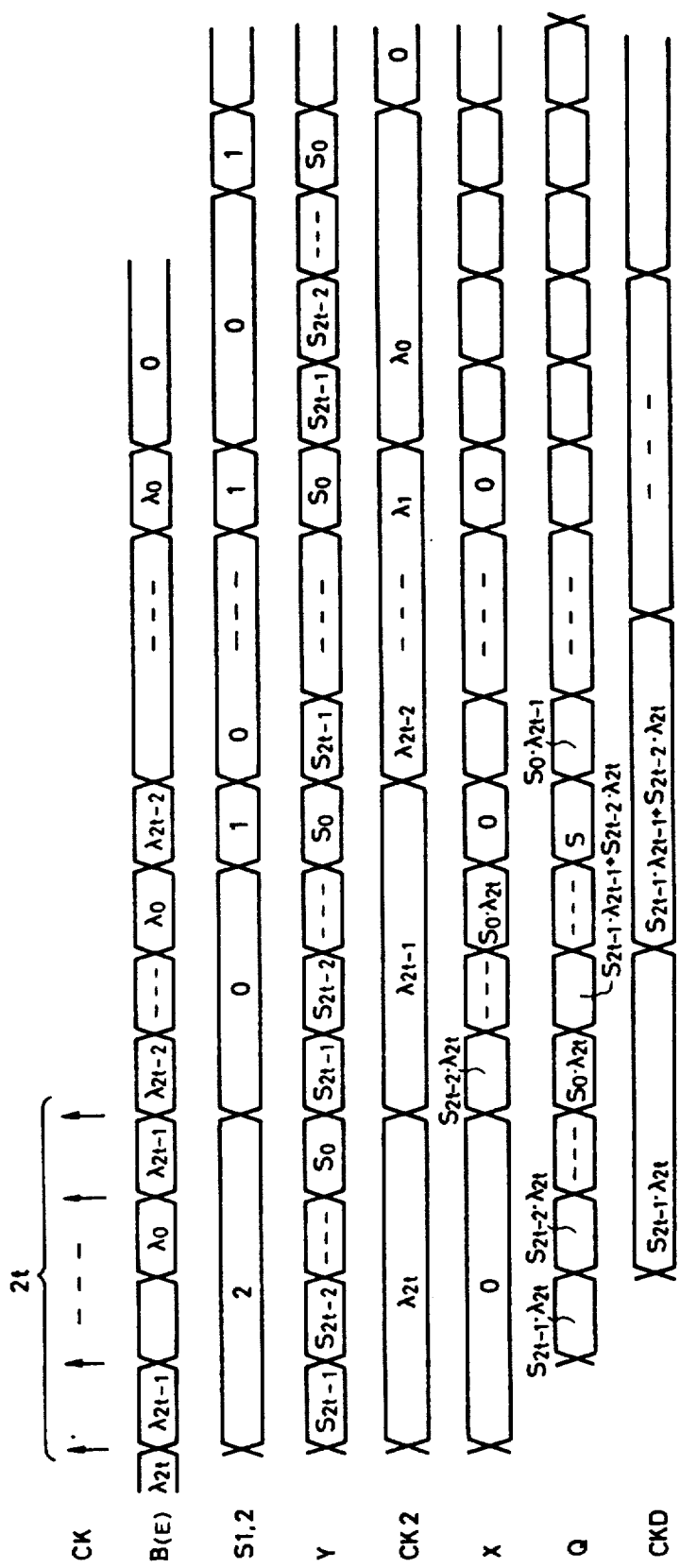
FIG. 89 is a timing chart illustrating the operation of the PE shown in FIG. 88.

Therefore, $a_{m-j}$ is maintained while $B(x)$ is being input so that $Z_j=Z_{j-1}*x+B(x)*a_{m-j}$ is computed. The result of computation is input to the register row 6 and the result of the computation is fed back as $Z_{j-1}$ when the period is over. The polynomials $S(x)$ and $\lambda(x)$ are input only once at the transfer rate determined by the basic clock CK, from the syndrome generating section and the error position polynomial generating section. In this section, therefore, repetitional input is realized by making use of the register rows 885 and 887, and the set value is held by means of a register which is controlled by CK2. The $B(x)$ output from the register row 887 has to be fed back at a timing which is delayed by one clock after the $Z_{i-1}$ output of the register row 886, so that the arrangement of PEs as shown in FIG. 88 is obtained. FIG. 89 illustrates the flow of signals as obtained under the conditions of $B(x)=S(x)$, $a_{m-i}=\lambda 2_{t-i}$ $(i=0,\ldots,2t)$. (The number of stages of registers in each PE is expressed as $m-1=2t-1$.)

As the first step, the selection signal is set as $S1,2 \leq 01$ and $\lambda(x)$ is input from the F input to the register row 885 through the W output. The coefficient $\lambda_{2t}$ of $\lambda(x)$ is stored in the register which is controlled by CK2 and is set in the input of the multiplier. The S(x) and λ(x) is input to E after a delay of one clock and is input to the register row 887 through the output Y. Meanwhile, X outputs the C input 0. As a result, the $\lambda_{2t}*S(x)$ is computed and input to the register row 886. In this state, the coefficient $\lambda_{2t}*S_{2t-1}$ has been computed and output after being latched by a CKD. One period is expressed as m (m=2t), and the selection signal is set as S1, 2=00 after the period is over. S(x) which has been fed back from the m stages of registers is input through B, and is input again to the register row 887 through Y. On the other hand, λ(x) the coefficient of the highest degree of which has been offset by the m stages of register rows 995 is fed back and input to W. In CK2, therefore, the next coefficient $\lambda_{2t-1}$ of λ(x) is stored and set in the multiplier 3. At the same time, the result of the overall computation, the coefficient of the maximum degree of which has been shifted by the m−1 stage of the register rows 886, is fed back from A and is input in such a form that the coefficient of the primary degree has been offset with respect to B(x)=S(x). As a result, $Z_j=Z_{j-1}*x+B(x)*a_{m-j}$ is computed and input to the register rows 886. This operation is conducted until the computation is finished by the input of $\lambda_0$ to CK2. The computation result as the answer is neglected, because it is offset when fed back to the input. The computation result, therefore, is output by CKD after each computation. The coefficient of λ(x) also is offset when fed back to the input so that the coefficients are decreased by one. Such offset coefficients are not necessary so that the selection signal is set as S1,2=10 so that 0 is output to X,W.

After the completion of computation, the computation result as the answer still remains in the register row 6, so that the similar operation is repeated to consecutively shift the results of computation in the register row 88, and the computation result thus shifted is output from the CKD.

The circuit scale necessary for one PE is expressed by (400+3m*50) gates when the number of stages of the register in PE is expressed by m−1. The speed of processing including the period between completion of computation and completion of output is (16/4t/m)Mlps. When the whole process is completed by a single PE, the number m of stages of registers is 2t (m=2t). For instance, when the correction capacity t is 8 (t=8), the scale of the circuit is 2800 in terms of number of gate, and the processing speed is (1/32)Mlps.

Figure 90:
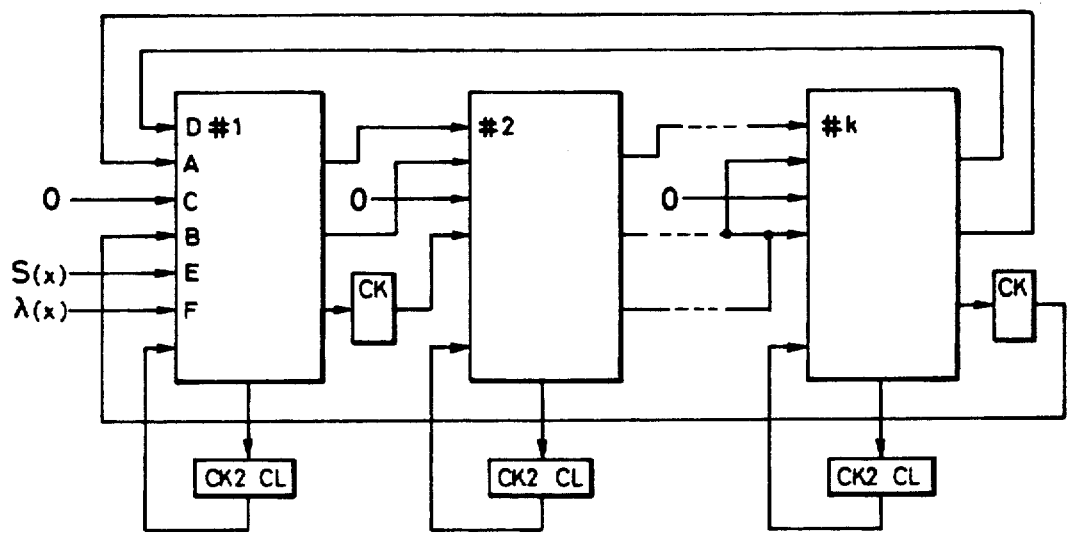
FIG. 90 is a connection diagram of the PE of the invention shown in FIG. 88.
Figure 91:
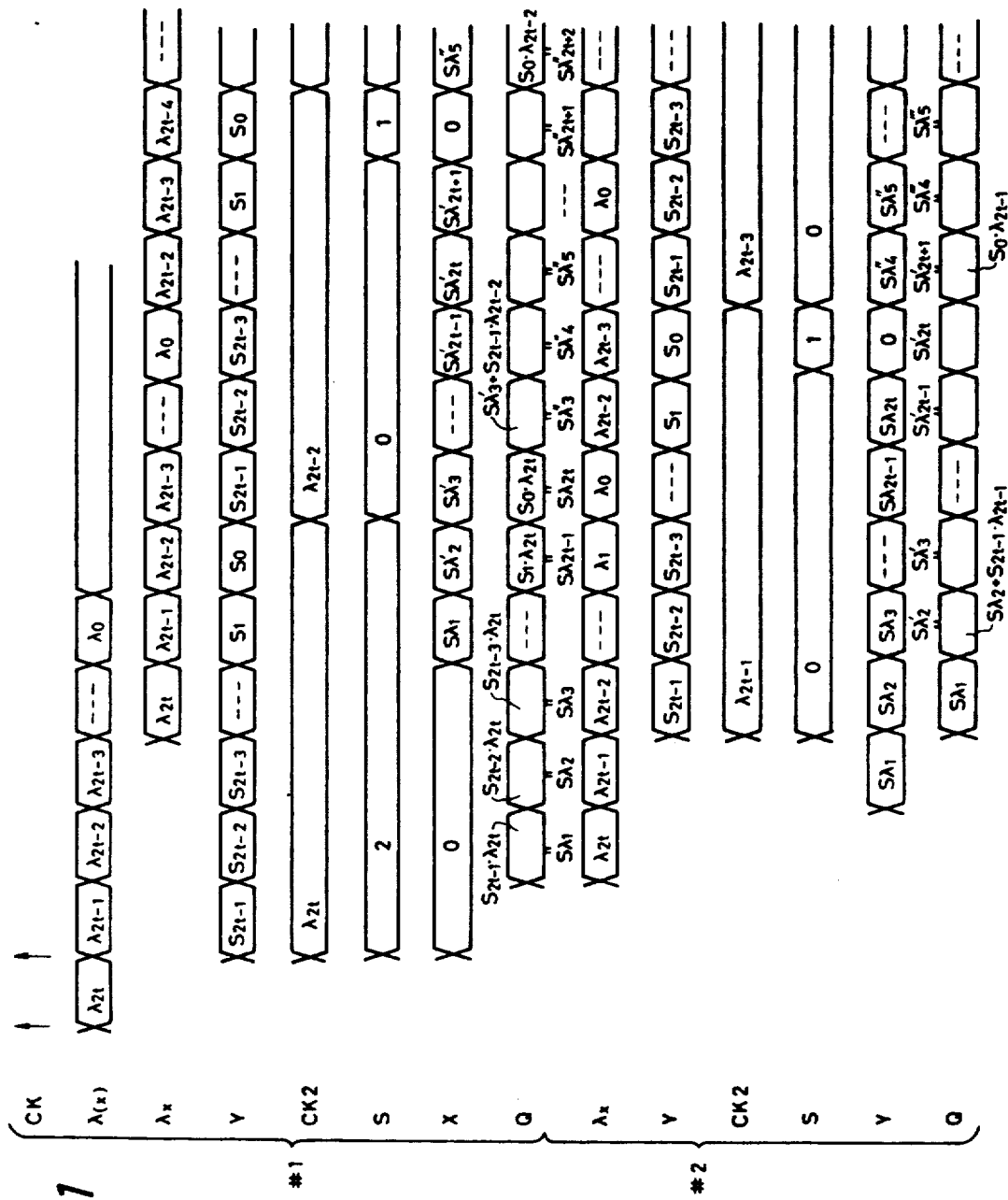
FIG. 91 is a timing chart illustrating the operation of a unit having a pair of PEs shown in FIG. 88.

When the whole process is conducted not by a single PE, but by a plurality of PEs, the PEs of the type shown in FIG. 88 are connected in a manner shown in FIG. 90. In order to hold the value of $a_{m-i}$ for a period of 2t clocks, it is necessary that each PE is provided with a register for setting $a_{m-i}$. In this case, therefore, the whole process is divided into (2t/k) portions so that each PE is required to have stages of registers of a number m which is given as m=(2t/k). Consequently, the circuit as shown in FIG. 90 has a circuit scale of (2t/m)*(400+3m*50) gates. FIG. 91 shows the flow of signals as observed when the system is composed of a pair of PEs. In this case, the circuit has a scale of 1600*2=3200 gates, and a processing speed of (1/16)Mlps.

In the case where only a single stage of registers is used, i.e., when m=1 is met, the number k of the PEs required is expressed by k=2t, and the processing speed is represented by (½)Mlps.

Coding Device

The coding operation is to form parity $P(x)=(P_{2t}, P_{2t}-1, \ldots, P_1)$ from the information $I(x)=(I_{k-1}, I_{k-2}, \ldots, I_0)$.

In other words, the coding operation is to obtain the following parity P(x) from a generated polynomial g(x) shown below.

$$g(x) = g_m * x^m + g_{m-1} * x^{m-1} + g_{m-2} * x^{m-2} \ldots + g_1 * x + g_0$$

$$P(x) = I(x)*x^m \bmod g(x)$$

Differential g'(x) is expressed as follows.

$$g'(x) = g_{m-1}*x^{m-1} + g_{m-2}*x^{m-2} \ldots + g_1*x + g_0$$

This formula can be divided into the following portions.

$Z_0 = I(x)$
$Z_i = g_m*Z'_{i-1} + Z_m*g'(x)$ (i=1, …, k) 'P(x)=$Z_k$

Figure 92:
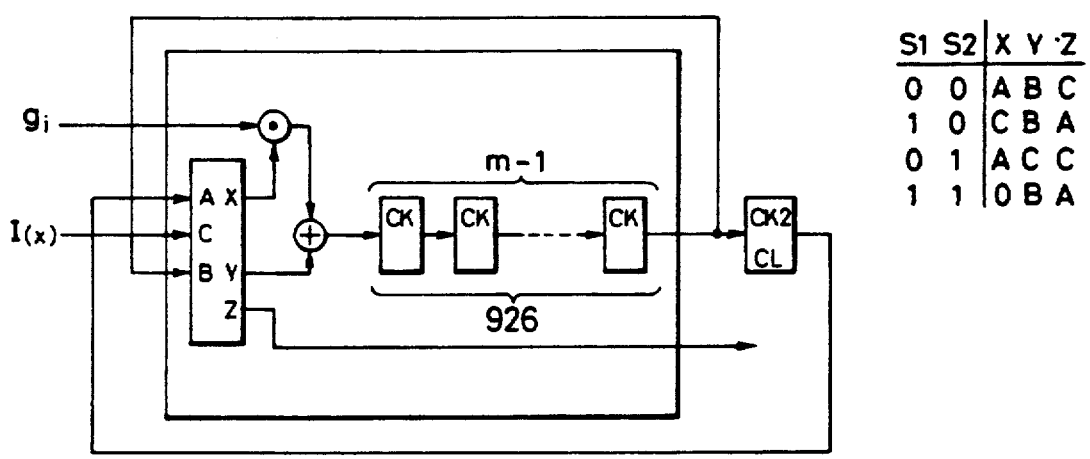
FIG. 92 is an illustration of a coding device having the optimized form of the PE shown in FIG. 63.

Where, $Z_m$ represents the coefficient of the highest order in the polynomial $Z_{i-1}$. $Z'_{i-1}$ also is a polynomial which is formed by removing the coefficient of the highest degree from the polynomial $Z_{i-1}$. Then, computation of $Z_m*g'(x)$ is conducted while holding $Z_m$ is g'(x). In this case, $g_m$ is assumed as being 1 and the PE is constructed as shown in FIG. 92.

The coefficient of g'(x) and $g_0$ are periodically input to the multiplier 2 through $g_i$ and $g_{m-1}$ at a period of m. The input $Z_m$ is held by a register controlled by CK2 (clock produced once in each period) and CL, and is input to A.

The polynomial $Z'_{i-1}$ is realized by outputting the result $Z_{i-1}$ of computation at a timing which is earlier by one clock than the period of the preceding computing result $Z_{i-1}$. Therefore, the stage of the register rows 926 is changed to me m−1, and the feedback is made to the B input. The information I(x) is input though C such that one value is held throughout one period.

Figure 93:
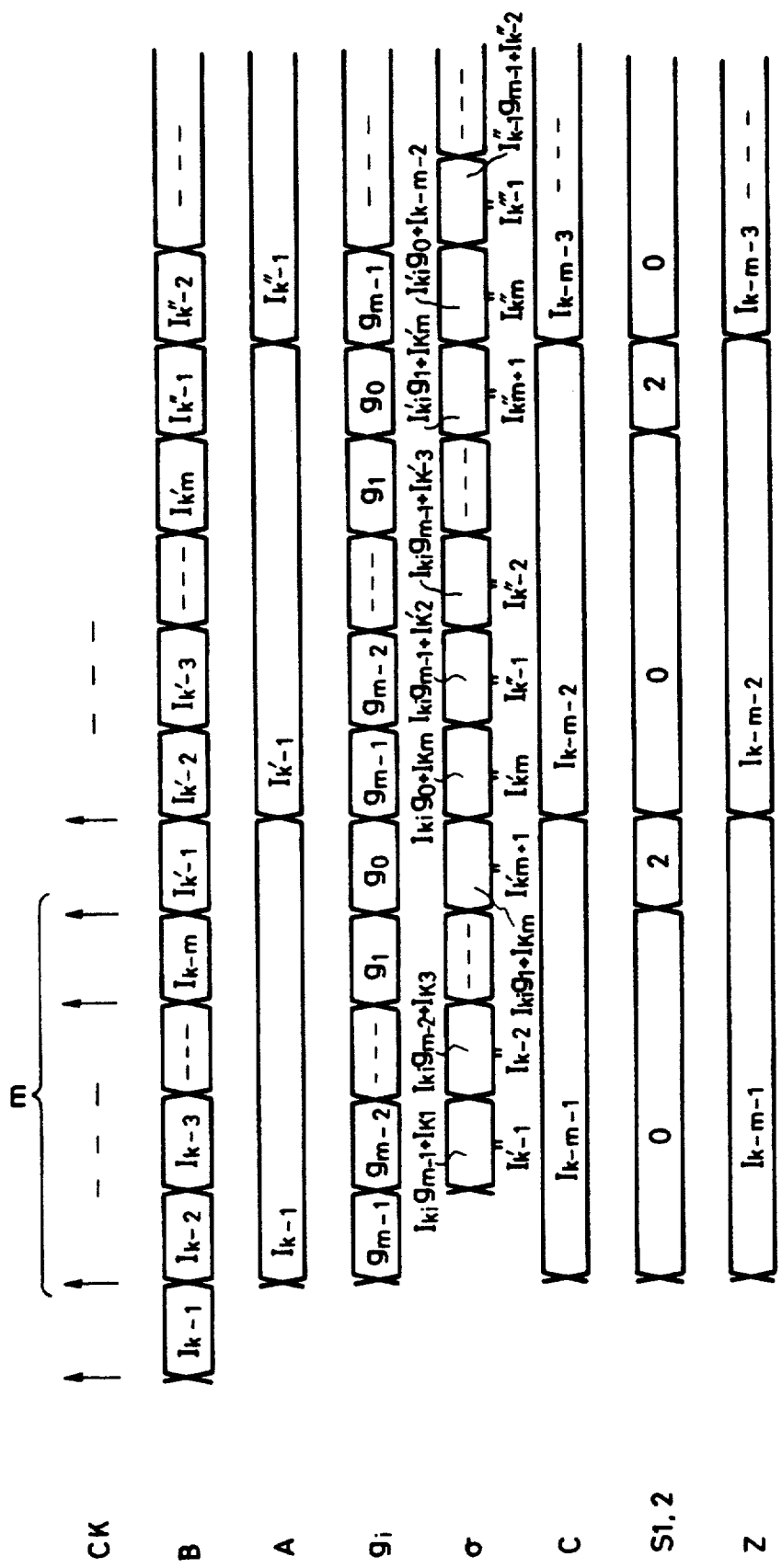
FIG. 93 is a timing chart illustrating the operation of the PE shown in FIG. 92 (during processing)

FIG. 93 illustrates the manner in which the coding is conducted. In the initial stage expressed by i=1, information symbol $I_{k-1}$ is held by the register controlled by CK2. It is also assumed that the information $I_{k-m-1}$ is input from the C input, while information symbols $I_{k-2}$ to $I_{k-m}$ are stored in the register row 6. In the computing section, the input $I_{k-1}$ coming from the A input is multiplied with g'(x) and the product is added to informations $I_{k-2}$ ro $I_{k-m}$ from the B input, as well as to the information $I_{k-m-1}$ from the C input.

The change-over between B and C inputs with respect to the Y output is controlled in accordance with selection signals S1,2 which is set as S1,2=00 when the B input is to be selected and as S1,2=01 when the C input is to be selected.

The computation result is expressed as $I'_{k-j} = I_{k-1}*g_{m-j} + I_{k-j-1}$ (j=1, …, m), from the term of the highest degree.

Similar computation is conducted for $I'_{k-1}$ down to i=k, for the successive informations starting from i=2, wherein the coding is completed.

Figure 94:
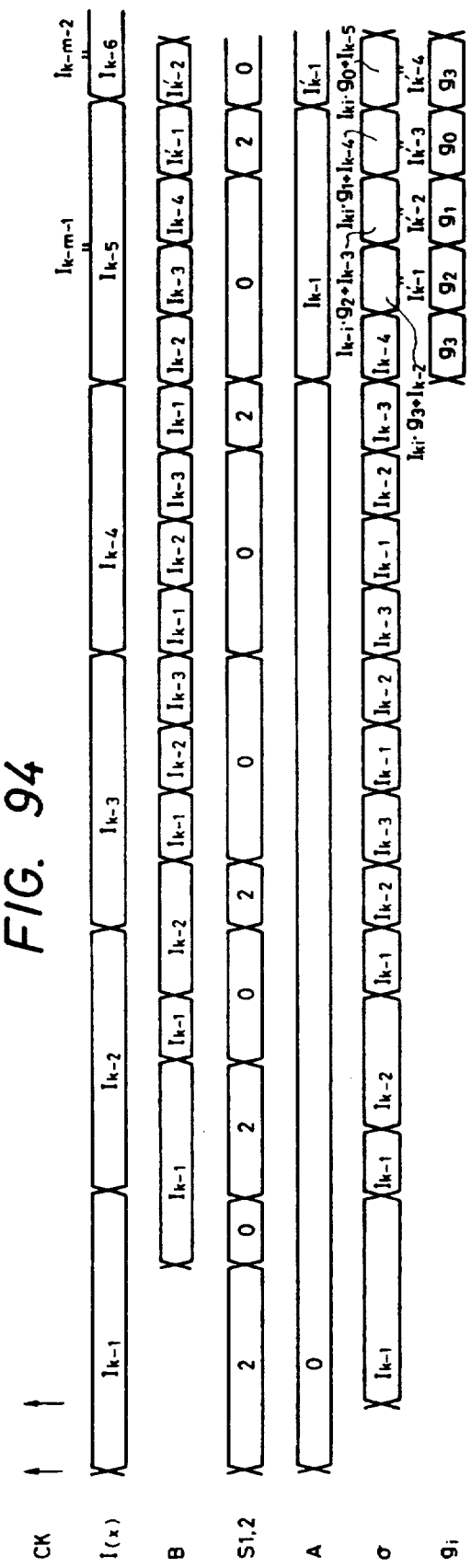
FIG. 94 is a timing chart illustrating the operation of the PE shown in FIG. 92 (during initial inputting)

When the number m of stages of registers is 4 (m=4), an arrangement as shown in FIG. 94 is formed in order to realize the initial stage. The input of information is conducted such that the value of the information is maintained throughout the period of between $I_{k-1}$ and $I_0$. As the first step, the selection signal is set as S1,2=01 so that the first receiving symbol $I_{k-1}$ is passed from C to Y. The CL of the register controlled by CK2 delivers 0 to the A input which is transmitted to and output from X. Since the number of stages of registers in the PE is $m-1$, $I_{k-1}$ is fed back to the B input at a timing which is one clock in advance of the period. In this state, the selection signal is set as S1,2=00, so that only the portion of the B input corresponding to one clock is output to Y. Thereafter, the selection signal S1,2 is reset to the initial state. Meanwhile, the next receiving symbol $I_{k-2}$ is received through C so that the register row 926 receives this symbol $I_{k-2}$ after receipt of a portion of $I_{k-1}$ corresponding to one clock. During inputting of $I_{k-2}$, the amount of offset between the symbol $I_{k-2}$ and the input fed back from the register row 926 corresponds to 2 clocks, so that the selection signal is set as S1,2=00. As a result, a portion of the information $I_{k-2}$ corresponding to one clock is selected after the symbol $I_{k-1}$. This operation is conducted down to $I_{k-m}$ so that $I_{k-1}$ to $I_{k-m}$ are accumulated in the register row 926. When $I_{k-m-1}$ is input, $I_{k-1}$ overflows their register row 926, but is latched by the register controlled by CK2, whereby the initial state is realized.

Figure 95:
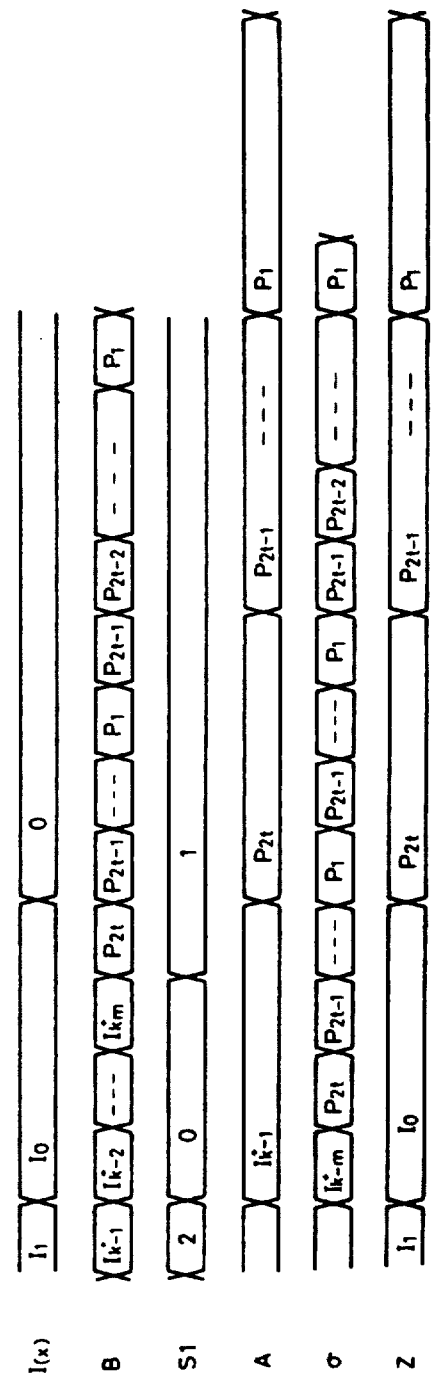
FIG. 95 is a timing chart illustrating the operation of the coding device shown in FIG. 92 (during outputting numerical value)

The switching between the information I(x) and the parity P(x) after the completion of computation is conducted in a manner shown in FIG. 95 by making use of the Z output. In the above-described coding operation, Z outputs the C input which is the input of information symbol of each period. After the completion of computation, the parity output is circulated through the register row 926. Since the number of stages of registers in the PE is $m-1$, the register controlled by CK2 delivers a parity which is offset by one degree per one circulation and feeds it back to the A input. In this state, Z selects the A input to periodically output the parity.

In this case, therefore, the scale of the circuit and the processing speed are (400+m*50) gates and (16/m)Mwps, respectively. When the whole process is constituted by a single PE, the number m of the stages of registers is 2t. For instance, when the correction capacity t is 8 (t=8), the single PE has a circuit scale of 1200 gates, and the processing speed is 1 Mwps=8 Mbps.

Figure 96:
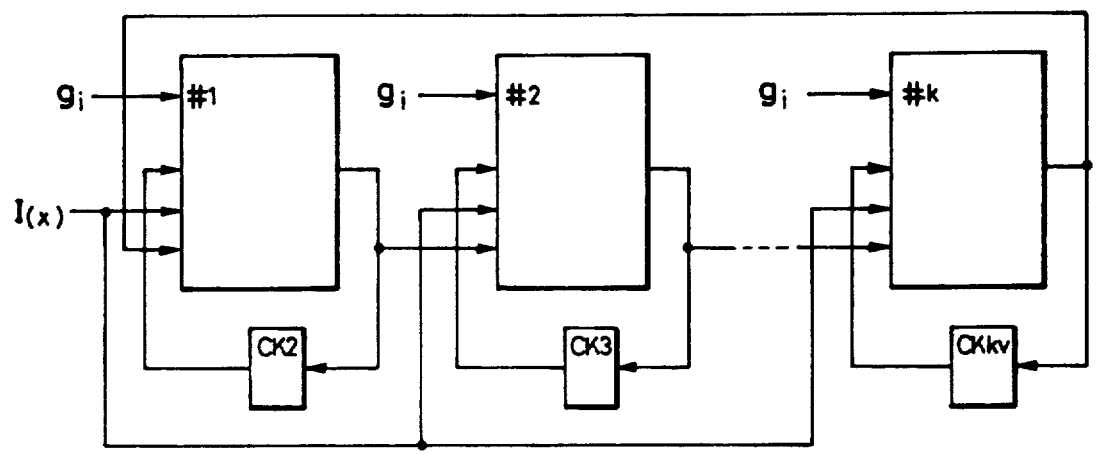
FIG. 96 is a connection diagram of a PE of the invention shown in FIG. 92.
Figure 98:
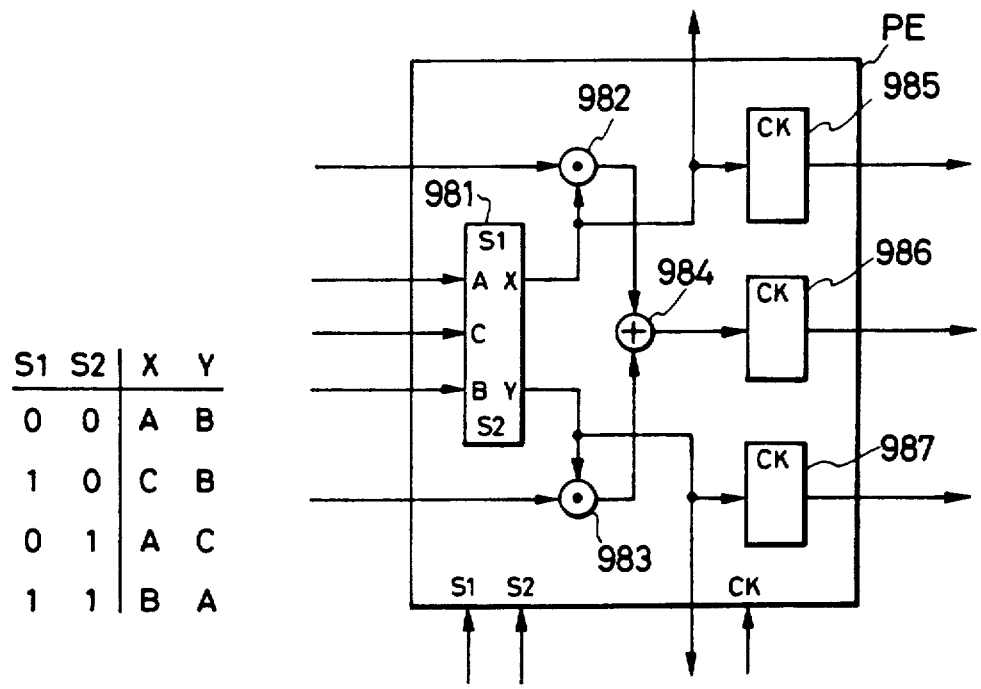
FIG. 98 is an illustration of the construction of a conventional processing element PE.
Figure 97:
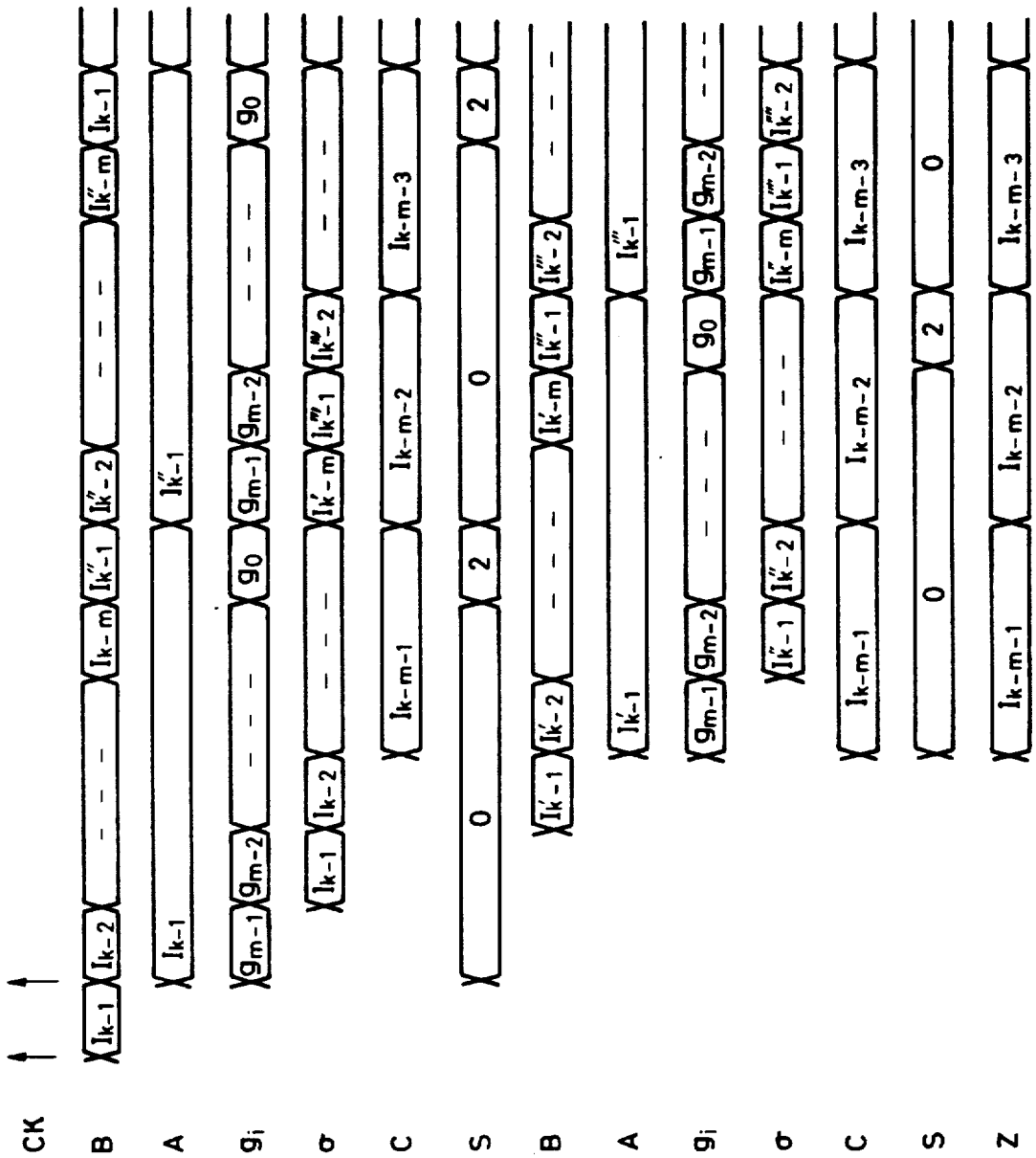
FIG. 97 is a timing chart illustrating the operation of a unit having a pair of PEs shown in FIG. 97.
Figure 99:
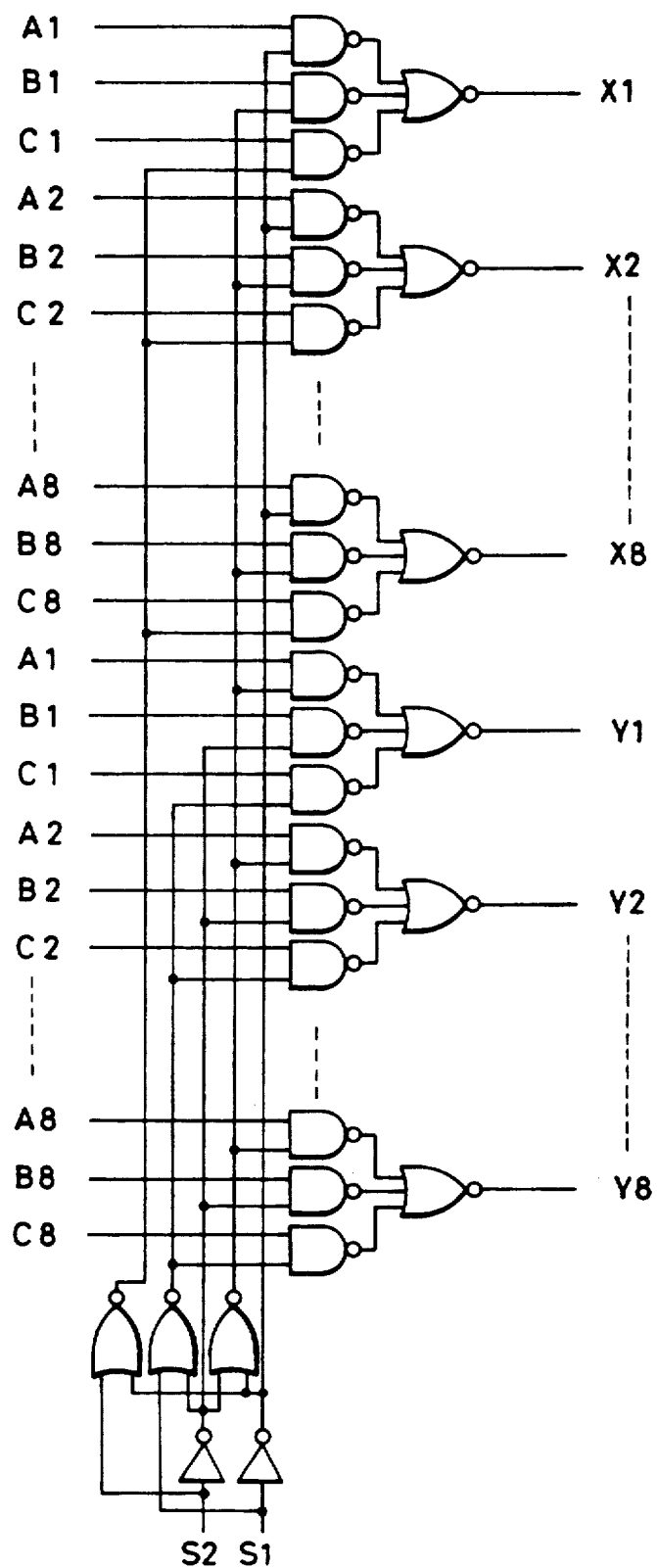
FIG. 99 is an illustration of the construction of a conventional processing element PE.
Figure 100:
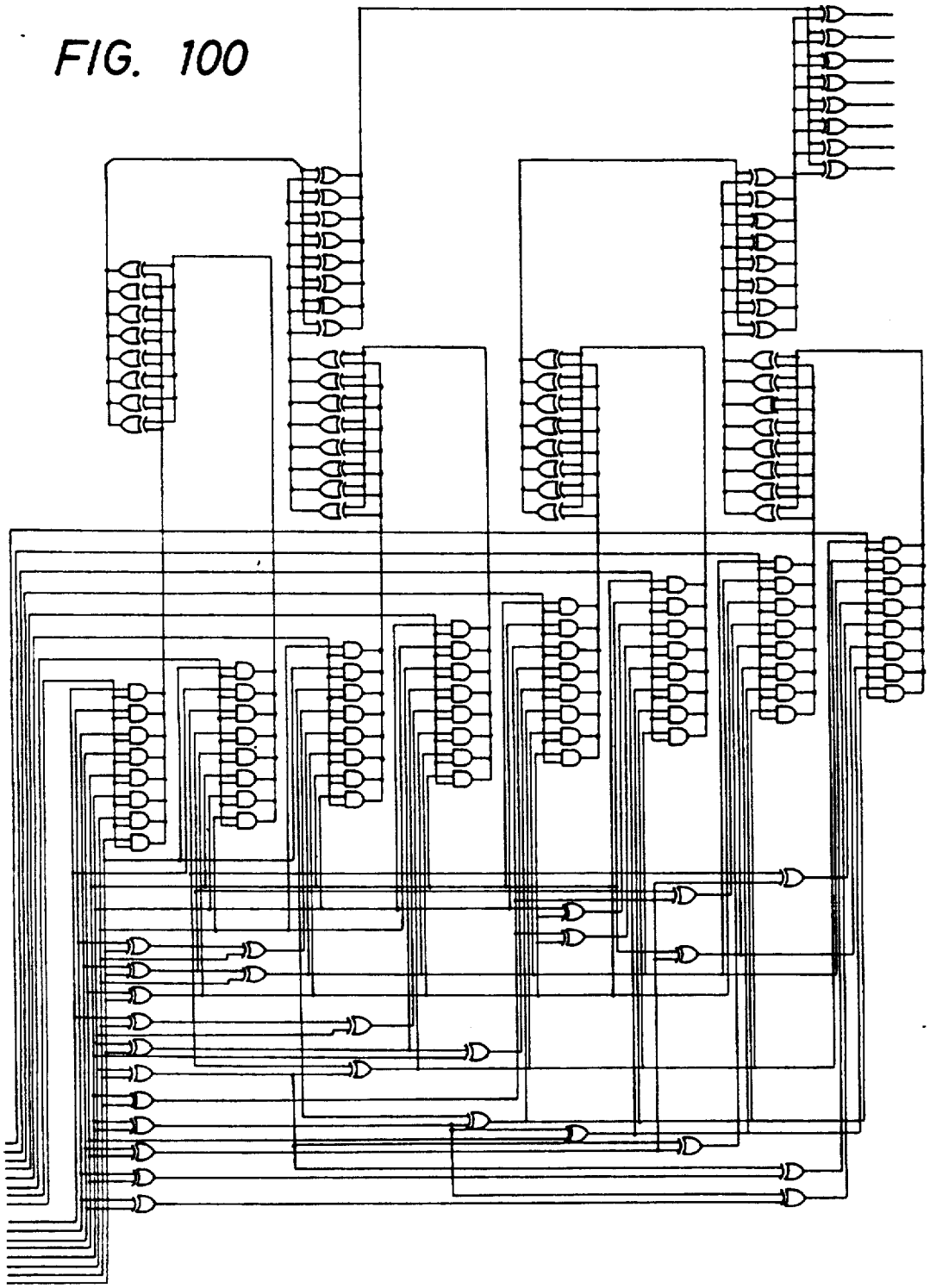
FIG. 100 is an illustration of the construction of a multiplying device of a conventional processing element PE.
Figure 101:
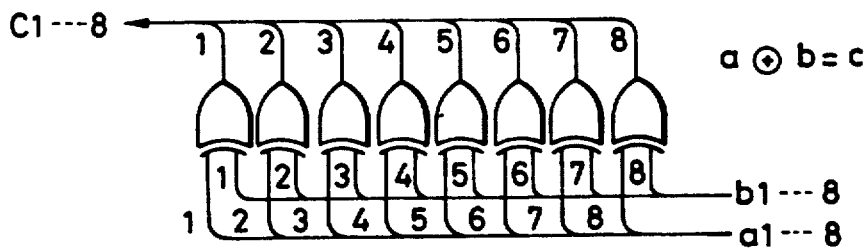
FIG. 101 is an illustration of the construction of an adder of a conventional processing element PE.

When the whole process is conducted not by a single PE, but by a plurality of PEs, the PEs of the type shown in FIG. 92 are connected in a manner shown in FIG. 96. Representing the number of the PE by k, the whole process is divided into (2t/k) portions. Thus, each PE is required to have m=(2t/k) stages of registers, and the circuit shown in FIG. 96 has a circuit scale of (2t/m)*(400+m*50) gates. FIG. 97 shows the flows of signals in an arrangement composed of a pair of PEs. In this state, the number m of the register is m=t, so that the processing speed is 2 Mwps=16 Mbps, and the circuit scale is 800*2=1600 gates.

When only one stage of registers is used, i.e., when m =1 is met, the number k of PEs required is expressed by k= 2t. The feedback from the #k PE to the #1 PE and the simultaneous input of I(x) are not changed. Thus, this decoder does not have systolic architectural structure.

Error Correction Executing Section and System

Figure 83:
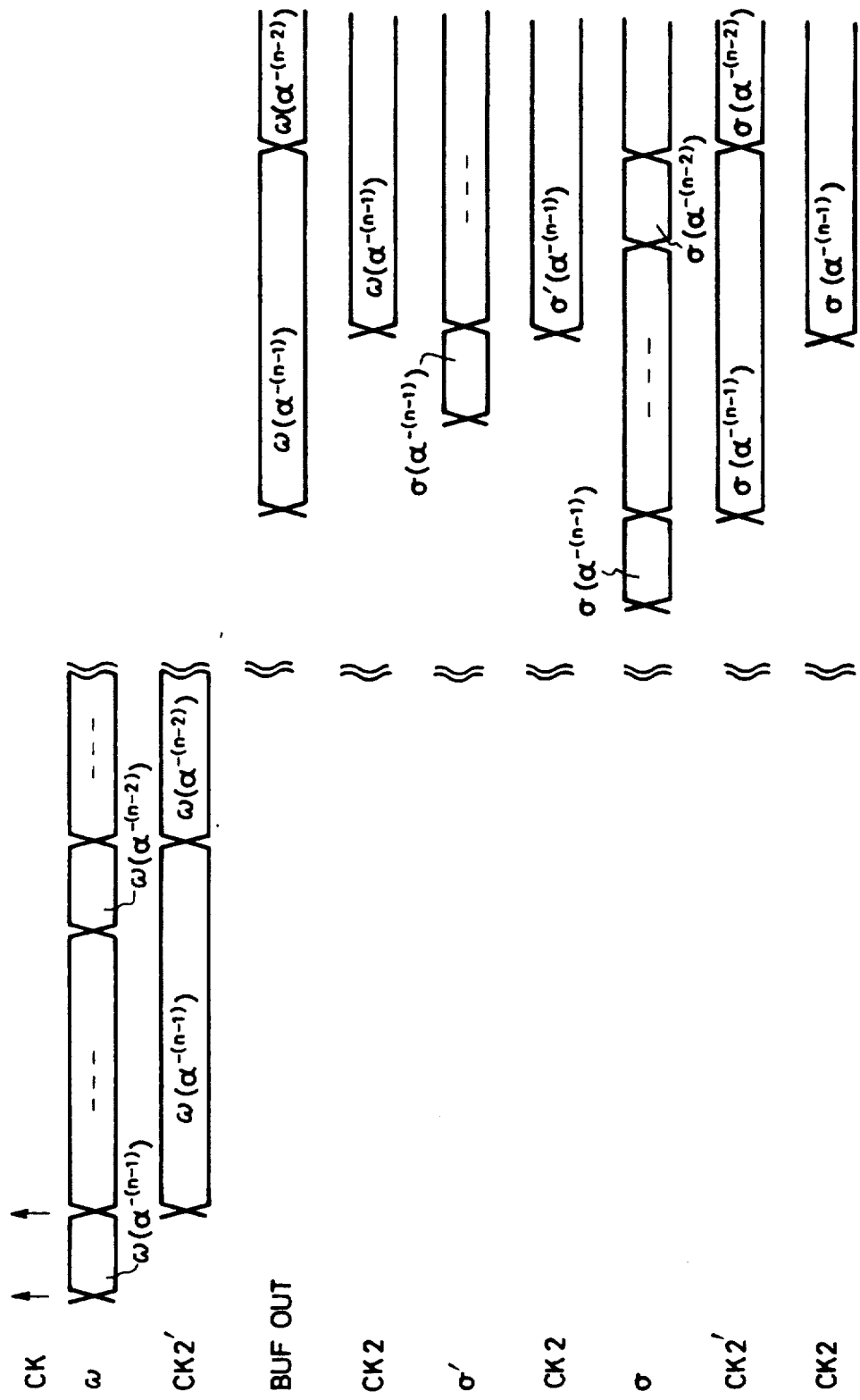
FIG. 83 is a timing chart illustrating the operation of the error correction executing unit shown in FIG. 82.

When the PE shown in FIG. 79 is used, the $f(\alpha^{-i})$ output in Step 3) is delivered in amount corresponding to 1 CK at a period of 2t. The phase of $\sigma'(\alpha^{-i})$, however, is offset from those of $\sigma'(\alpha^{-i})$ and $\omega'(\alpha^{-i})$ by an amount corresponding to a half period. Therefore, $\sigma'(\alpha^{-i})$ is latched by a register which is controlled by CK2 (clock produced at a period of 2t), while $\sigma'(\alpha^{-i})$ and $\omega'(\alpha^{-i})$ are latched by CK2' which is a clock produced by shifting the clock CK2 by a half period and further latched by a register controlled by CK2, whereby the error correction of Step 4) is executed. The operation timing is shown in FIG. 83.

Figure 110:
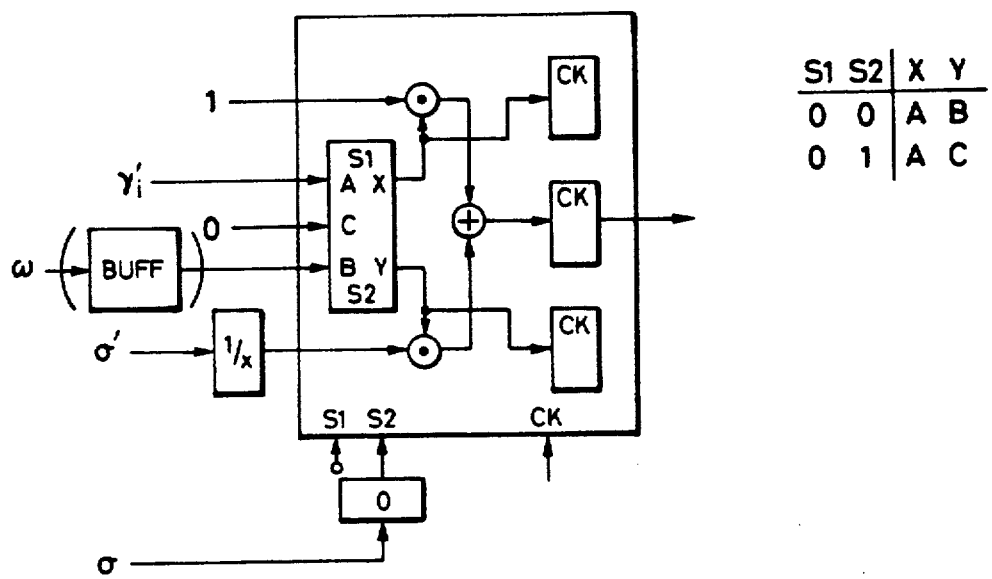
FIG. 110 is an illustration of a conventional error correction PE.

In this case, however, the GCD generating section requires a buffer, because the coefficient of ω(x) is preferentially delivered in the case when the processing of A(B) and the processing of L(M) are conducted by causing a single processing section to operate twice. FIG. 110 shows an optimized form of the executing section of the error correcting section in Step 4). Once the coincidence of output timings of $\omega'(\alpha^{-i})$, $\sigma(\alpha^{-i})$ is obtained, the operation is performed in the same manner as that described before. The circuit scale necessary for conducting the operation of Step 4), therefore, is 450+5*50=700 gates, except for the buffer and the ROM for generating the reciprocal number. The error correction executing section of Step 4) does not have systolic structure, so that the size of the circuit cannot be reduced even when the number of stages of the register is increased. Thus, the most appropriate simplification of the circuit may be effected in accordance with the state. This applies also to the circuit for generating $\alpha^{-i}$ (i=n−1, ..., 0).

As has been described, each decoding step for RS code makes it possible to reduce the size of the circuit at a cost of reduction in the processing speed.

Figure 111:
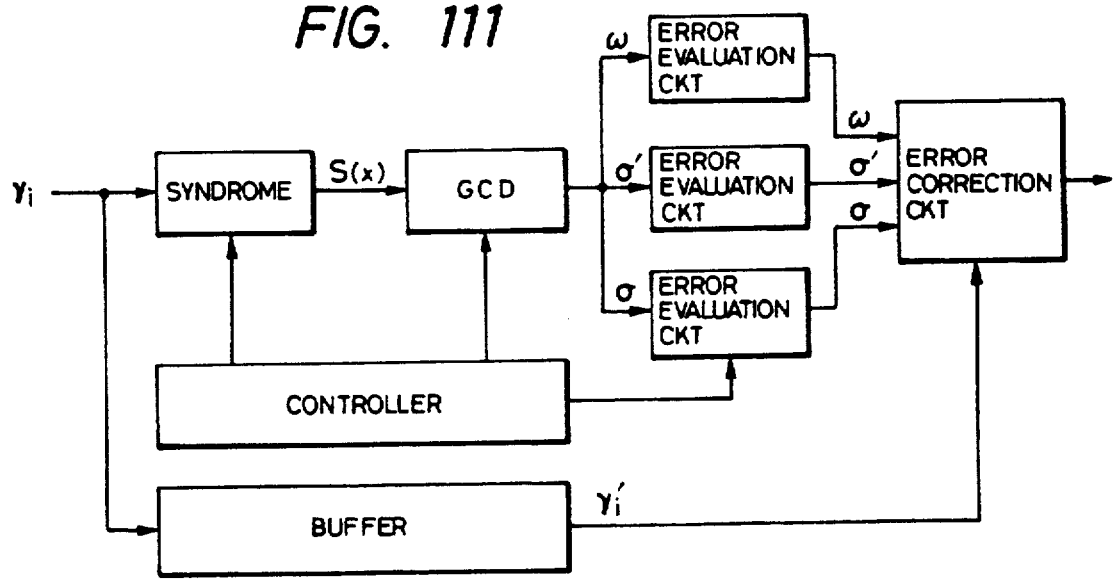
FIG. 111 is an illustration of the construction of a conventional error correcting decoding system.

FIG. 111 shows an example of the decoder having the following combinations. In this decoder, it is possible to operate the whole system by controlling the operation of the PEs solely by the selection signal in combination with CK2.

Figure 82:
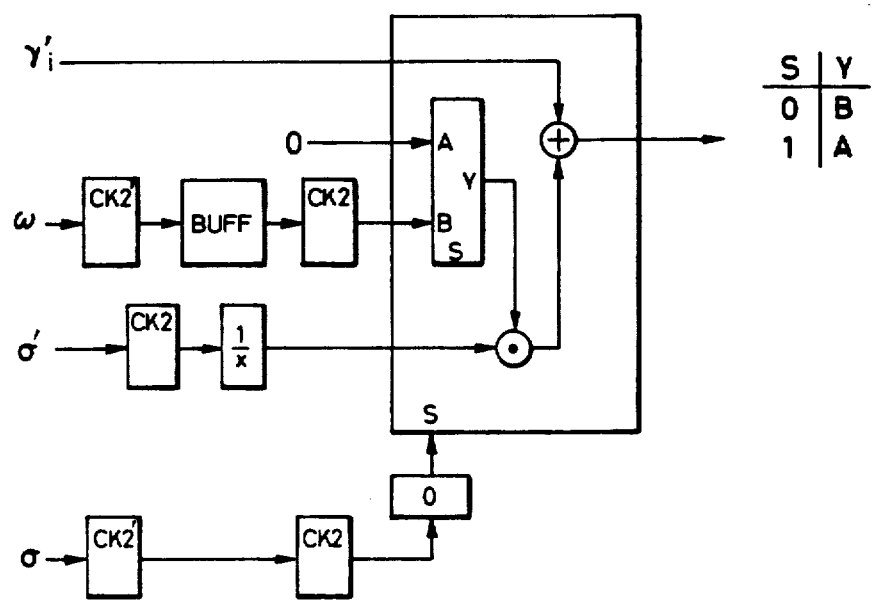
FIG. 82 is an optimized error correction executing unit in accordance with the present invention.

Step 1) SYNDROME: FIG. 64
Step 2) GCD: FIG. 71
Step 3) EVALUATE: FIG. 79
Step 4) CORRECT: FIG. 82

Figure 112:
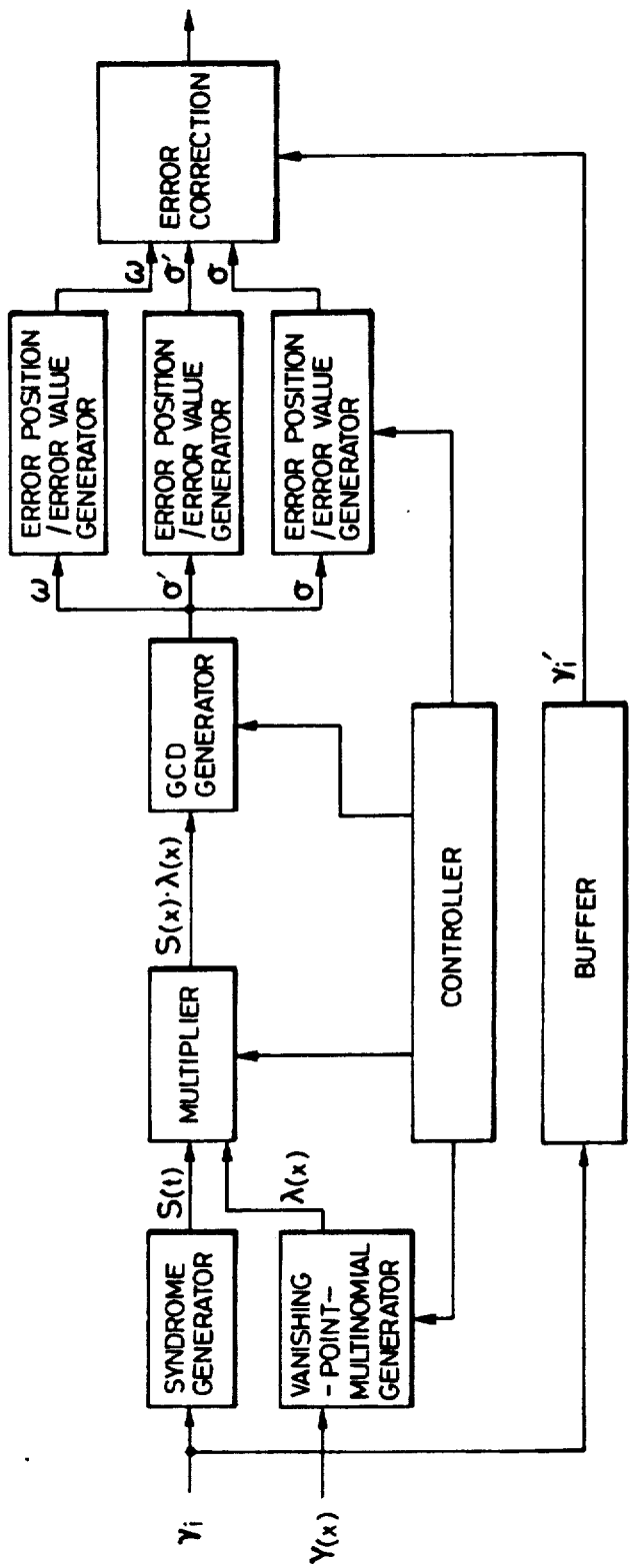
FIG. 112 is an illustration of the erasure correction decoder.

When the coding decoder is considered as a system, it is possible to obtain a miniaturized coding decoder by composing the erasure error correction decoder of FIG. 112 from, for example, the following combination.

Figure 6:
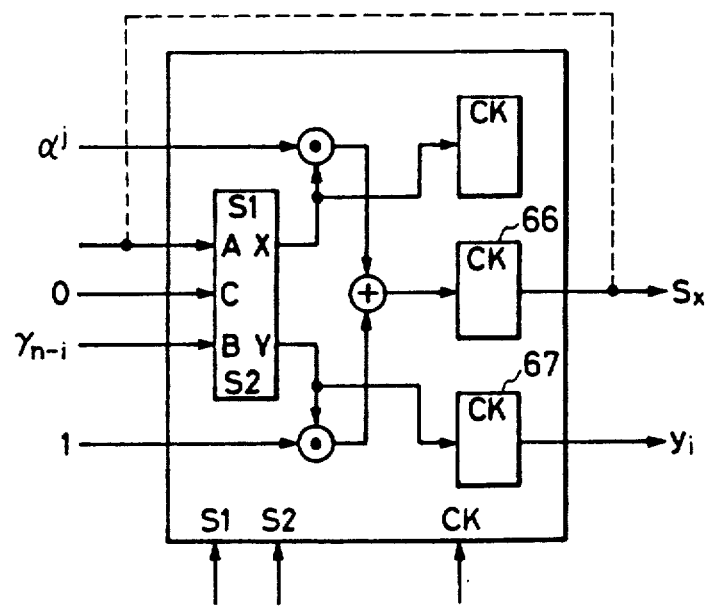
FIG. 6 is an illustration of a syndrome generating PE making use of the construction shown in FIG. 1.

1) SYNDROME: FIG. 64
2) GCD: FIG. 71
3) EVALUATE: FIG. 79
4) CORRECT: FIG. 82
5) ERASURE I: FIG. 84
6) ERASURE II: FIG. 86

This structure is obtained by adding ERASURE I and ERASURE II to the decoder shown in Step 4). It is also possible to obtain a coding decoder by adding the coding device of FIG. 92 to the decoder shown in Step 4). It will also be understood that, when the coding and decoding need not be conducted simultaneously, a coding decoder can be obtained by modifying the circuit of FIG. 111 such that the connections and controls of PEs are switchable between coding mode and decoding mode, without requiring any change in the circuit scale of the circuit shown in FIG. 111.

As explained before, the circuit scale (in terms of gate number), and the processing speed (Mwps) are as follows. The term wps represents "work/sec".

1) (2t/m)*(500+m*50),16/m
2) (2t/m)*(700+(3m+4)*50), n*(16/2t/m)
3) 2*(2t/m)*(400+(m+1)*50), 16m
4) 700

5) $(2t/m)*(400+(m+1)*50)$, $n*(16/2t/m)$
6) $(2t/m)*(400*(3m+2)*50)$, $n*(16/4t)/m)$
7) ENCODE: $(2t/m)*(400+m*50)$, $16/m$

For instance, when the RS decoder has a capacity of $t=8$, the following circuit scale and processing speed are obtainable, on an assumption that the code length n is set to meet $n \geq 4t$ and that the number m of stages of registers is set to meet $m=2t$ so as to conduct the whole process by a single PE.

$1200+3300+2500+700=7700$ gates
1 Mwps = 8 Mbps

When $t=2$ is met, the circuit scale and the processing speed are as follows.

$600+1500+1300+700=3100$ gates
4 Mwps = 32 Mbps

The basic structure of the PE has been described with reference to FIG. 63. It will be seen that the circuit for $GF(2^{2m})$ has a circuit scale which is four times as large the circuit scale of $(2^m)$. It is to be understood, however, the word length is changed from m bits to 2m bits. Since the processing speed per PE is 10 to 20 Mwps (word/sec), the processing speed is doubled from $m \cdot (10-20)$Mbps to $2m \cdot (10-20)$Mbps. Representing a practical processing speed by bps, a PE having the same processing speed can be obtained by using two stages of registers in the PE shown in FIG. 63. With such an arrangement, it is possible to reduce the number of PEs required by one half. Therefore, when the construction of the Galois body is changed from $GF(2^m)$ to $GF(2^{2m})$, the circuit scale is increased by "a" times.

According to the invention, it is possible to obtain an RS coding decoder having the following features, by making use of the advantages brought about by the VLSI architecture.

1) High reliability (multiple error correcting capacity)
2) High speed
3) Regularity of internal structure
4) Large scale of integration.

Thus, the present invention has proven that an RS coding syndrome generator, GCD generator, error evaluation device or an erasure error correction device having a processing speed of 10 to 20 Mwps (word/sec) or higher is obtainable. Furthermore, the invention makes it possible to attain a desired level of reliability by increasing the number of PEs having the same correction performance. In addition, according to the invention, it is possible to operate all the PEs by the same clock, solely by the control of a selection signal for the selector. This features is particularly advantageous in systems which require both a high processing speed and a high level of reliability.

Thus, the present invention proposes an architecture which enables the circuit scale to be reduced simply by increasing the number of stages of registers in PEs used in the above-mentioned RS coding decoder. This feature offers an advantage in that the circuit scale (number of gates) and the processing speed (Mwps) are represented as functions of the correction capacity t and the number m of the stages of the register, whereby any desired level of processing capacity and processing speed can be obtained with a practical circuit scale.

What is claimed is:

1. An encoder comprising:
a plurality of arithmetic circuits each of which includes: selector means having a plurality of inputs and at least one output, multiplying means over a Galois field which has a plurality of outputs and has the at least one output of said selector means as an input thereof, adder means for adding the outputs of said multiplying means and having an output, and register means for storing the output of said adder means and at least one output of said selector means,
wherein said arithmetic circuits are arranged such that they are connected in series with each other or such that some of said arithmetic circuits are connected in parallel with each other to form a block which is in turn connected in series with the remainder of said circuits to perform the encoding in a pipeline mode.

2. An encoder according to claim 1, wherein all said arithmetic circuits have the same structure.

3. A code decoder comprising:
a plurality of arithmetic circuits each of which includes: selector means having a plurality of inputs and at least one output, multiplying means over a Galois field which has a plurality of outputs and has the at least one output of said selector means as an input thereof, adder means for adding the outputs of said multiplying means and having an output, and register means for storing the output of said adder means and at least one output of said selector means,
wherein said arithmetic circuits are arranged such that they are connected in series with each other or such that some of said arithmetic circuits are connected in parallel with each other to form a block which is in turn connected in series with the remainder of said circuits to perform the decoding in a pipeline mode.

4. A decoder according to claim 3, wherein all said arithmetic circuits have the same structure.

5. A decoder comprising:
a plurality of arithmetic circuits each of which includes:
selector means having a plurality of inputs and at least one output,
multiplying means over a Galois field which has a plurality of outputs and has the at least one output of said selector means as an input thereof,
adder means for adding the outputs of said multiplying means and having an output, and
register means having a plurality of stages for storing the output of said adder means and at least one output of said selector means, said register means feeding at least one output of the plurality of stages back to said selector means,
wherein each of said plurality of arithmetic circuits is connected to at least one of the other arithmetic circuits by sending at least one output of the stages of said register means to said selector means of the other arithmetic circuits or by receiving at least one output of the stages of said register means from the other arithmetic circuits as one of the inputs of said selector means.

6. An encoder which inputs information and outputs parity as a remainder produced by a generator polynomial, said encoder comprising:
a plurality of arithmetic circuits each of which includes: a selector having a plurality of inputs and at least one output, a multiplier over a Galois field which has a plurality of outputs and has the at least one output of said selector as an input thereof, an adder for adding the outputs of said multiplier and having an output, and a register for storing the output of said adder and at least one output of said selector, wherein said arithmetic circuits are arranged such that they are connected in series with each other or such that some of said arithmetic circuits are connected in parallel with each other to form a block which is in turn connected in series with the remainder of said circuits to encode perform the encoding in a pipeline mode.

7. A Reed-Solomon code decoder comprising:
a syndrome generator which has a plurality of arithmetic circuits each of which includes: a selector having a plurality of inputs and at least one output, a multiplier over a Galois field which has a plurality of outputs and has the at least one output of said selector as an input thereof, an adder for adding the outputs of said multiplier and having an output, and a register for storing the output of said adder and at least one output of said selector,
wherein said arithmetic circuits are arranged such that they are connected in series with each other or such that some of said arithmetic circuits are connected in parallel with each other to form a block which is in turn connected in series with the remainder of said circuits and said syndrome generator generates from input signals $r_{n-1}, r_{n-2}, \ldots r_1, r_0$ in a pipeline mode a syndrome $S_j$ expressed by the following formula:

$$S_{j-1} = (\ldots ((r_{n-1} \cdot \alpha^j + r_{n-2}) \cdot \alpha^j + r_{n-3}) \cdot \ldots \cdot \alpha^j + r_0.$$

8. A Reed-Solomon code decoder comprising:
a greatest common divisor polynomial generator which has a plurality of arithmetic circuits each of which includes: a selector having a plurality of inputs and at least one output, a multiplier over a Galois field which has a plurality of outputs and has the at least one output of said selector as an input thereof, an adder for adding the outputs of said multiplier and having an output, and a register for storing the output of said adder and at least one output of said selector,
wherein said arithmetic circuits are arranged such that they are connected in series with each other or such that some of said arithmetic circuits are connected in parallel with each other to form a block which is in turn connected in series with the remainder of said circuits and said greatest common divisor polynomial generator generates a greatest common divisor polynomial from received polynomials in a pipeline.

9. A Reed-Solomon code decoder comprising:
an error location and error value generator which has a plurality of arithmetic circuits each of which includes: a selector having a plurality of inputs and at least one output, a multiplier over a Galois field which has a plurality of outputs and has the at least one output of said selector as an input thereof, an adder for adding the outputs of said multiplier and having an output, and a register for storing the output of said adder means and at least one output of said selector means,
wherein said arithmetic circuits are arranged such that they are connected in series with each other or such that they are connected in parallel with each other to form a block which is in turn connected in series with the remainder of said circuits and said error location and error value generator detects a location and a value of an error by calculating the value of polynomials in a pipeline.

10. A Reed-Solomon code decoder comprising:
an erasure position polynomial generator which has a plurality of arithmetic circuits each of which includes: a selector having a plurality of inputs and at least one output, a multiplier over a Galois field which has a plurality of outputs and has the at least one output of said selector as an input thereof, an adder for adding the outputs of said multiplying means and having an output, and a register for storing the output of said adder and at least one output of said selector,
wherein said arithmetic circuits are arranged such that they are connected in series with each other or such that some of said arithmetic circuits are connected in parallel with each other to form a block which is in turn connected in series with the remainder of said circuits and said erasure position polynomial generator receives values $y_i$, ($i = 1, 2, \ldots, s$) and determines the coefficients of the following polynomial in a pipeline mode:

$$\lambda(x) = (1 - y_1 \cdot x)(1 - y_2 \cdot x) \ldots (1 - y_s \cdot x).$$

11. A Reed-Solomon code encoder comprising:
a code polynomial generator which has a plurality of arithmetic circuits each of which includes:
a selector having a plurality of inputs and at least one output,
a multiplier over a Galois field which has a plurality of outputs and has the at least one output of said selector as an input thereof,
an adder for adding the outputs of said multiplier and having an output, and
a register having a plurality of stages for storing the output of said adder and at least one output of said selector, said register feeding at least one output of the plurality of stages back to said selector,
wherein each of said plurality of arithmetic circuits is connected to at least one of other of said plurality of arithmetic circuits by sending at least one output of the stages of said register to said selector of the other arithmetic circuits or by receiving at least one output of the stages of said register from the other arithmetic circuits as one of the inputs of said selector, and
wherein said code polynomial generator generates a code polynomial p(x) expressed by the following formula from information $i_{k-1}, i_{k-2}, \ldots, i_0$ and a generator polynomial g(x) in a pipeline mode:ps
$$p(x) = I(x) \cdot x^{2t} \mod g(x),$$

where
$I(x) = i_{k-1} \cdot x^{k-1} + i_{k-2} \cdot x^{k-2} + \ldots + i_0$ and
t represents error-correcting capability.

12. A Reed-Solomon code decoder comprising:
a syndrome generator which has a plurality of arithmetic circuits each of which includes:
a selector having a plurality of inputs and at least one output,
a multiplier over a Galois field which has a plurality of outputs and has the at least one output of said selector as an input thereof,
an adder for adding the outputs of said multiplier and having an output, and
a register having a plurality of stages for storing the output of said adder and at least one output of said selector, said register feeding at least one output of the plurality of stages back to said selector,
wherein each of said plurality of arithmetic circuits is connected to at least one of other of said plurality of arithmetic circuits by sending at least one output of the stages of said register to said selector of the other arithmetic circuits or by receiving at least one output of the stages of said register from the other arithmetic circuits as one of the inputs of said selector, and wherein said syndrome generator generates a syndrome $S_j$ expressed by the following formula from input symbols $r_{n-1}, r_{n-2}, \ldots r_1, r_0$:

$$S_{j-1} = (\ldots ((r_{n-1} \cdot \alpha^j + r_{n-2}) \cdot \alpha^j + r_{n-2}) \cdot \alpha^j + r_{n-1})$$
$$\cdot \ldots \cdot \alpha^j + r_1) \cdot \alpha^j + r_0$$

where $j = 1, 1+1, \ldots 1+2t-1$ and 1 indicates a desired integer and t represents error correcting capability.

13. A Reed-Solomon code decoder comprising:
a greatest common divisor polynomial generator which has a plurality of arithmetic circuits each of which includes:
a selector having a plurality of inputs and at least one output,
a multiplier over a Galois field which has a plurality of output and has the at least one output of said selector as an input thereof,
an adder for adding the outputs of said multiplier and having an output, and
a register having a plurality of stages for storing the output of said adder and at least one output of said selector, said register feeding a least one output of the plurality of stages back to said selector,
wherein each of said plurality of arithmetic circuits is connected to at least one of other of said plurality of arithmetic circuits by sending at least one output of the stages of said register to said selector of the other arithmetic circuits or by receiving at least one output of the stages of said register from the other arithmetic circuits as one of the inputs of said selector, and
wherein said greatest common divisor polynomial generator generates a greatest common divisor polynomial from received polynomials.

14. A Reed-Solomon code decoder comprising:
an error position and error value generator which has a plurality of arithmetic circuits each of which includes:
a selector having a plurality of inputs and at least one output,
a multiplier over a Galois field which has a plurality of outputs and has the at least one output of said selector as an input thereof,
an adder for adding the outputs of said multiplier and having an output, and
a register having a plurality of stages for storing the output of said adder and at least one output of said selector, said register feeding at least one output of the plurality of stages back to said selector,
wherein each of said plurality of arithmetic circuits is connected to at least one of other of said plurality of arithmetic circuits by sending at least one output of the stages of said register to said selector of the other arithmetic circuits or by receiving at least one output of the stages of said selector from the other arithmetic circuits as one of the inputs of said selector, and
wherein said error position and error value generator detects a position and value of an error by calculating the value of polynomials.

15. A Reed-Solomon code decoder comprising:
an erasure position polynomial generator which has a plurality of arithmetic circuits each of which includes:
a selector having a plurality of inputs and at least one output,
a multiplier over a Galois field which has a plurality of outputs and has at least one output of said selector as an input thereof,
an adder for adding the outputs of said multiplier means and having an output, and
a register having a plurality of stages for storing the output of said adder and at least one output of said selector, said register feeding at least one output of the plurality of stages back to said selector.
wherein said arithmetic circuits are arranged such that they are connected in series with each other or such that some of said arithmetic circuits are connected in parallel with each other to form a block which is in turn connected in series with the remainder of said circuits and said erasure position polynomial generator receives values $Y_i$, ($I = 1, 2, \ldots, s$) and determines the coefficients of the following polynomial in a pipeline mode:

$$\lambda(x) = (1 - y_1 \cdot x)(1 - y_2 \cdot x) \ldots (1 - y_s \cdot x).$$

16. An encoder/decoder comprising:
a plurality of arithmetic circuits each of which includes: selector means having a plurality of inputs and at least one output, multiplying means over a Galois field which has a plurality of outputs and has the at least one output of said selector means as an input thereof, adder means for adding the outputs of said multiplying means and having an output, and register means for storing the output of said adder means and at least one output of said selector means,
wherein said arithmetic circuits are arranged such that they are connected in series with each other or such that some of said arithmetic circuits are connected in parallel with each other to form a block which is i turn connected in series with the remainder of said circuits to perform the encoding and decoding in a pipeline mode.

17. An encoder comprising:
a plurality of arithmetic circuits each of which includes:
selector means having a plurality of inputs and at least one output,
multiplying means over a Galois field which has a plurality of outputs and has the at least one output of said selector means as an input thereof,
adder means for adding the outputs of said multiplying means and having an output, and
register means having a plurality of stages for storing the output of said adder means and at least one output of said selector means, said register means feeding at least one output of the plurality of stages back to said selector means,
wherein each of said plurality of arithmetic circuits is connected to at least one of other of said plurality of arithmetic circuits by sending at least one output of the stages of said register means to said selector means of the other arithmetic circuits or by receiving at least one output of the stages of said register means from the other arithmetic circuits as one of the inputs of said selector means.

18. An encoder/decoder comprising:

a plurality of arithmetic circuits each of which includes:

selector means having a plurality of inputs and at least one output, multiplying means over a Galois field which has a plurality of outputs and has the at least one output of said selector means as an input thereof, adder means for adding the outputs of said multiplying means and having an output, and register means having a plurality of stages for storing the output of said adder means and at least one output of said selector means, said registers means feeding at least one output of the plurality of stages back to said selector means, wherein each of said plurality of arithmetic circuits is connected to at least one of other of said plurality of arithmetic circuits by sending at least one output of the stages of said register means to said selector means of the other arithmetic circuits or by receiving at least one output of the stages of said register means from the other arithmetic circuits as one of the inputs of said selector means.

19. A decoder comprising:

a first unit for generating a syndrome from input signals;

a second unit connected to said first unit for calculating an error location polynomial and an error evaluation polynomial on the basis of the syndrome generated by said first unit;

a third unit connected to said second unit for estimating an error location and an error value from the error location polynomial and the error evaluation polynomial calculated by said second unit; and a fourth unit connected to said third unit for correcting an error according to the error location and the error value estimated by said third unit, wherein each of said units has at least one arithmetic circuit which includes:

selector means having a plurality of inputs and at least one output, multiplying means over a Galois field which has a plurality of output and has the at least one output of said selector means as an input thereof, adder means for adding the outputs of said multiplying means and having an output, and register means for storing the output of said adder means and at least one output of said selector means, where a plurality of said arithmetic circuits are arranged such that they are connected in series with each other or such that some of said arithmetic circuits are connected in parallel with each other to form a block which is in turn connected in series with the remainder of said circuits to perform decoding in a pipeline mode.

20. A decoder comprising:

a first unit for generating a syndrome from input signals;

a second unit connected to said first unit for calculating an error location polynomial and an error evaluation polynomial on the basis of the syndrome generated by said first unit;

a third unit connected to said second unit for estimating an error location and an error value from the error location polynomial and the error evaluation polynomial calculated by said second unit; and a fourth unit connected to said third unit for correcting an error according to the error location and the error value estimated by said third unit, wherein each of said units has at least one arithmetic circuit which includes:

selector means having a plurality of inputs and at least one output, multiplying means over a Galois field which has a plurality of outputs and has the at least one output of said selector means as an input thereof, adder means for adding the outputs of said multiplying means and having an output, and register means having a plurality of stages for storing the output of said adder means and at least one output of said selector means, said register means feeding at least one output of the plurality of stages back to said selector means.

* * * * *

UNITED STATES PATENT AND TRADEMARK OFFICE
CERTIFICATE OF CORRECTION

PATENT NO.  : 5,325,373
DATED       : June 28, 1994
INVENTOR(S) : KEIICHI IWAMURA ET AL.          Page 1 of 9

It is certified that error appears in the above-identified patent and that said Letters Patent is hereby corrected as shown below:

COLUMN 1

Line 23, "$y=r_{n-1}x^{n-1}+r_{n-2} \cdot x^{n-2}+\ldots+r_2 \cdot x+r_0$" should read
--$y=r_{n-1}x^{n-1}+r_{n-2} \cdot x^{n-2}+\ldots+r_1 \cdot x+r_0$--.

Line 34, "$A=a_a \cdot x^n a_{n-1} X x^{n-1}+ \ldots +a_1 \cdot x+a_0$" should read
--$A=a_a \cdot x^n+a_{n-1} \cdot x^{n-1}+\ldots+a_1 \cdot x+a_0$"--.

Line 35, "$B=b_{bb} \cdot x^n+b_{n-1} \cdot x^{n-1}+\ldots+b_2 x+b_0$" should read
--$B=b_b \cdot x^n+b_{n-1} \cdot x^{n-1}+\ldots+b_2 x+b_0$"--.

COLUMN 2

Line 42, "et al" should read --et al.,--.
Line 57, "Addition," should read --addition,--.

COLUMN 3

Line 46, "FIG." should read --FIGS.--; and
"is an illustration" should read
--are illustrations--.
Line 60, "FIG." should read --FIGS.--;
"is a" should read --are--; and
"chart" should read --charts--.
Line 62, "FIG." should read --FIGS.--;
"is a" should read --are--; and
"chart" should read --charts--.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.

It is certified that error appears in the above-identified patent and that said Letters Patent is hereby corrected as shown below:

COLUMN 5

Line 12, "FIG." should read --FIGS.--; and "is an illustration" should read --are illustrations--.
Line 15, "smallsized" should read --small-sized--.
Line 30, "FIG. 64;" should read --FIG. 63;--.
Line 42, "63;" should read --73; ¶ FIG. 75 is an illustration of an error evaluation circuit employing an optimized form of the PE shown in FIG. 63;--.

COLUMN 6

Line 39, "FIG." should read --FIGS.--; and "is an illustration" should read --are illustrations--.
Line 41, "FIG." should read --FIGS.--; "is a" should read --are--; and "chart" should read --charts--.

COLUMN 7

Line 24, "x." should read --x.)--.
Line 41, "is" should read --are--.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.    Page 3 of 9

It is certified that error appears in the above-identified patent and that said Letters Patent is hereby corrected as shown below:

COLUMN 9

Line 7, "ais" should read --$\alpha$ is--.
Line 55, "Si=E($a^{-1}$)(i=0, 1, ..., n-1)" should read
--Si=E($a^{i+1}$)(i=0, 1, ..., n-k-1)--.

COLUMN 10

Line 26, "(u=1, 1, ..., 1)" should read
--(u=1, 2, ..., $\ell$)--.

COLUMN 11

Line 54, "A and B" (2nd occurrence) should read
--$\overline{A}$ and $\overline{B}$--.

COLUMN 12

Line 5, "this" should read --of this--.

COLUMN 13

Line 31, "$\sigma(a^{-i})$'0" should read --$\sigma(a^{-i})$=0--.
Line 55, "eju" should read --$e_{j_u}$--.

COLUMN 14

Line 27, "(i=0.1, ...n-1)" should read
--(i=0, 1, ...n-1)--.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.      Page 4 of 9

It is certified that error appears in the above-identified patent and that said Letters Patent is hereby corrected as shown below:

COLUMN 15

Line 10, "blocks," should read --clocks,--.
Line 12, "the PE." should read --each PE.--.
Line 15, "$(S_{2t-1}, S_{26-2}, \ldots, S_1, S_0)$" should read --$(S_{2t-1}, S_{2t-2}, \ldots, S_1, S_0)$"--.
Line 17, "$(R_{n-1}, r_{n-2}, \ldots$" should read --$(r_{n-1}, r_{n-2}, \ldots$--.
Line 55, "aj" should read --$a^j$--.
Line 63, "receive" should read --received--.

COLUMN 16

Line 7, "$S_{26-2}$" should read --$S_{2t-2}$--.
Line 15, "$S^{2t-2}$" should read --$S_{2t-2}$--.
Line 61, "$-A_0$," should read --$=A_0,$--.

COLUMN 17

Line 16, "systoric" should read --systolic--.
Line 26, "dega" should read --degA--.

COLUMN 18

Line 42, "shown," should read --show,--.

COLUMN 19

Line 11, "$\sigma;(x)$" should read --$\sigma'(x)$--.
Line 47, "whereby" should be deleted.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.

It is certified that error appears in the above-identified patent and that said Letters Patent is hereby corrected as shown below:

COLUMN 20

Line 34, "Erasion" should read --Erasure--.

COLUMN 21

Line 57, "$S \geq 2t$" should read --$S \leq 2t$--.
Line 58, "$\cdot S$" should read --$\#S$--.

COLUMN 22

Line 31, "$S_{26-1}$," should read --$S_{2t-1}$,--.

COLUMN 23

Line 40, "IN" should read --In--.

COLUMN 24

Line 11, "and" (2nd occurrence) should be deleted.
Line 22, "PEs." should read --PEs--.

COLUMN 25

Line 25, "gate" should read --gates--.
Line 49, "circuit" should read --circuits--.

COLUMN 27

Line 1, "used," should read --also used,--.
Line 67, "$S_{2+2}$," should read --$S_{2t-2}$,--.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.

It is certified that error appears in the above-identified patent and that said Letters Patent is hereby corrected as shown below:

COLUMN 29

Line 33, "2t+2 PE" should read --#2t+2 PE"--.
Line 44, "(t)" should read --t)--.

COLUMN 30

Line 6, "ents" should read --ent--.
Line 42, "MWps." should read --Mwps.--.
Line 44, "k≤t." should read --k=t.--.

COLUMN 31

Line 57, "S1,1=00" should read --S1,2=00--.

COLUMN 32

Line 18, "(m=(2t/k)," should read --(m=(2t/k)).

COLUMN 33

Line 49, "gate," should read --gates,--.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.

It is certified that error appears in the above-identified patent and that said Letters Patent is hereby corrected as shown below:

COLUMN 34

Line 4, "$P_{2t}-1,$" shoulds read --$P_{2t-1},$--.
Line 10, "$x^{m-2}...$" should read --$x^{m-2}+...$--.
Line 17, "$x^{m-2}...$" should read --$x^{m-2}+...$--.
Line 22, "'$P(x)=Z_k$" should read --$P(x)=Z_k$--.
Line 23, "Where," should read --where,--.
Line 27, "$Z_m$ is" should read --$Z_m$ in--.
Line 39, "me" should read --be--.
Line 47, "row 6." should read --row 926.--.

COLUMN 35

Line 67, "$\sigma'(a^{-i}),$" should read --$\sigma(a^{-i}),$--.

COLUMN 36

Line 2, "$\sigma'(a^{-i}),$" should read --$\sigma(a^{-i}),$--.
Line 16, "$\sigma(a^{-i})$ is" should read --$\sigma(a^{-i})$ and $\sigma'(a^{-i})$ is--.
Line 64, ""work/sec"." should read --"word/sec".--.
Line 65, "1) (2t/m)*(500+m*50), 16/m" should read
         --1) (2t/m)*(400+m*50), 16/m--.
Line 67, "16m" should read --16/m--.

COLUMN 37

Line 2, "n*(16/4t)/m)" should read --n*(16/4t/m)--.
Line 7, "$n \geq 4t$" should read --$n \leq 4t$--.
Line 18, "as large" should read --as large as--.
Line 29, "body" should read --field--.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.     Page 8 of 9

It is certified that error appears in the above-identified patent and that said Letters Patent is hereby corrected as shown below:

COLUMN 38

Line 15, "code" should be deleted.

COLUMN 39

Line 6, "encode" should be deleted.
Line 25, "$S_{j-1}=(\ldots((r_{n-1}*\alpha^j+r_{n-2})*\alpha^j+r_{n-3})*\ldots*\alpha^j+r_0.$"
should read
--$S_{j-1}=(\ldots((r_{n-1}*\alpha^j+r_{n-2})*\alpha^j+r_{n-3})*\ldots*\alpha^j+r_1)*\alpha^j+r_0.$--.

COLUMN 40

Line 35, "other" should read --the others--.
Line 45, "mode:ps" should read --mode:--.
Line 67, "other" should read --the others--.

COLUMN 41

Line 10, "$S_{j-1}=(\ldots((r_{n-1}*\alpha^j+r_{n-2})*\alpha^j+r_{n-2})*\alpha^j+r_{n-1})*\ldots*\alpha^j+r_1)*\alpha^j+r_0.$" should read
--$S_{j-1}=(\ldots((r_{n-1}*\alpha^j+r_{n-2})*\alpha^j+r_{n-3})*\ldots*\alpha^j+r_1)*\alpha^j+r_0.$--.
Line 29, "a" should read --at--.
Line 32, "other" should read --the others--.
Line 58, "other" should read --the others--.

UNITED STATES PATENT AND TRADEMARK OFFICE
CERTIFICATE OF CORRECTION

PATENT NO. : 5,325,373
DATED : June 28, 1994
INVENTOR(S) : KEIICHI IWAMURA ET AL.

It is certified that error appears in the above-identified patent and that said Letters Patent is hereby corrected as shown below:

COLUMN 42

Line 41, "i" should read --in--.
Line 61, "other" should read --the others--.

COLUMN 43

Line 13, "registers" should read --register--.
Line 17, "other" should read --the others--.

Signed and Sealed this

Sixteenth Day of May, 1995

Attest:

BRUCE LEHMAN

Attesting Officer

Commissioner of Patents and Trademarks